United States Patent
Akamine et al.

(10) Patent No.: US 11,289,167 B2
(45) Date of Patent: *Mar. 29, 2022

(54) INFORMATION PROCESSING SYSTEM INCLUDING HOST DEVICE AND MEMORY SYSTEM

(71) Applicant: KIOXIA CORPORATION, Minato-ku (JP)

(72) Inventors: Takayuki Akamine, Yokohama (JP);
Masanobu Shirakawa, Chigasaki (JP);
Tokumasa Hara, Kawasaki (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/104,564

(22) Filed: Nov. 25, 2020

(65) Prior Publication Data
US 2021/0082524 A1    Mar. 18, 2021

Related U.S. Application Data

(60) Continuation of application No. 16/519,286, filed on Jul. 23, 2019, now Pat. No. 10,885,988, which is a continuation of application No. 16/105,078, filed on Aug. 20, 2018, now Pat. No. 10,403,373, which is a
(Continued)

(51) Int. Cl.
| | |
|---|---|
| *G11C 7/22* | (2006.01) |
| *G11C 16/26* | (2006.01) |
| *G11C 16/10* | (2006.01) |
| *G11C 16/08* | (2006.01) |
| *G11C 16/32* | (2006.01) |
| *G11C 29/44* | (2006.01) |

(52) U.S. Cl.
CPC ............... *G11C 16/26* (2013.01); *G11C 7/22* (2013.01); *G11C 16/08* (2013.01); *G11C 16/10* (2013.01); *G11C 16/32* (2013.01); *G11C 29/44* (2013.01)

(58) Field of Classification Search
CPC ......... G11C 16/26; G11C 16/08; G11C 16/10; G11C 16/32
See application file for complete search history.

(56) References Cited

U.S. PATENT DOCUMENTS

| | | | |
|---|---|---|---|
| 8,375,273 | B2 | 2/2013 | Hara |
| 8,634,253 | B2 | 1/2014 | Chen |
| 8,806,293 | B2 | 8/2014 | Tiziani |
| | | (Continued) | |

FOREIGN PATENT DOCUMENTS

| | | |
|---|---|---|
| JP | 10-214499 | 8/1998 |
| JP | 2008-204591 | 9/2008 |
| JP | 2012-69605 | 4/2012 |

*Primary Examiner* — Mushfique Siddique
(74) *Attorney, Agent, or Firm* — Oblon, McClelland, Maier & Neustadt, L.L.P.

(57) ABSTRACT

A memory system of an embodiment includes a memory device including a first set of cell transistors and a second set of cell transistors; and a controller configured to transmit to the memory device a first instruction and transmit to the memory device a second instruction after reception of a first request without receiving the first request again. The first instruction instructs parallel reads from the first and second sets of cell transistors, and the second instruction instructs a read from the first set of cell transistors.

15 Claims, 37 Drawing Sheets

Related U.S. Application Data division of application No. 15/066,255, filed on Mar. 10, 2016, now Pat. No. 10,096,366.

(60) Provisional application No. 62/288,175, filed on Jan. 28, 2016.

(56) References Cited

U.S. PATENT DOCUMENTS

| | | | |
|---|---|---|---|
| 9,152,553 B1 | 10/2015 | Shin | |
| 9,349,466 B2 | 5/2016 | Kim | |
| 9,396,775 B2 | 7/2016 | Shirakawa | |
| 9,460,793 B1 | 10/2016 | Oh | |
| 9,548,127 B1 | 1/2017 | Takada | |
| 9,659,638 B1 | 5/2017 | Shin | |
| 9,679,651 B2 | 6/2017 | Shirakawa | |
| 9,685,206 B2 | 6/2017 | Choi | |
| 10,096,366 B2 | 10/2018 | Akamine | |
| 2001/0019503 A1 | 9/2001 | Ooishi | |
| 2005/0018486 A1 | 1/2005 | Kawai | |
| 2006/0023554 A1 | 2/2006 | Matsushita | |
| 2007/0170268 A1 | 7/2007 | Lee | |
| 2008/0205136 A1 | 8/2008 | Wang | |
| 2009/0238005 A1 | 9/2009 | You | |
| 2010/0058003 A1 | 3/2010 | Goto | |
| 2011/0219171 A1 | 9/2011 | Kuehne | |
| 2011/0231724 A1 | 9/2011 | Hara | |
| 2011/0296235 A1 | 12/2011 | Ogawa | |
| 2012/0069655 A1 | 3/2012 | Hishida et al. | |
| 2013/0073793 A1 | 3/2013 | Yamagishi | |
| 2013/0128675 A1 | 5/2013 | Kim | |
| 2013/0198589 A1 | 8/2013 | Choi | |
| 2013/0250683 A1 | 9/2013 | Hosono | |
| 2013/0262745 A1 | 10/2013 | Lin | |
| 2014/0071756 A1 | 3/2014 | Iwai | |
| 2014/0108891 A1 | 4/2014 | Strasser | |
| 2014/0247658 A1 | 9/2014 | Hosono | |
| 2014/0269069 A1* | 9/2014 | D'Abreu | G11C 16/06 365/185.11 |
| 2014/0355351 A1 | 12/2014 | Unno | |
| 2015/0036430 A1 | 2/2015 | Sukegawa | |
| 2015/0070994 A1 | 3/2015 | Hosono | |
| 2015/0078094 A1 | 3/2015 | Nagashima | |
| 2015/0138886 A1 | 5/2015 | Hishida | |
| 2015/0262630 A1 | 9/2015 | Shirakawa | |
| 2015/0262674 A1 | 9/2015 | Shirakawa | |
| 2015/0262699 A1 | 9/2015 | Shirakawa | |
| 2015/0269018 A1 | 9/2015 | Ellis | |
| 2015/0286528 A1 | 10/2015 | Cai | |
| 2015/0380097 A1 | 12/2015 | Sato | |
| 2016/0070507 A1 | 3/2016 | Hoshikawa | |
| 2016/0071601 A1 | 3/2016 | Shirakawa | |
| 2016/0077913 A1 | 3/2016 | Yao | |
| 2016/0078959 A1 | 3/2016 | Bushnaq | |
| 2016/0196181 A1 | 7/2016 | Troia | |
| 2016/0225457 A1 | 8/2016 | Hara | |
| 2016/0239381 A1 | 8/2016 | Nakazumi | |
| 2016/0240264 A1 | 8/2016 | Hosono | |
| 2016/0247581 A1 | 8/2016 | Suzuki | |
| 2016/0299692 A1 | 10/2016 | Shirakawa | |
| 2017/0116139 A1 | 4/2017 | McVay | |
| 2017/0262199 A1 | 9/2017 | Ochi | |
| 2018/0336948 A1 | 11/2018 | Luo | |
| 2018/0358100 A1 | 12/2018 | Akamine | |
| 2020/0202934 A1* | 6/2020 | Imamoto | G11C 16/08 |

* cited by examiner

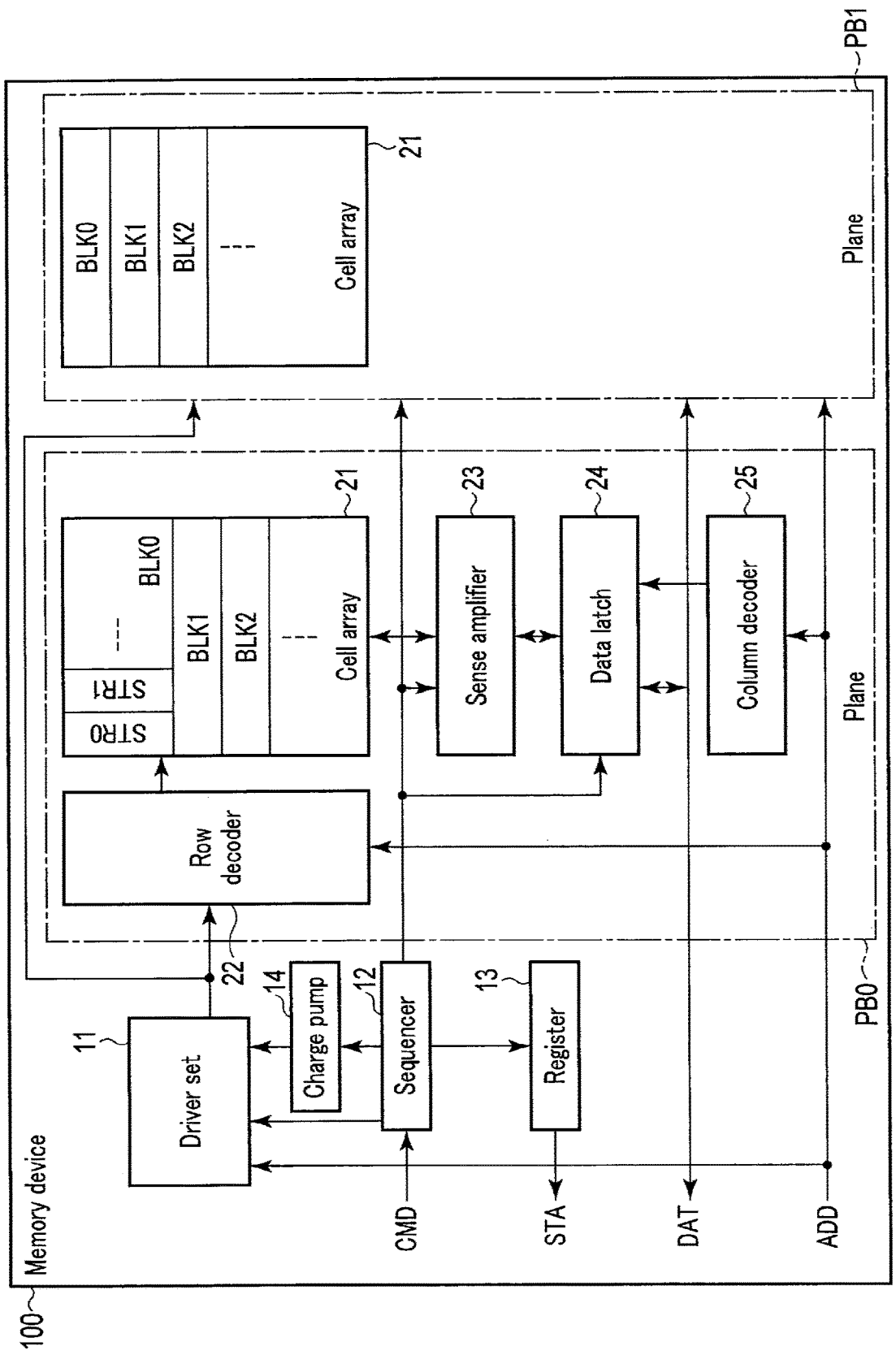
F I G. 2

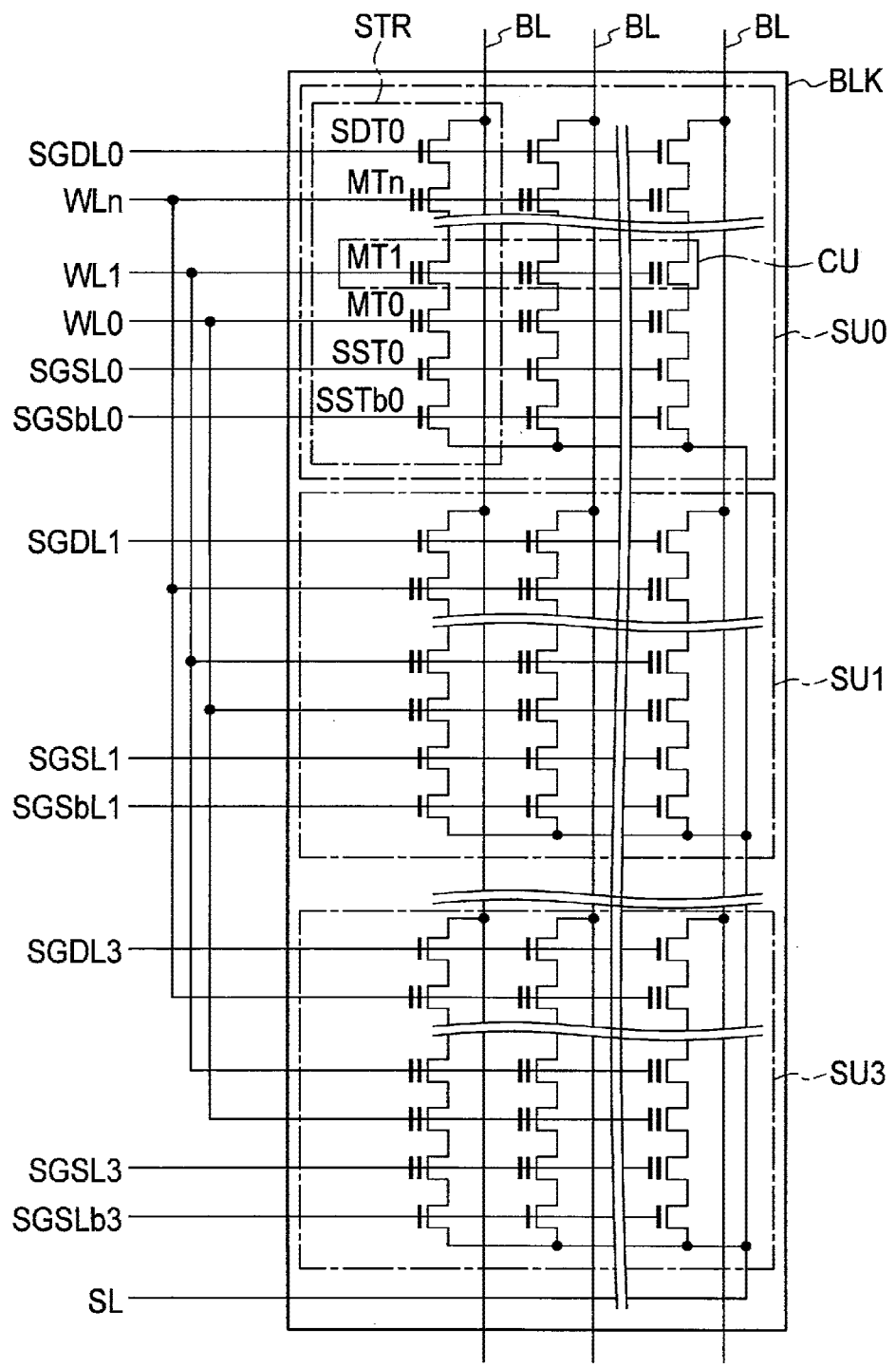
F I G. 5

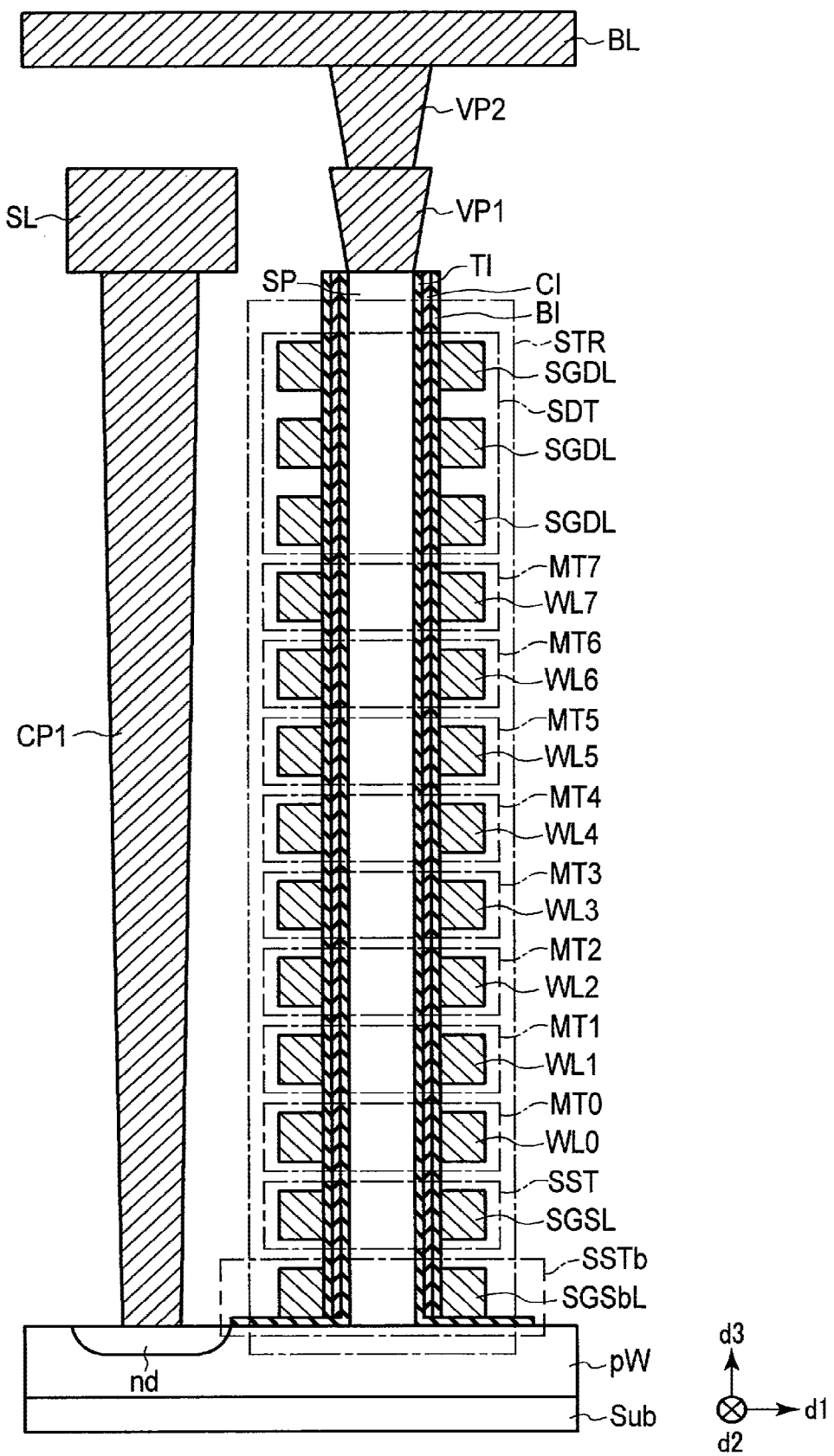
F I G. 6

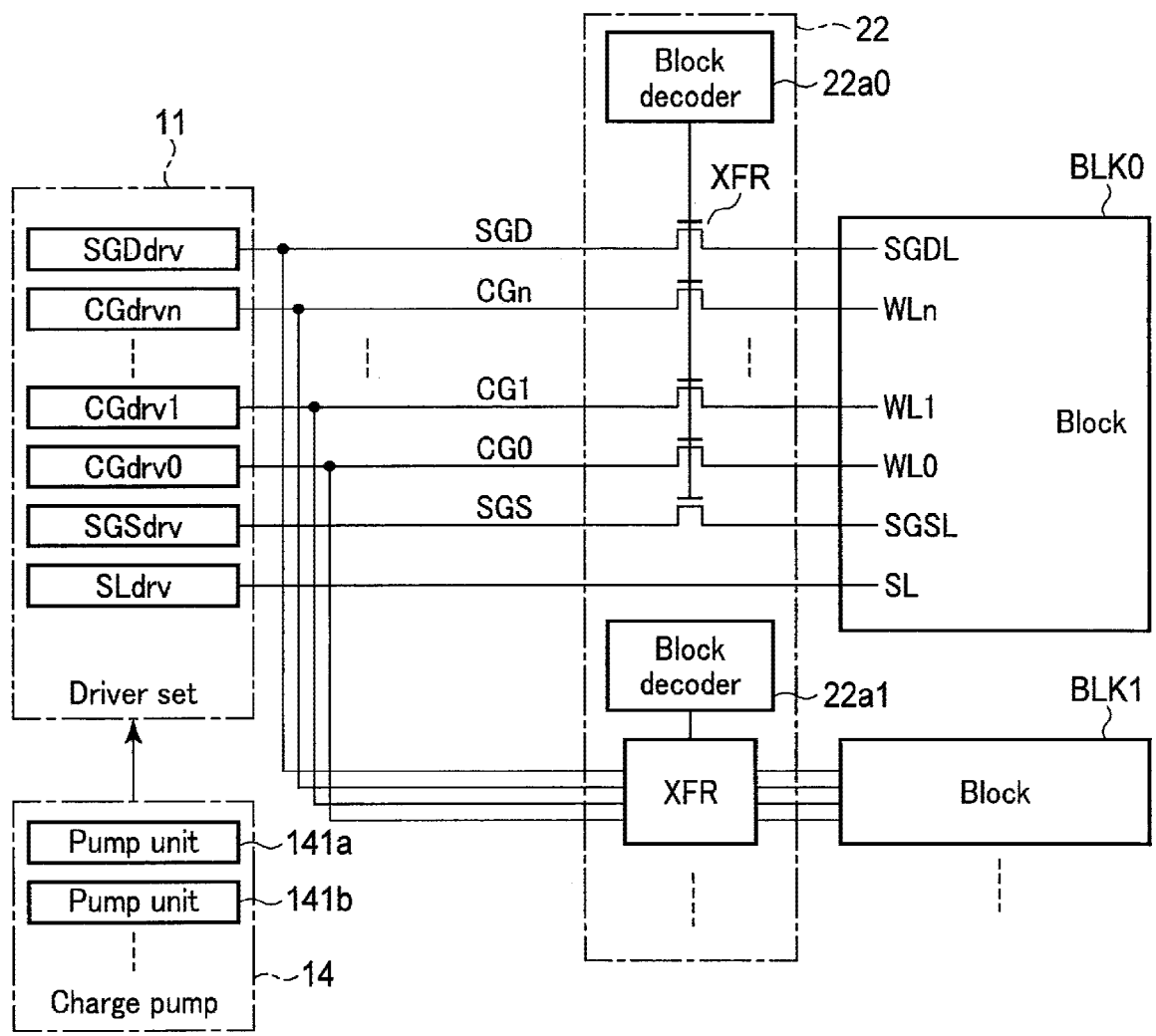
F I G. 7

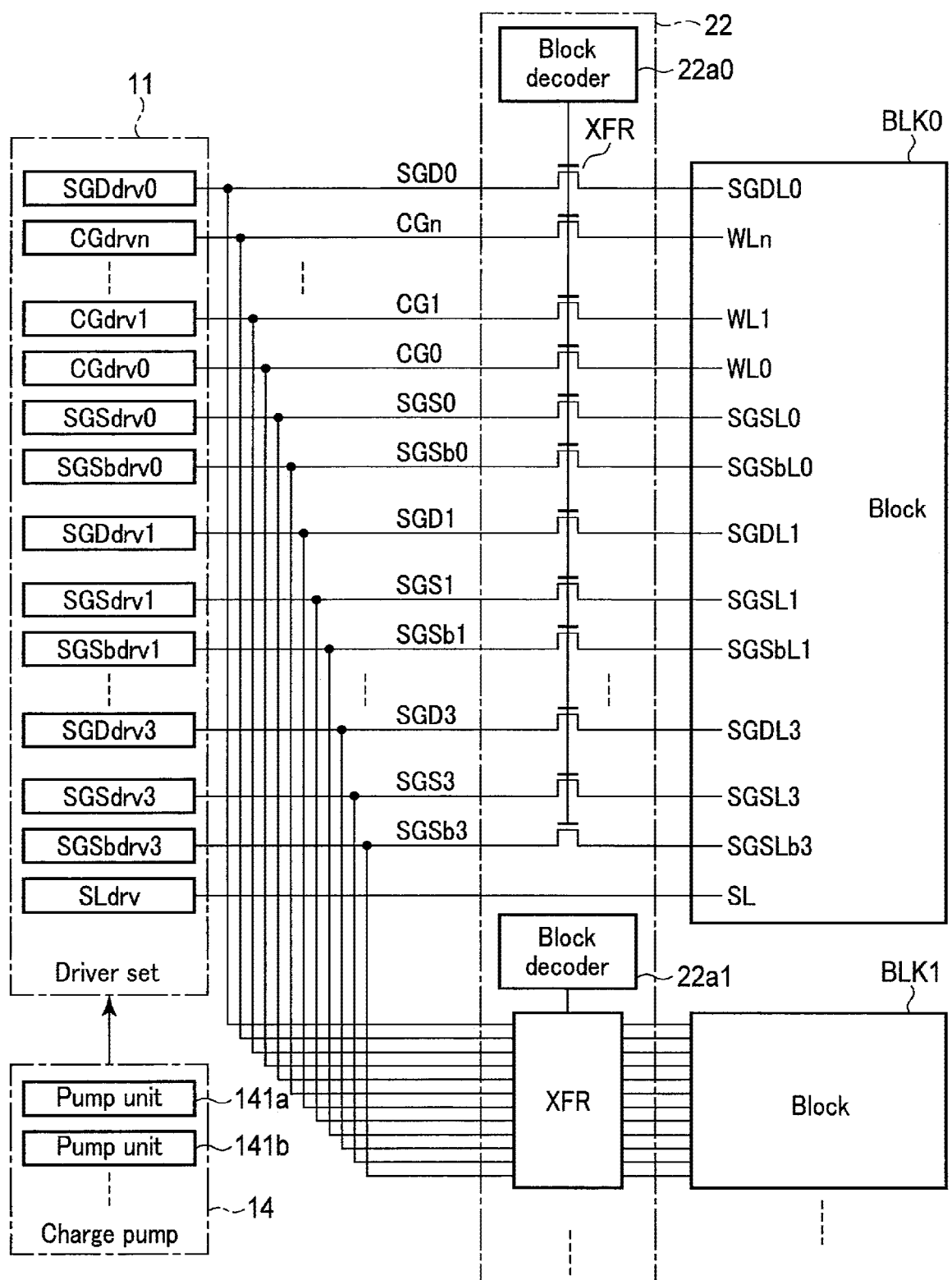
F I G. 8

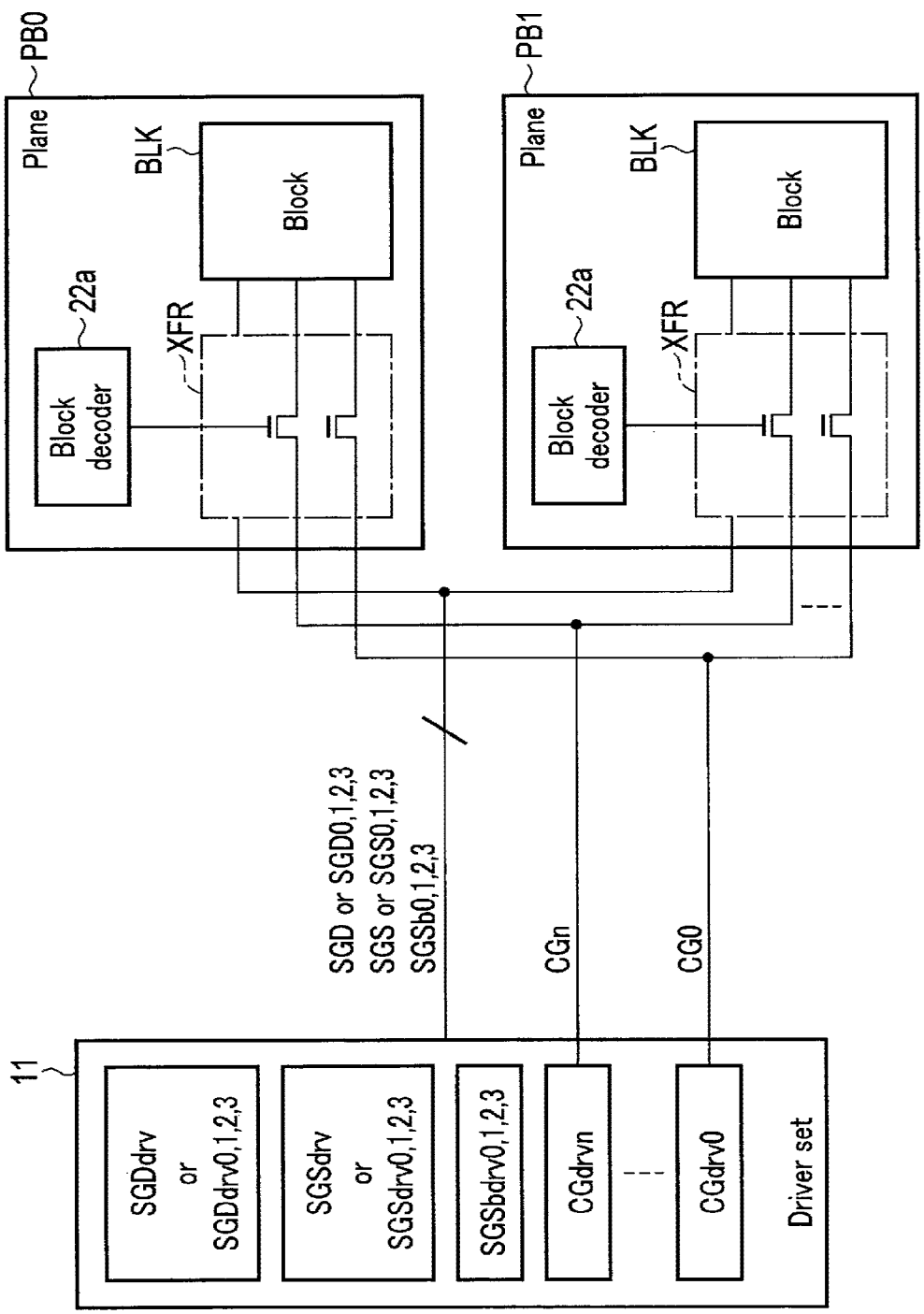
F I G. 9

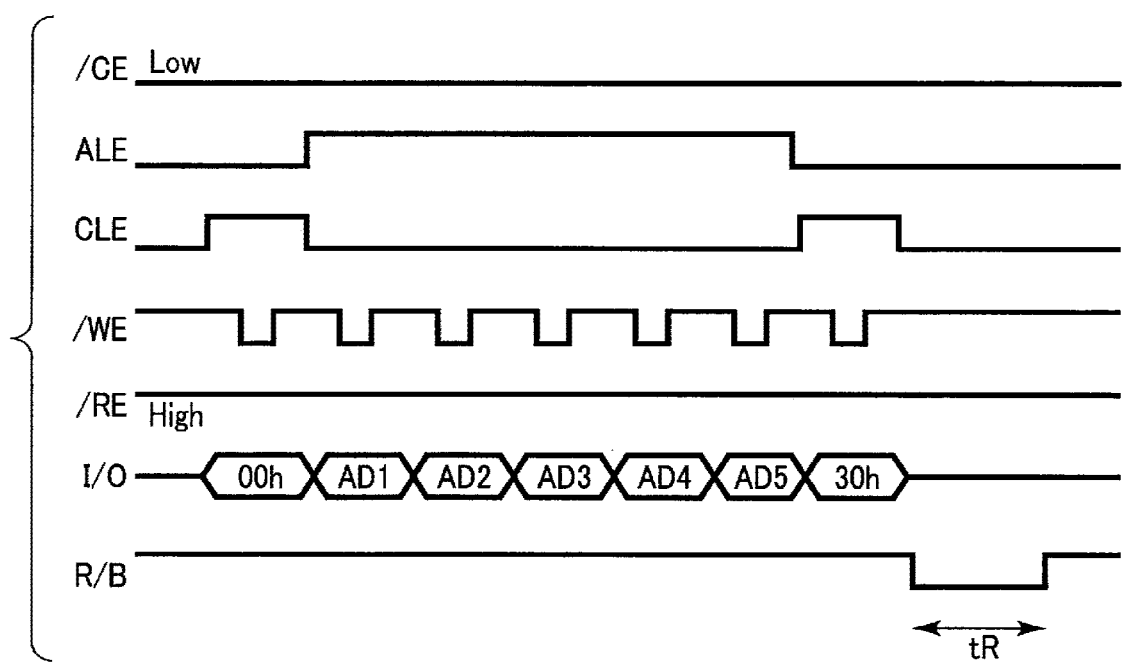
F I G. 12

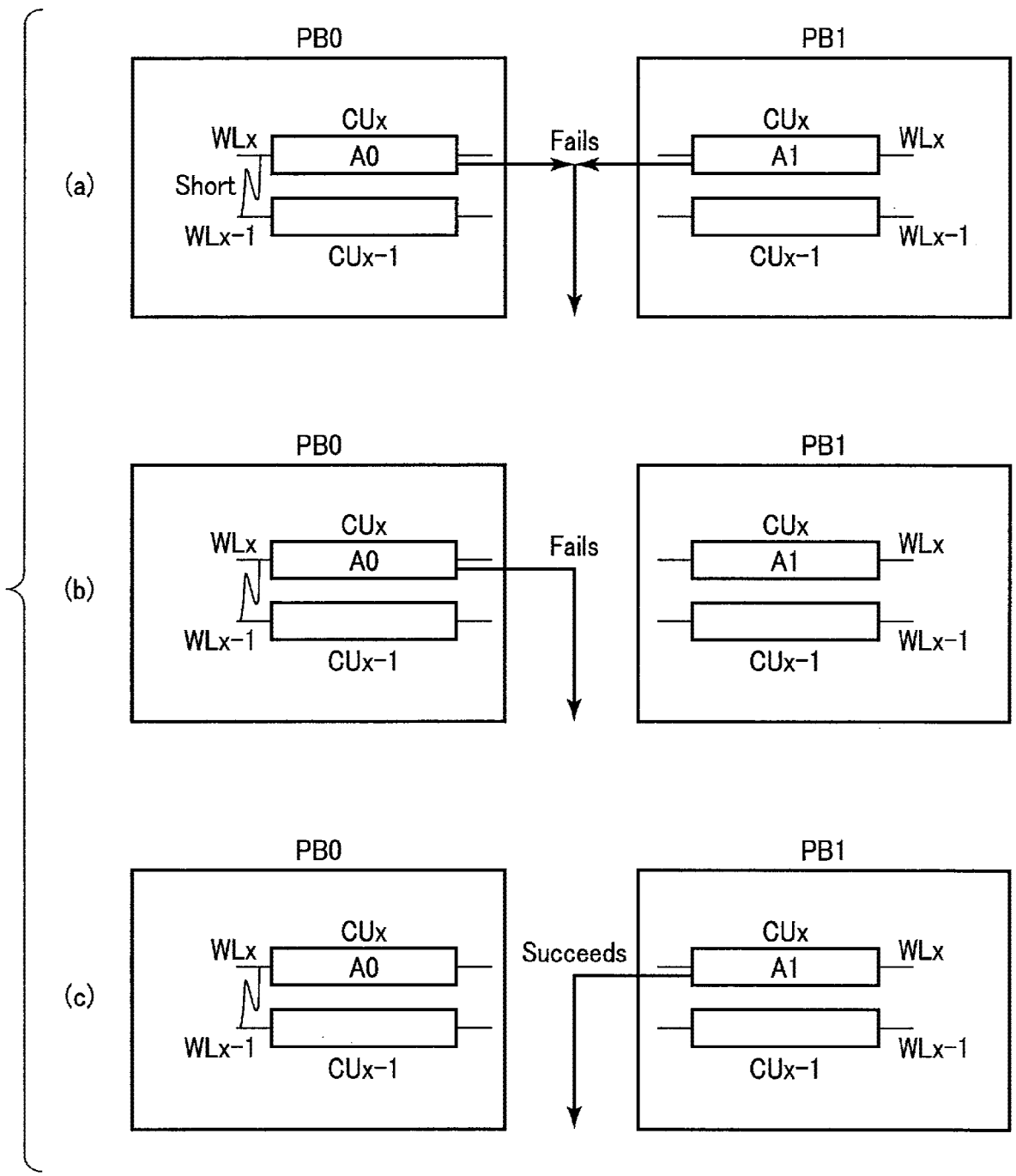
F I G. 13

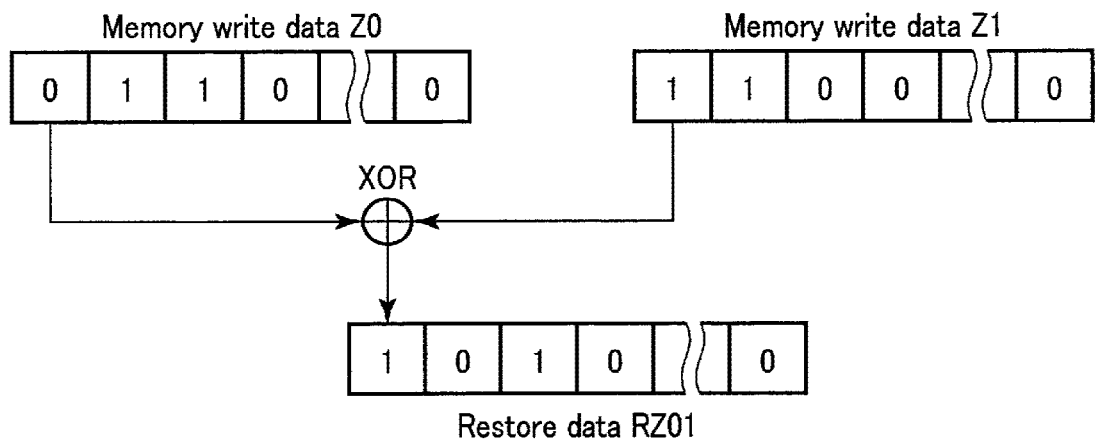
F I G. 14A
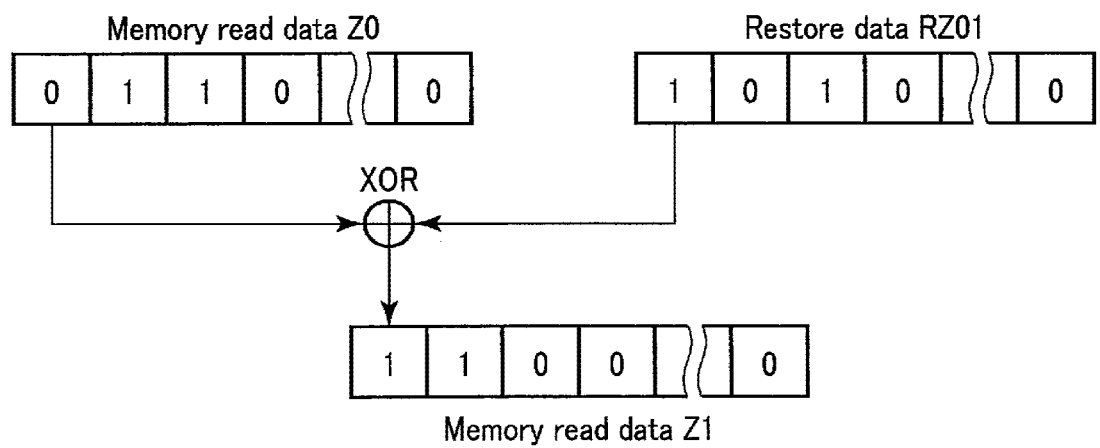
F I G. 14B

| | Status | Output |
|---|---|---|
| I/O[0] | Current status | Pass:"0", fail:"1" |
| I/O[1] | Previous status | Pass:"0", fail:"1" |
| I/O[2] | | |
| I/O[3] | | |
| I/O[4] | | |
| I/O[5] | | |
| I/O[6] | | |
| I/O[7] | | |

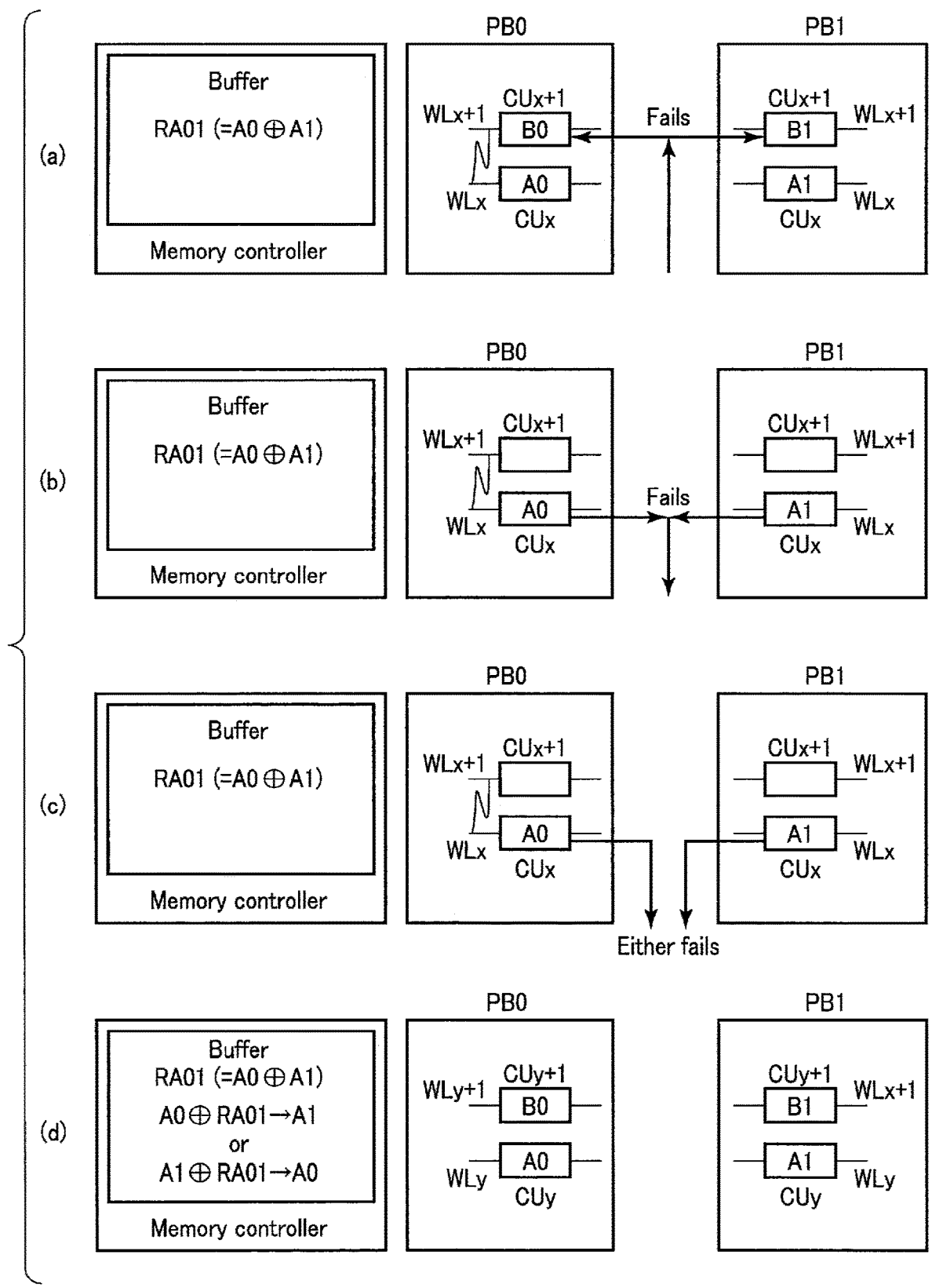
F I G. 19

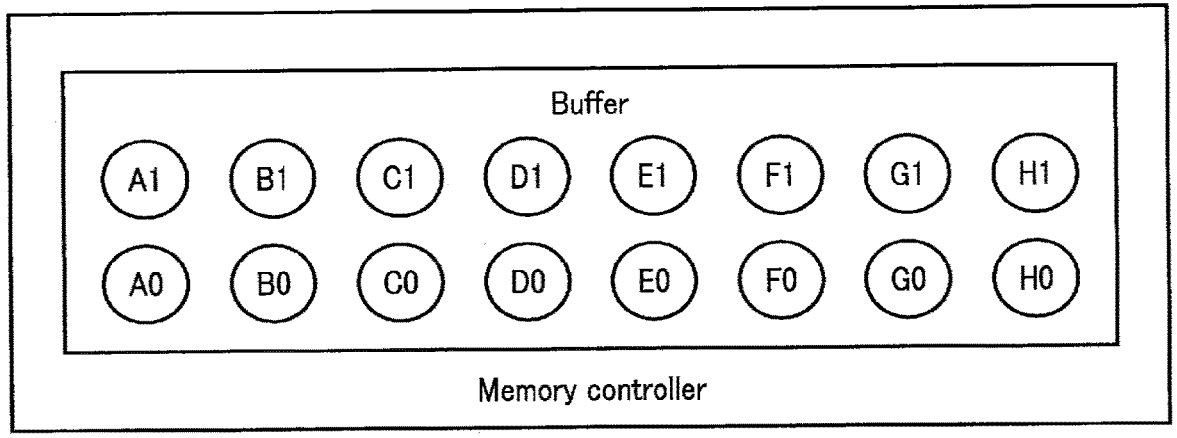
F I G. 27
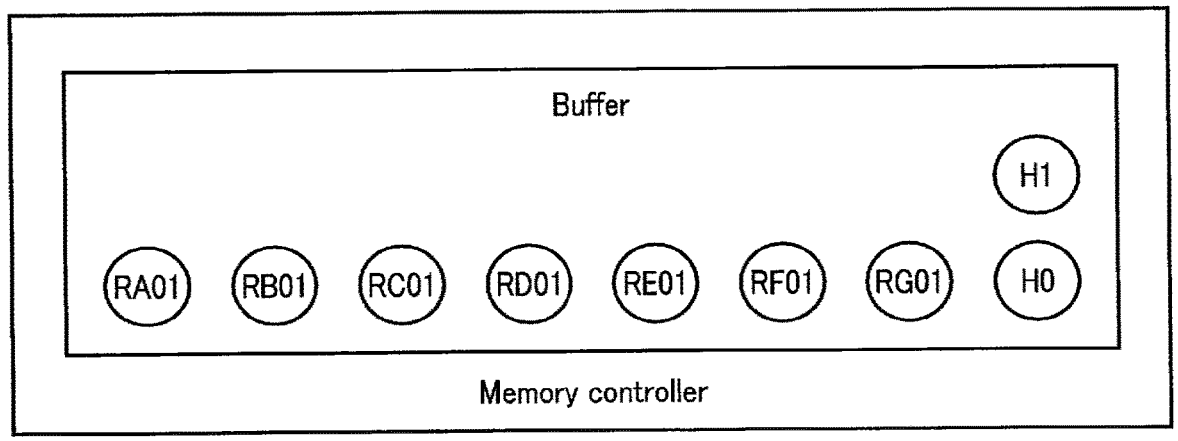
F I G. 28

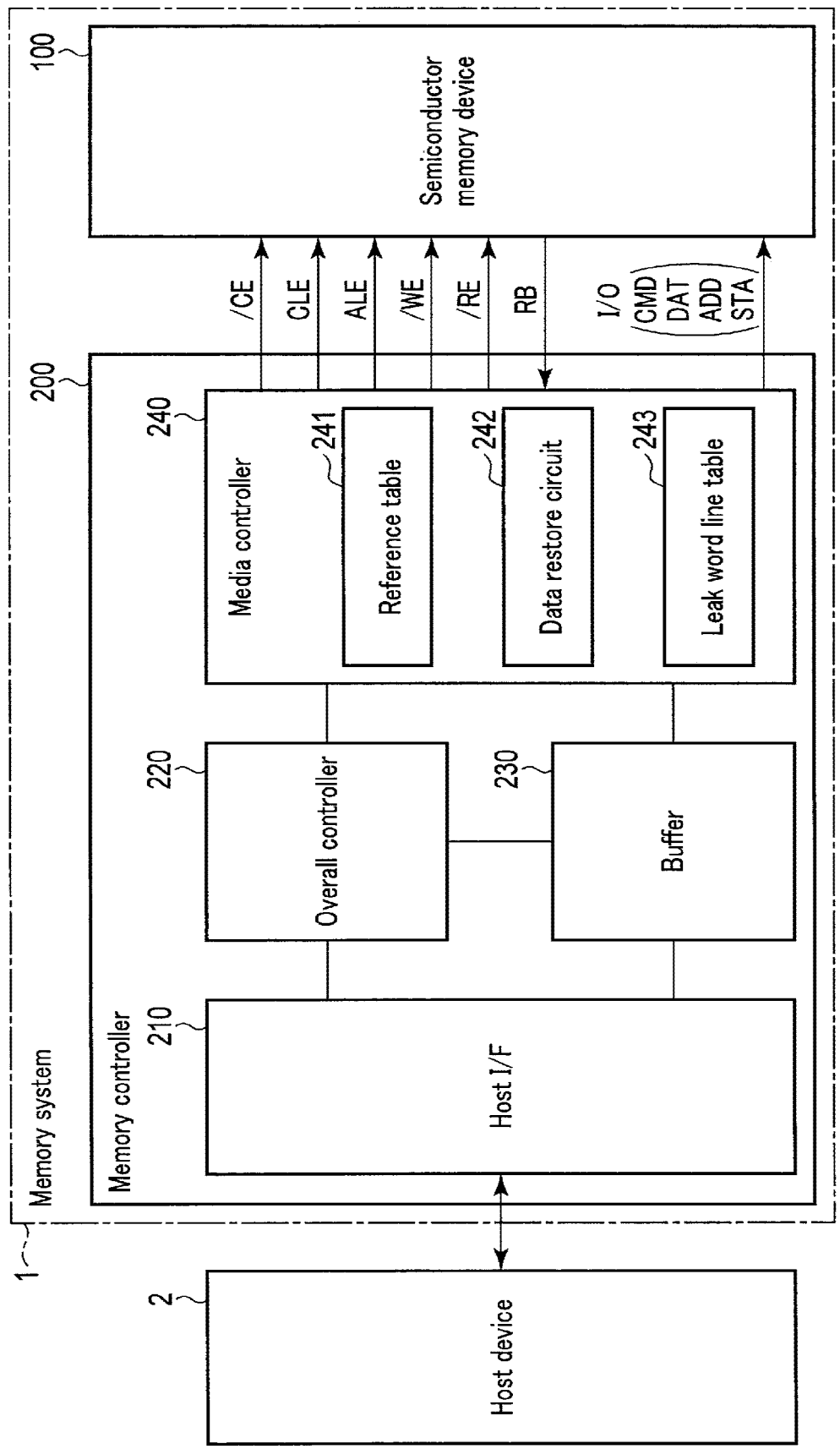
F I G. 29

243

| Word line address | Adjacent word line address | Plane address |
|---|---|---|
| WL2 | WL1 | Plane 0 |
| WL11 | WL10 | Plane 1 |
| WL15 | WL14 | Plane 0 |
| ⋮ | ⋮ | ⋮ |

FIG. 30

|  | Status | Output |
|---|---|---|
| I/O[0] | Current status | Pass:"0", Fail:"1" |
| I/O[1] | Previous status | Pass:"0" Fail:"1" |
| I/O[2] | PB0 leak status | Good:"0", burst:"1" |
| I/O[3] | PB1 leak status | Good:"0", burst:"1" |
| I/O[4] |  |  |
| I/O[5] |  |  |
| I/O[6] |  |  |
| I/O[7] |  |  |

F I G. 33

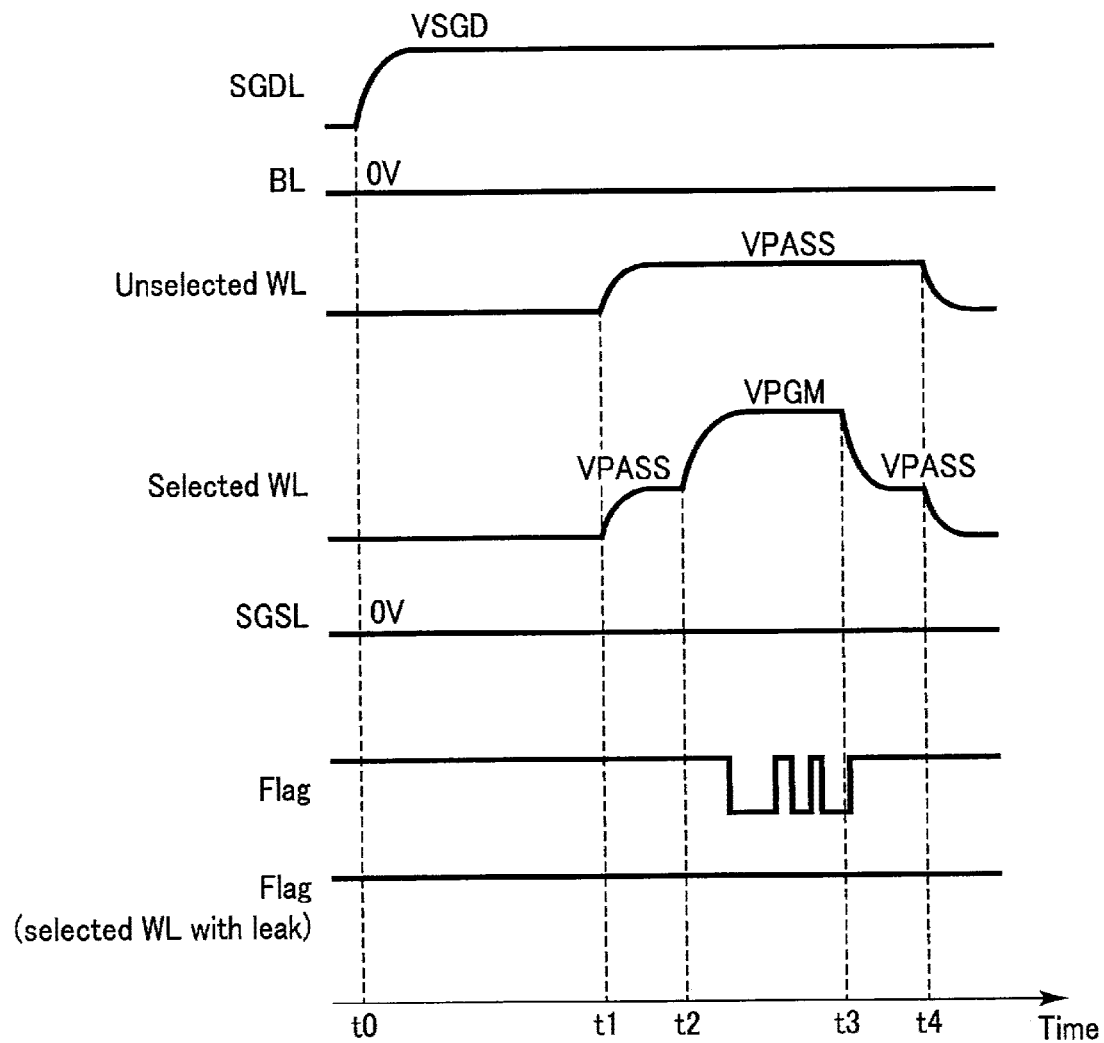
F I G. 34

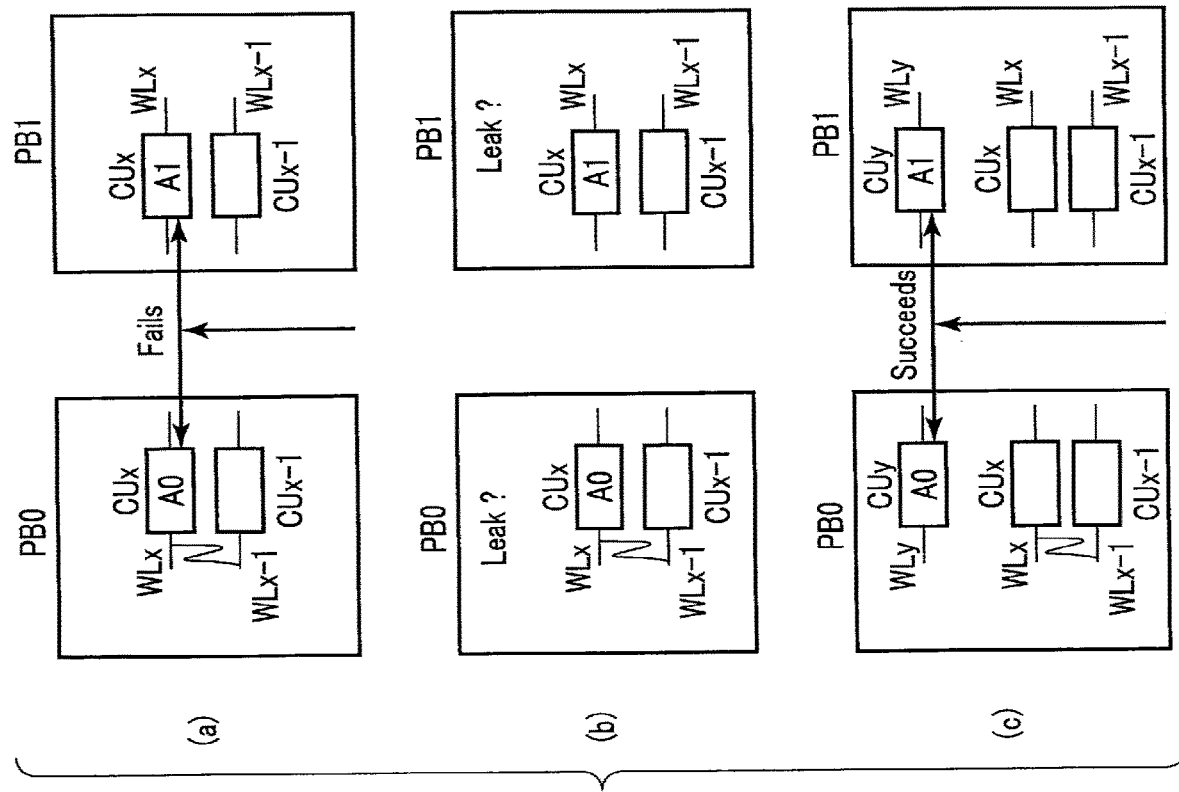
F I G. 35

|  | Status | Output |
|---|---|---|
| I/O[0] | Current status | Pass:"0", Fail:"1" |
| I/O[1] | Previous status | Pass:"0", Fail:"1" |
| I/O[2] | PB0 large leak status | Good:"0", burst:"1" |
| I/O[3] | PB1 large leak status | Good:"0", burst:"1" |
| I/O[4] | PB0 medium leak status | Good:"0", burst:"1" |
| I/O[5] | PB1 medium leak status | Good:"0", burst:"1" |
| I/O[6] | PB0 small leak status | Good:"0", burst:"1" |
| I/O[7] | PB1 small leak status | Good:"0", burst:"1" |

F I G. 42

INFORMATION PROCESSING SYSTEM INCLUDING HOST DEVICE AND MEMORY SYSTEM

CROSS-REFERENCE TO RELATED APPLICATIONS

This application is a continuation of U.S. application Ser. No. 16/519,286, filed Jul. 23, 2019, which is a continuation of U.S. application Ser. No. 16/105,078, filed Aug. 20, 2018, which is a division of U.S. application Ser. No. 15/066,255, filed Mar. 10, 2016 (now U.S. Pat. No. 10,096,366), which claims the benefit of U.S. Provisional Application No. 62/288,175, filed Jan. 28, 2016, the entire contents of which are incorporated herein by reference.

FIELD

Embodiments described herein relate generally to a memory system.

BACKGROUND

A memory system including a NAND flash memory and a controller which controls such a memory is known.

BRIEF DESCRIPTION OF THE DRAWINGS

FIG. 2 illustrates functional blocks of a memory device of the first embodiment;

FIG. 5 illustrates another example of components and connections of the block of the memory device of the first embodiment;

FIG. 6 illustrates another example of the structure of the block of the memory device of the first embodiment;

FIG. 7 illustrates an example of components and connections of a driver set and a row decoder of the first embodiment;

FIG. 8 illustrates another example of components and connections of the driver set and the row decoder of the first embodiment;

FIG. 9 illustrates details of the driver set of the first embodiment;

FIG. 12 illustrates signals communicated during a single plane read in the memory system of the first embodiment over time;

FIG. 13 illustrates an outline of a read in the memory system of the first embodiment;

FIG. 14A illustrates an example of generation of restore data in a second embodiment;

FIG. 14B illustrates restoration of data with the restore data in the second embodiment;

FIG. 19 illustrates an outline of a write in the memory system of the second embodiment;

FIG. 27 illustrates a possible example of storing of data in a memory controller during a write;

FIG. 28 illustrates storing of data during a write in the memory controller of the third embodiment;

FIG. 29 illustrates functional blocks of a memory system of a fourth embodiment;

FIG. 30 illustrates a leak word line table of the fourth embodiment;

FIG. 33 illustrates information read by a status read command of the fourth embodiment;

FIG. 34 illustrates voltages of some interconnects during a current leak test of the fourth embodiment over time;

FIG. 35 illustrates an outline of the write of the memory system of the fourth embodiment;

FIG. 42 illustrates information read by a status read command of the sixth embodiment.

DETAILED DESCRIPTION

Figure 1:
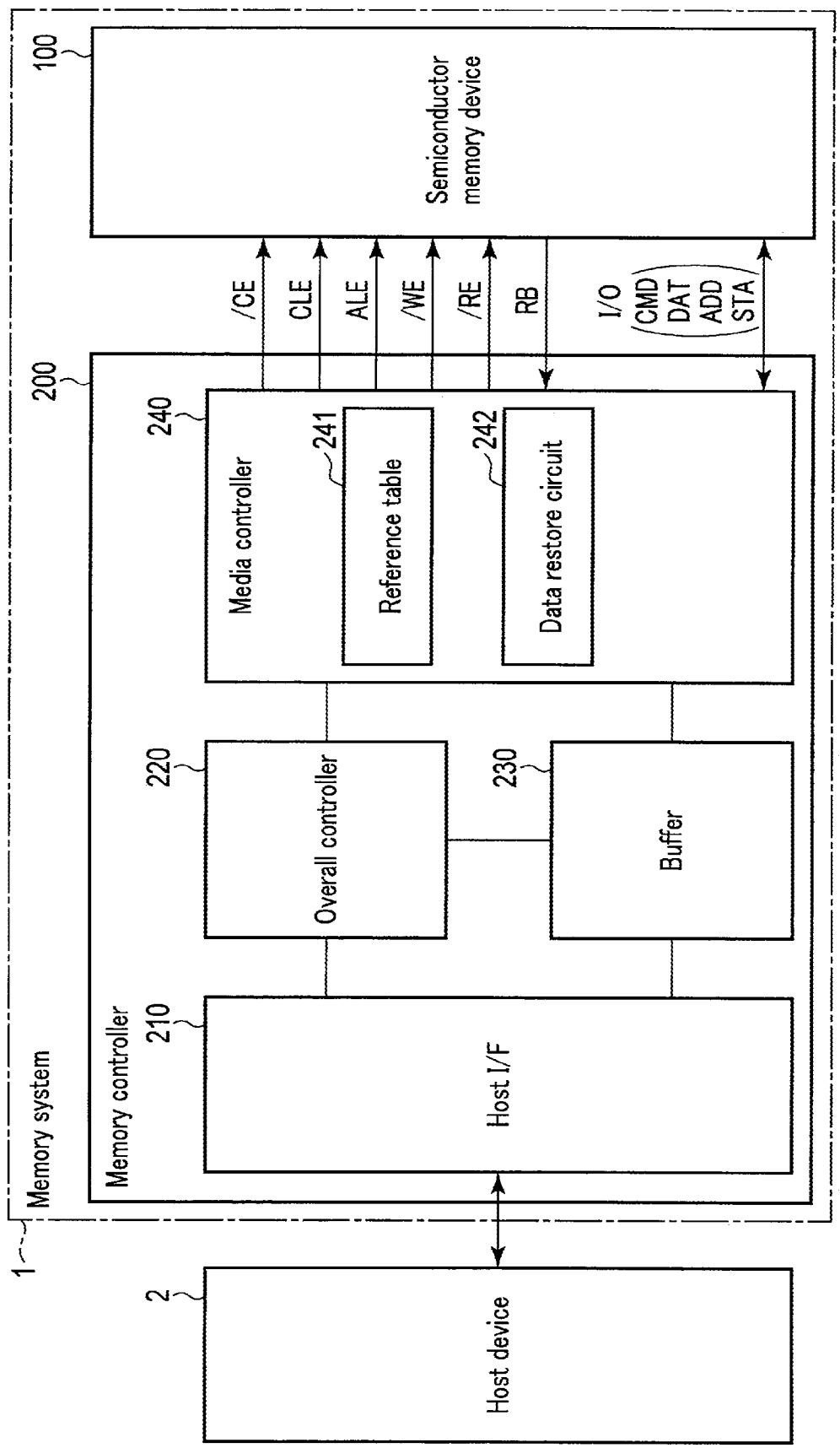
FIG. 1 illustrates functional blocks of a memory system of a first embodiment.

In general, according to one embodiment, a memory system includes a memory device including a first set of cell transistors and a second set of cell transistors; and a controller configured to transmit to the memory device a first instruction and transmit to the memory device a second instruction after reception of a first request without receiving the first request again. The first instruction instructs parallel reads from the first and second sets of cell transistors, and the second instruction instructs a read from the first set of cell transistors.

Embodiments will now be described with reference to the figures. In the following description, components with substantially the same functionalities and configurations will be referred to with the same reference numerals, and repeated descriptions may be omitted. The entire description for a particular embodiment also applies to another embodiment unless it is explicitly mentioned otherwise or obviously eliminated. Each functional block can be implemented as hardware, computer software, or combination of the both. It is not necessary that functional blocks are distinguished as in the following examples. For example, some of the functions may be implemented by functional blocks different from those illustrated below. Furthermore, an illustrated functional block may be divided into functional sub-blocks.

Any step in a flow of a method of an embodiment is not limited to any illustrated order, and can occur in an order different from an illustrated order and/or can occur concurrently with another step.

First Embodiment (Configuration (Structure))

FIG. 1 illustrates functional blocks of a memory system 1 of the first embodiment. As illustrated in FIG. 1, the memory system 1 communicates with a host device 2, and stores data from the host device 2 and reads data to the host device 2 based on instructions of the host device 2.

The memory system 1 includes a semiconductor memory device 100 and a memory controller 200. The memory device 100 and the memory controller 200 may be separate chips, or one chip. The memory controller 200 receives commands from the host device 2, and controls the memory device 100 based on the received commands. Specifically, the memory controller 200 writes data instructed to be written by the host device 2 (host write data) into the memory device 100, and reads data instructed to be read by the host device 2 (host read data) from the memory device 100 to transmit the read data to the host device 2. The memory device 100 is a nonvolatile semiconductor memory device, and for example, a NAND flash memory.

The memory controller 200 includes a host interface 210, an overall controller 220, a buffer 230, and a media controller 240. The memory controller 200 includes, for example, a processor, such as a central processing unit (CPU), a read only memory (ROM), and a random access memory (RAM) as hardware, and it performs a part or all of functions of the host interface 210, the overall controller 220, the buffer 230, and the media controller 240 when firmware (program) stored in the ROM is executed by the processor.

The host interface 210 is coupled to the host device 2 through a bus, and manages communications between the memory controller 200 and the host device 2. The overall controller 220 is implemented by a part of functions of the processor and the RAM, for example. The overall controller 220 controls the whole memory controller 200, controls the buffer 230 and the media controller 240, and manages cooperation of the buffer 230 and the media controller 240.

The buffer 230 temporarily stores data. The buffer 230 is implemented by a part of the memory space of the RAM, for example. The media controller 240 follows the control of the overall controller 220 to control the memory device 100 and learn the states of the memory device 100. The media controller 240 is implemented by a part of the functions of the processor and the RAM, for example. The media controller 240 includes a reference table 241 and a data restore circuit 242.

The reference table 241 is implemented by a part of the memory space of the RAM of the memory controller 200. The reference table 241 indicates various information and includes a translation table of logical addresses and physical addresses. The translation table indicates the area of a physical address in which the latest data assigned a logical address is stored. A logical address is assigned to host write data by the host device 2, and a physical address identifies an area in the memory space in the memory device 100. The reference table 241 has only entries which include invalid data (or, which do not include valid data) when the memory system 1 receives a power supply for the first time for operation, and entries are updated one by one during operation of the memory system 1. The reference table 241 is stored in the memory device 100 when the power supply of the memory system 1 is stopped, and is read from the memory device 100 onto the RAM of the memory controller 200 upon the next power supply.

The data restore circuit 242 restores data. Restoration of data includes restoration of lost data, and correction of errors in data. Specifically, the data restore circuit 242 uses host write data to generate data for restoration of the host write data. The data restore circuit 242 stores the data for restoration therein, and, more specifically, in a part of the RAM or in the buffer 230 of the memory controller 200. This kind of data is hereinafter referred to as restore data. The data restore circuit 242 can use specific write and restore data to restore other write data. Such specific restore data is generated from, for example, a total two of a specific first data item and second data item, can restore the second data item from the first data item and the restore data, and can restore the first data item from the second data item and the restore data. Such restore data can be generated by any known methods, and can be generated using, for example, exclusive OR. An example of generation of restore data is described in the second embodiment.

The data restore circuit 242 adds another type of restore data to host write data. This kind of restore data is a parity. The parity can be generated by any known methods. The set of specific host write data and the parity is referred to as an error correction code (ECC) in general. The set of host write data and the parity is written into the memory device 100, and this set is hereinafter referred to as the memory write data. The data restore circuit 242 uses the parity for memory write data read from the memory device 100 (to be referred to as memory read data hereinafter) to detect errors of the memory read data, and, when errors are detected, it attempts to correct the errors to obtain correct memory read data.

The media controller 240 is coupled to the memory device 100 through a bus. The bus is a NAND bus when based on an example where the memory device 100 is the NAND flash memory, and the following description is based on the example of the NAND bus. The NAND bus transmits signals /CE, CLE, ALE, /WE, /RE, RB, and I/O. The signal /CE enables the memory device 100, and, when the memory device 100 includes plural memory devices 100 (chips of memory devices), it is enabled in order to select one memory device 100, for example. The signals CLE and ALE notify the memory device 100 that the signal I/O flowing into the memory device 100 in parallel with the signals CLE and ALE is a command and an address, respectively. An asserted signal /WE instructs the memory device 100 to take in the signal I/O flowing into the memory device 100 in parallel with the signal /WE. The sign "/" at the beginning of the name of a signal indicates that the signal is asserted when it is low. The signal /RE instructs the memory device 100 to output the signal I/O. The signal RB indicates whether the memory device 100 is in a ready state or busy state, and indicates the busy state when it is low. The memory device 100 accepts commands from the memory controller 2 in the ready state, and does not accept commands from the memory controller 2 in the busy state. The signal I/O has a width of, for example, eight bits, is substantial data, and includes commands (CMD), memory write data or memory read data (DAT), address signals (ADD), status data (STA), etc.

The memory device 100 has functional blocks illustrated in FIG. 2. As illustrated in FIG. 2, the memory device 100 includes plural planes PB (PB0 and PB1), a driver set 11, a sequencer 12, a register 13, and a charge pump (voltage generator) 14. Each plane PB includes a cell array 21, a row decoder 22, a sense amplifier 23, a data latch 24, and a column decoder 25.

The cell array 21 includes blocks BLK (BLK0, BLK1, . . . ). Different planes PB include a set of blocks BLK of the same addresses (IDs). Same-address blocks BLK of the different planes PB are distinguished by specifying a plane PB. Each block BLK includes plural NAND strings STR (STR0, STR1, . . . ). Each string STR includes plural memory cells (not shown). The memory space of a particular plurality of memory cells makes one or more pages. The cell array 21 is also provided with various interconnects.

The sequencer 12 receives the commands CMD and controls the driver set 11, the charge pump 14, the sense amplifiers 23, and the data latches 24 in accordance with the sequence based on the commands CMD.

The charge pump 14 generates various voltages (potentials) from the power voltage in accordance with instructions of the sequencer 12.

The driver set 11 receives a row address signal in an address signal ADD. A row address signal specifies a row address. The driver set 11 receives various potentials from the charge pump 14, and supplies the row decoder 22 with various potentials from the charge pump 14 based on the row address signals. The driver set 11 includes plural drivers, which will be described later.

The row decoder 22 receives the row address signal in the address signal ADD, and selects one block BLK based on the row address signal. To a selected block BLK in a selected plane PB0 and/or PB1, potentials from the driver set 11 are transferred.

The sense amplifier 23 reads data from the memory cells, and writes data in the memory cells in accordance with the control of the sequencer 12. The data latch 24 includes plural data latch units, stores data to the sense amplifier 23, and stores data from the sense amplifier 23. Each data latch unit can store data of one-page size.

The column decoder 25 receives a column address signal in an address signal ADD. A column address signal specifies a column. The column decoder 25 selects a column based on the column address signal, and controls the data latch 24.

The register 13 stores various data and transmits the stored data to the memory controller 200 in accordance with instructions of the sequencer 12. The data includes the status data STA. The status data STA indicates various states of the memory device 100.

The planes PB includes respective sets of a cell array 21, a row decoder 22, a sense amplifier 23, a data latch 24, and a column decoder 25, and can separately operate (read, write, or erase data, etc.) in parallel.

Figure 3:
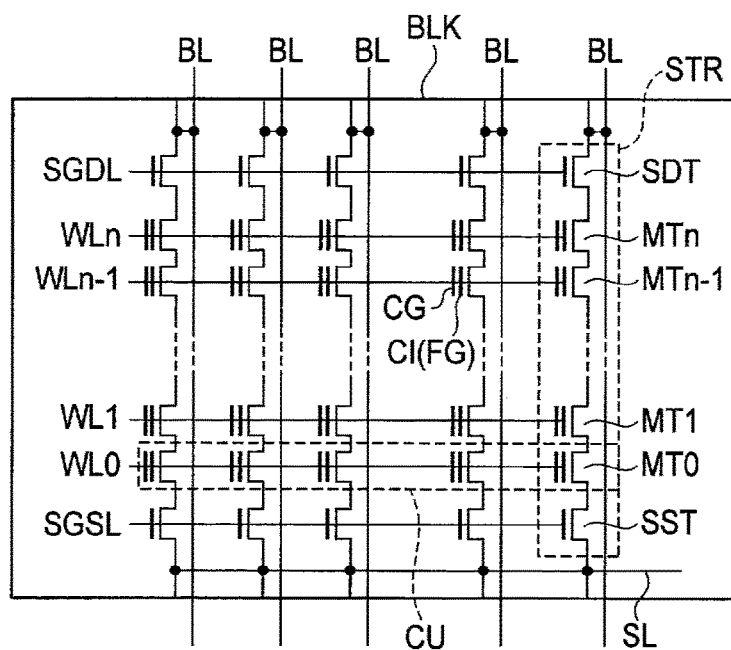
FIG. 3 illustrates an example of components and connections of a block of the memory device of the first embodiment.
Figure 4:
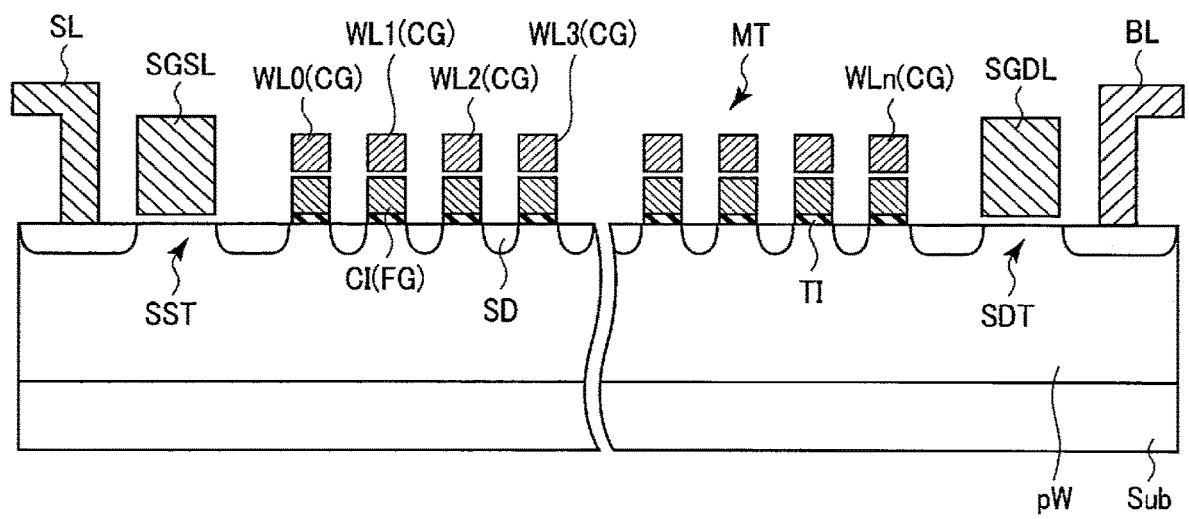
FIG. 4 illustrates an example of a structure of the block of the memory device of the first embodiment.

Each block BLK has components and connections illustrated in FIG. 3, and has the structure illustrated in FIG. 4. As illustrated in FIGS. 3 and 4, each string STR includes n+1 cell transistors MT (MT0 to MTn) and select gate transistors SDT and SST, which are coupled in series. n is a natural number. Each cell transistor MT includes a tunnel insulator TI on a p-type well region pw in a semiconductor substrate sub, a charge storage film CI on the tunnel insulator TI, an inter-gate insulator (not shown) on the charge storage film CI, a control gate electrode CG (word line WL) on the inter-gate insulator, and source or drain areas SD. The charge storage film CI is insulated from around, and is, for example, a floating gate electrode (FG) or may be an insulator. Each cell transistor MT can store data in a non-volatile manner based the threshold voltage varying based on the quantity of charge (the number of electrons) in the charge storage film CI. In a write the threshold voltage of the cell transistor MT is adjusted by injecting electrons, and in a read it is determined whether the threshold voltage of the cell transistor MT exceeds a reference (read voltage Vcgr).

The select gate transistor SST is coupled between a source line SL and the cell transistor MT0, and the select gate transistor SDT is coupled between one bit line BL and the cell transistor MTn. Data in cell transistors MT in the block BLK are erased together.

For each p (p being zero or a natural number smaller than or equal to n), respective control gate electrodes CG of respective cell transistors MTp of the strings STR are coupled to a word line WLp in common. The cell transistors MT coupled to the same word line WL make a cell unit CU. The data of cell transistors MT of one cell unit CU are written and read together. The memory space of one cell unit CU includes one or more pages. When a particular cell unit CU stores data of the one-page size, each cell transistor in that cell unit CU stores one bit data. When a particular cell unit CU stores data of a two-page size, each cell transistor in that cell unit CU stores two bit data. The same holds true for cases of three pages or more.

Respective gates of respective select gate transistors SST of the strings STR are coupled to a select gate line SGSL. Respective gates of respective select gate transistors SDT of the strings STR are coupled to a select gate line SGDL.

Alternatively, each block BLK has components and connections illustrated in FIG. 5, and has the structure illustrated in FIG. 6. In the FIG. 5 configuration, plural strings STR are coupled to one bit line BL in each block BLK. One string STR coupled to each bit line BL belongs to one string unit SU, and each block BLK includes string units SU0 to SUk. k is a natural number and is three as an example in the following description. The configuration in which one string unit SU is included in one block BLK corresponds to the FIG. 3 configuration.

Each bit line BL is coupled to one string STR from each of the four string units SU0 to SU3 in each block BLK.

Each string STR includes a select gate transistor SSTb (SSTb0, SSTb0, SSTb2, or SSTb3), a select gate transistor SST (SST0, SST1, SST2, or SST3), memory cell transistors MT0 to MTn, and a select gate transistor SDT (SDT0, SDT1, SDT2, or SDT3). The transistors SSTb, SST, and MT and SDT are coupled in series between the source line SL and one bit line BL in this order.

Strings STR respectively coupled to different bit lines BL on a one-to-one basis make one string unit SU. In each string unit SU, the gates of the cell transistors MTp are coupled to a word line WLp for each p. The set of the cell transistors MT which share a word line WL in one string unit SU makes a cell unit CU. In each block BLK, the word lines WLp in different string units SU are also coupled to each other.

The select gate transistors SDTq, SSTq, and SSTbq belong to a string unit SUq, where q is either zero or a natural number lower than or equal to k (=3).

For each q, respective gates of respective select gate transistors SDTq of strings STR of the string unit SUq are coupled to a select gate line SGDLq. For each q, respective gates of respective select gate transistors SSTq of strings STR of the string unit SUq are coupled to a select gate line SGSLq. For each q, respective gates of respective select gate transistors SSTbq of strings STR of the string unit SUq are coupled to a select gate line SGSLbq.

The select gate lines SGSL of two or more of the string units SU in one block BLK may be coupled to each other. The select gate lines SGSbL of two or more of the strings unit SU in one block may also be coupled to each other.

The circuit illustrated in FIG. 5 can be implemented by the structure illustrated, for example in FIG. 6. FIG. 6 illustrates the example of n=7. As illustrated in FIG. 6, a string STR is disposed above the substrate sub. The well area pW is disposed in the surface of the substrate sub, and a semiconductor pillar SP is disposed on the well area pW along the d3 axis. The side of the semiconductor pillar SP is covered with a tunnel insulator TI. The side of the tunnel insulator TI is covered with a charge storage film CI. The charge storage film CI is an insulator or conductor, and has a side covered with a block insulator BI. The semiconductor pillar SP serves as a current path of a string STR, and provides the area in which the channels for the cell transistors MT and select gate transistors SDT, SST, and SSTb are formed.

Above the well area pW, the select gate lines SGSbL and SGSL, the word lines WL (WL0 to WL7), and the plural select gate lines SGDL spread along the d12 plane. The d12 plane is the plane which consists of the d1 axis and d2 axis. The select gate lines SGDL are coupled to each other (not shown). The select gate lines SGSbL and SGSL, the set of the word lines WL0 to WL7, and the set of the select gate lines SGDL are lined up in this order along the d3 axis with an interval. The select gate lines SGSbL and SGSL, the word lines WL, and the select gate line SGDL are in contact with the block insulator BI.

Of the semiconductor pillar SP, the tunnel insulator TI, the charge storage film CI, and the block insulators BI, the section which crosses with the select gate line SGSbL serves as the select gate transistor SSTb, the section which crosses the select gate line SGSL serves as the select gate transistor SST, and the section which crosses a word line WL serves as a cell transistor MT.

The transistors SSTb, SST, MT, and SDT which are lined up along the d3 axis correspond to the transistors included in one string STR.

A bit line BL is disposed above, along the d3 axis, the semiconductor pillar SP. The bit line BL extends along the d1 axis, and plural bit lines have an interval along the d2 axis. One bit line BL is coupled to the tops of strings STR via plugs VP1 and VP2.

Plural strings STR illustrated in FIG. 6 are disposed in different coordinates on the d2 axis. Such strings STR disposed in different coordinates on the d2 axis correspond to strings STR included in one string unit SU.

In the surface area of the well area pW, a diffusion layer of n+ type impurities nd is further provided. The diffusion layer nd is coupled to the bottom of a contact plug CP1. The top of the contact plug CP1 is coupled to a source line SL.

As described above, the select gate lines SGDL, SGSL, and SGSbL, the word lines WL, and the source line SL are coupled to the driver set 11 through the row decoder 22, and driven by the drive set 11. The details of the driver set 11 differ in the case where the blocks BLK have the FIG. 3 structure, which will be referred to as a single string type hereinafter, and the case where they have the FIG. 5 structure, which will be referred to as a multi-string type. FIGS. 7 and 8 illustrate the components and connections of the row decoder 22 and the driver sets 11 for the single string type and the multi-string type, respectively. The differences are in components for selecting one string unit SU in one block BLK in the multi-string type structure.

FIGS. 7 and 8 also illustrate the charge pump 14. The charge pump 14 includes plural pump units 141a, 141b, ..., each of which can generate a potential independently from another.

The row decoder 22 includes a set of plural block decoders 22a (22a0, 22a1, ...) for the respective blocks BLK. In addition, as illustrated in FIGS. 7 and 8, only in one block BLK selected by one block decoder 22a, the select gate lines SGDL, SGSL, and SGSbL and the word lines WL (WL0 to WLn) are coupled to the interconnects SGD, SGS, SGSb, and CG (CG0 to CGn) through transistors XFR, respectively. In FIG. 7, the interconnects SGD and SGS are coupled to drivers SGDdry and SGSdrv, respectively, and the interconnects CG0 to CGn are coupled to drivers CGdrv0 to CGdrvn, respectively. In FIG. 8, the interconnects CG0 to CGn are coupled to drivers CGdrv0 to CGdrvn, respectively, and further, for each q, the interconnect SGDq is coupled to a driver SGDdrvq, the interconnect SGSq is coupled to a driver SGSdrvq, and the interconnect SGSbq is coupled to a driver SGSbdrvq. The source line SL is coupled to a driver SLdrv.

In FIG. 8, the drivers SGDdrv, SGSdrv, and SGSbdrv for a selected string unit SU apply various potentials to the interconnects coupled thereto during a read, write or erase of data. In contrast, the drivers SGDdrv, SGSdrv, and SGSbdry for unselected string units SU output the ground potential VSS(=0V). In this way, only one selected string unit SU is coupled to the bit lines BL and/or source line SL.

As illustrated in FIG. 9, the driver set 11 is also shared by the plural planes PB. Specifically, the interconnect CG0 is coupled to each block BLK of the plane PB0 through the transistors XFR of each block decoder 22a for the plane PB0, and coupled to each block BLK of the plane PB1 through the transistors XFR of each block decoder 22a for the plane PB1. The same applies to the interconnects CG1 to CGn, SGD0 to SGD3, SGS0 to SGS3, and SGSb0 to SGSb3. Selection of one or both of the planes PB is performed by the block decoders 22a. Specifically, in one or both of the planes PB selected by the row address signal, the block decoders 22a for the selected block BLK turn on the transistors XFR thereof.

Based on such sharing of one component and having common addresses by plural components, specification of one cell unit CU includes specification of one or both planes PB, one block BLK, and one word line WL. Furthermore, in the multi-string structure, specification of one cell unit CU further includes specification of one string unit SU.

(Operation)

Referring to FIGS. 10 to 13, a read in the memory system of the first embodiment will be described. The following description is based on the example where each cell transistor MT of a mentioned cell unit CU stores one-bit data, i.e., the example of storing data of one-page size per cell unit CU. Based on this example, specification of a particular page equals specification of one cell unit CU, and by extension, specification of one word line WL.

Figure 10:
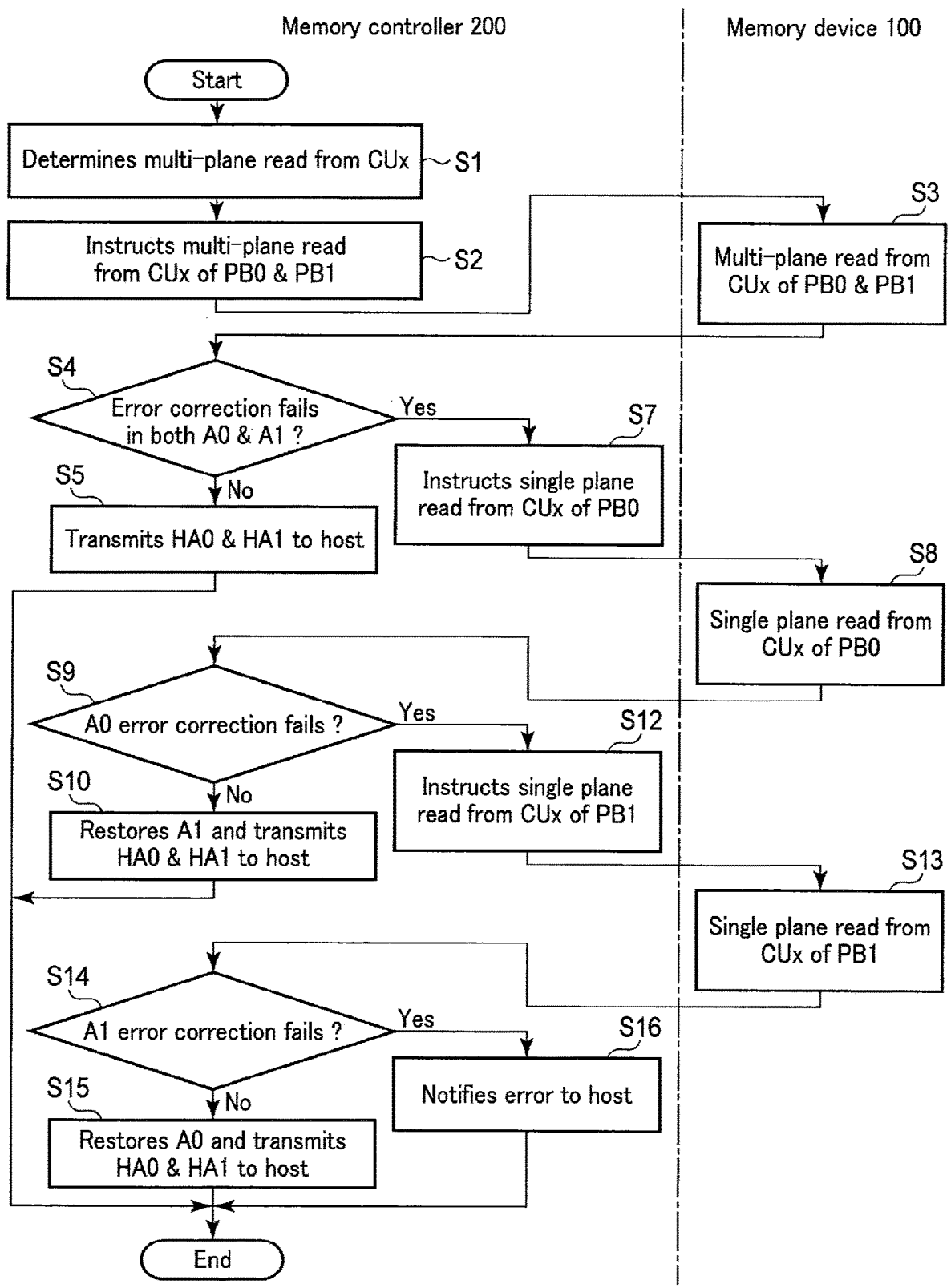
FIG. 10 illustrates the flow of a read of the memory system of the first embodiment.

FIG. 10 illustrates the flow of a read of the memory system of the first embodiment. When the host device 2 instructs (or, requests) a read of data to the memory system 1 and this instruction leads to a read of data from plural planes PB, which will be referred to as a multi-plane read hereinafter, the FIG. 10 flow starts. As a specific example, the overall controller 220 interprets the read instruction from the host device 2, and determines to read host read data HA0 and HA1 from the planes PB0 and PB1, respectively. The host read data HA0 and the parity thereof make memory read data A0, and the host read data HA1 and the parity thereof make memory read data A1. The memory read data A0 and A1 are stored in the planes PB0 and PB1, respectively. The instruction from the overall controller 220 is received by the media controller 240, and the FIG. 10 flow starts. The FIG. 10 flow occurs after the instruction to trigger the FIG. 10 flow and before the performance (or, completion) of another additional instruction (or, request) from the host device 2 by the memory system 1, for example. Specifically, the flow occurs as a response to reception of the read instruction of the host read data HA0 and HA1 In addition, the flow occurs as a response to reception of one read instruction of the host read data HA0 and HA1 from the host device 2. In other words, the flow is performed without reception of two or more identical instructions from the host device 2.

The following description is based on the example of the multi-plane read from the two planes PB. The read for three or more planes PB can, however, be similarly performed by extension of the principle described in the following. This aspect is applicable to other embodiments that follow.

In step S1, the media controller 240 (memory controller 200) refers to the reference table 241 to learn the addresses of the pages storing the memory read data A0 and A1. In the ongoing example, the memory read data A0 and A1 are stored in pages of cell units CU coupled to a word line WLx (x being a natural number below 0 or n) of the same address in the same-address blocks BLK in the planes PB0 and PB1.

The media controller 240 learns that the instructed read is a multi-plane read because the memory read data A0 and A1 are stored in the cell units CU of two planes PB. The specification of the selected word line WLx in a particular plane PB includes specification of one plane PB, one block BLK, and one word line WLx. Furthermore, when the blocks BLK are of the multi-string type, the specification of one cell unit CU further includes specification of one string unit SU.

In step S2, the media controller 240 instructs the multi-plane read from the cell units (selected cell units) CUx of the word line WLx of the planes PB0 and PB1 to the memory device 100. The instruction of the multi-plane read instructs parallel reads from the instructed plural planes PB.

When the multi-plane read instruction is received by the memory device 100, the sequencer 12 in step S3 controls the driver set 11, and the sense amplifier 23, the data latch 24, and the column decoder 25 of the planes PB0 and PB1 to read the memory read data A0 and A1 from the cell units CUx.

The memory read data A0 and A1 are transmitted from the memory device 100 to be received by the media controller 240. The received memory read data A0 and A1 may include errors.

In step S4, the media controller 240 controls the data restore circuit 242 to detect errors of the memory read data A0 and A1, and, if any, it tries to correct them to obtain correct memory read data A0 and A1. When one or both of correct memory read data A0 and A1 are obtained (No branch), the flow shifts to step S5.

When both correct memory read data A0 and A1 are obtained, the host read data HA0 and HA1 are obtained, and they are transmitted to the host device 2 by the overall controller 220 in step S5. When only memory read data A0 or A1 is obtained, the media controller restores from the obtained memory read data A0 (or A1) the memory read data A1 (or A0). The restoration can be performed by various methods. Examples of the methods include use of a product code. The product code is known by persons skilled in the art. Based on the ongoing example, the generation of a product code includes using the string of bits from a set of memory write data (sets of host write data and parity thereof) to generate another parity. With the restoration, both host read data HA0 and HA1 are obtained. After step S5 is completed, the FIG. 10 flow ends.

In contrast, when the error correction of both memory read data A0 and A1 fail in step S4 (Yes branch), the flow shifts to step S7. In the steps from step S7, the media controller 240 tries a read from the selected cell units CU of the planes PB0 and PB1 and error correction for each plane PB separately. The details of operation are similar to that in the multi-plane read. A read from any plane PB can be performed first.

In step S7, the media controller 240 instructs a single plane read from the cell unit CUx of the plane PB0 to the memory device 100. When the instruction is received by the memory device 100, the sequencer 12 reads the memory read data A0 from the cell unit CUx of the plane PB0 in step S8. The memory read data A0 is transmitted from the memory device 100 to be received by the media controller 240.

In step S9, the media controller 240 tries to obtain the correct memory read data A0. When the correct data is obtained (No branch), the host read data HA0 is obtained, and the flow shifts to step S10.

In step S10, the media controller 240 restores the memory read data A1 from the memory read data A0. With the restoration, both host read data HA0 and HA1 are obtained, and the overall controller 220 transmits the host read data HA0 and HA1 to the host device 2, where the flow ends.

In contrast, when the errors are uncorrectable in step S9 (Yes branch), the media controller 240 instructs a single plane read from the cell unit CUx of the plane PB1 to the memory device 100 in step S12. When the instruction is received by the memory device 100, the sequencer 12 reads the memory read data A1 from the cell unit CUx of the plane PB1 in step S13. The memory read data A1 is transmitted from the memory device 100 to be received by the media controller 240.

In step S14, the media controller 240 tries to obtain correct memory read data A1. When the correct data is obtained (No branch), the host read data HA1 is obtained, and the flow shifts to step S15.

In step S15, the media controller 240 restores the memory read data A0 from the memory read data A1. With the restoration, both host read data HA0 and HA1 are obtained, and the overall controller 220 transmits the host read data HA0 and HA1 to the host device 2, where the flow ends.

In contrast, when the errors are uncorrectable in step S14 (Yes branch), the flow shifts to step S16. In step S16, the overall controller 220 notifies the host device 2 that the read of the host read data HA0 and HA1 failed, and the flow ends. Alternatively, in step S16, the media controller 240 can perform a retry read to each of the planes PB0 and PB1. A retry read refers to a read with a read voltage larger or smaller than the read voltage used, for example, in the read by the last multi-plane read instruction (in step S2). By one or more retry reads, the memory read data A0 and A1 may be obtained.

Figure 11:
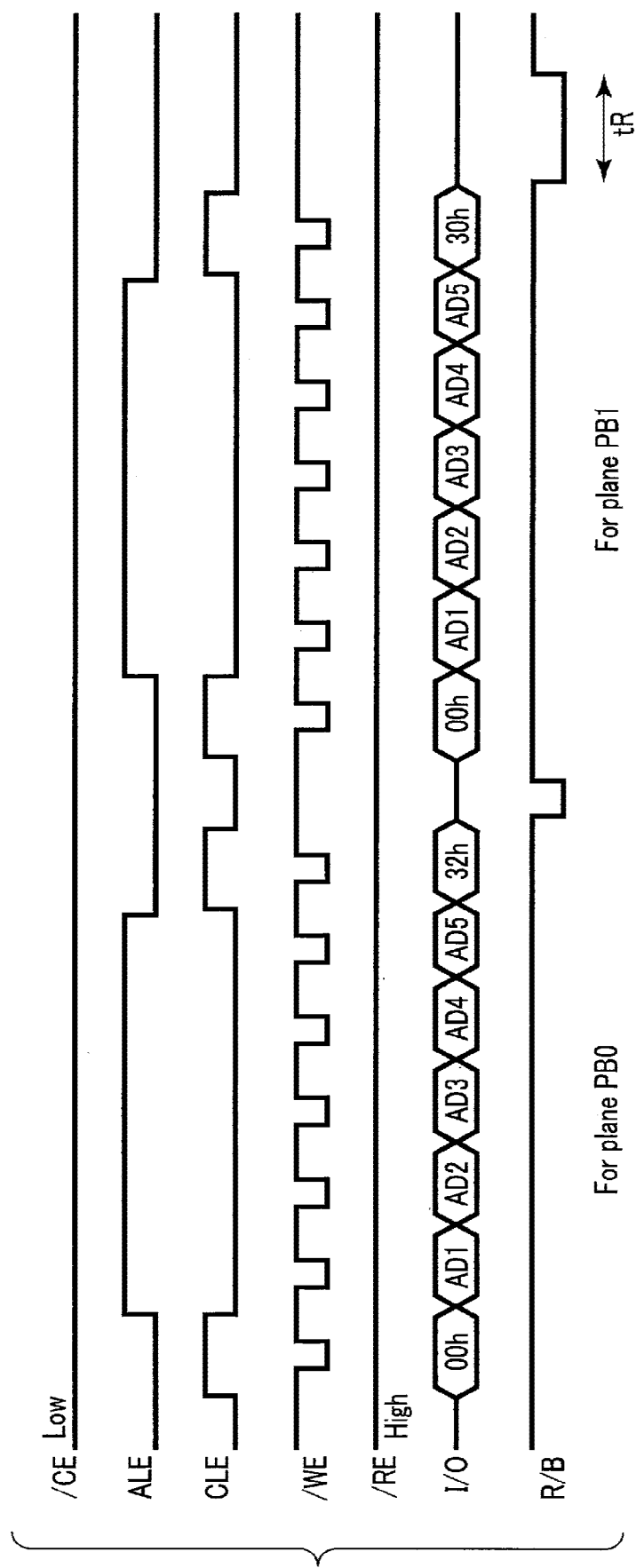
FIG. 11 illustrates signals communicated during a multi-plane read in the memory system of the first embodiment over time.

FIG. 11 illustrates signals communicated between the memory controller 200 and the memory device 100 during one multi-plane read by the memory system 1 of the first embodiment over time. The communication in FIG. 11 may occur in step S2 of FIG. 10.

As illustrated in FIG. 11, the media controller 240 keeps asserting the signal /CE (or, maintains the signal at low), and keeps negating the signal /RE (maintains the signal at high) over the period illustrated in FIG. 11.

The media controller 240 transmits a command and an address signal for one of the two planes PB0 and PB1 to the memory device 100. Any plane PB can precede. The process for the plane PB0 precedes in the following example.

The media controller 240 asserts (or, makes high) the signal CLE, and transmits a write command 00h to the memory device 100 while the signal CLE is asserted. Moreover, the media controller 240 asserts (or, makes low) the signal /WE while the write command 00h is transmitted. Thus, the transmission of a command includes the transmission of the asserted signal CLE, the transmission of the command during the transmission of the asserted signal CLE, and the transmission of the asserted signal /WE during the transmission of the command.

Subsequently, the media controller 240 asserts (or, makes high) the signal ALE, transmits an address signal (or, set of sections AD1 to AD5) while the signal ALE is asserted, and asserts the signal /WE during the transmission of each of sections AD1 to AD5 of the address. The address signal is transmitted by five cycles, for example. The first two are a column address signal and the last three are a row address signal. A row address signal specifies one plane PB, one block BLK, and one word line WL. A row address signal further specifies one string unit SU when the block BLK is of the multi-string type.

Thus, the transmission of an address signal includes the transmission of the asserted signal ALE, the transmission of the address signal during the transmission of the asserted signal ALE, and the transmission of the asserted signal/WE during the transmission of each section of the address signal.

The media controller 240 transmits a command 32h to the memory device 100 after it transmits the address signal for the plane PB0. The command 32h instructs not to start and to suspend the read specified by the command 00h and the following address signal, and indicates a subsequent instruction will follow.

When the memory device 100 receives the command 32h, it makes the signal R/B low to notify a busy state to the memory controller 200.

When the busy state ends, the media controller 240 transmits the read command 00h and the address signal (AD1 to AD5) for the plane PB1 to the memory device 100. The address in the address signal for the plane PB0 and that for the plane PB1 of the target of the multi-plane read specify the same address except for the address of the plane. After the media controller 240 transmits the address signal for the plane PB1, it transmits a command 30h to the memory device 100. The command 30h instructs execution of the suspended instruction (i.e., the read from the plane PB0), and the instruction just prior to the command 30h (i.e., the read from the plane PB1).

When the memory device 100 receives the command 30h, it executes the instructions. The execution of the instructions corresponds to the execution of step S3 of FIG. 10, for example. The memory device 100 notifies the busy state to the memory controller 200 during the execution of instructions. The busy time corresponds to the read time tR.

FIG. 12 illustrates signals communicated between the memory controller 200 and the memory device 100 during a single plane read by the memory system 1 of the first embodiment over time. The communication in FIG. 12 may occur in steps S7 and S12 of FIG. 10. The details are similar to those of the multi-plane read. They differ in that the media controller 240 issues the command 30h after it transmits the address signal for one target plane PB.

FIG. 13 illustrates the outline of a read in the memory system 1 of the first embodiment. The operation illustrated in FIG. 13 may occur by the execution of the FIG. 10 flow. FIG. 13(a) corresponds to steps S2, S3, and the Yes branch of S4 of FIG. 10. As an example, the word line WLx of a particular plane (for example, the plane PB0) and an adjacent word line WLx−1 are unintentionally short-circuited. In contrast, the word line WLx of another plane PB1 is not short-circuited with an adjacent word line WLx−1.

Assume that, with the word line WLx short-circuited in this way, the media controller 240 performs a multi-plane read from the cell units CUx based on the instruction from the host device 2. Such a situation may occur after writes without a status read after every write, for example. The memory controller 200 can instruct the memory device 100 to transmit the status about the success or failure of a write after the write. Successive writes of data without such a status read can, however, be performed, and in such a case, it will turn out that the read-target word line WLx is short-circuited for the first time when the multi-plane read is performed. In addition, the word line WLx may be short-circuited after the status read due to some reasons.

The multi-plane read results in failure of reads from the cell units CUx of the planes PB0 and PB1. This is because a current leak from the word line WLx disables the word line WLx to be applied with a read voltage Vcgr. The failure of read can be determined by the data restore circuit 242 when it determines that the memory read data A0 from the selected cell unit CU of the word line WLx of the plane PB0 includes uncorrectable errors.

The read from the word line WLx of the plane PB1 also fails. The word lines WL of a particular address of different planes PB are not coupled to each other. For this reason, the short circuit between the word lines WLx and WLx−1 of the plane PB0 does not necessarily influence the plane PB1. In multi-plane read, however, the planes PB0 and PB1 are specified, which turn on the transfer transistors XFR of the selected block BLK of the plane PB0 and those of the selected block BLK of the plane PB1. The word line WLx of plane PB1 is, in turn, electrically coupled to that of the plane PB0 through the transfer transistors XFR. For this reason, the multi-plane read results in failure of the read from the cell unit CUx of the word line WLx also in the plane PB1.

Thus, the multi-plane read fails also in the read in the plane PB1, which does not include a short circuit of the word line WLx. If each word WLx of the two planes PB0 and PB1 is actually short-circuited with an adjacent word line WLx−1 (or WLx+1), reads from the cell units CUx of the planes PB0 and PB1 actually fail. Such a phenomenon, however, hardly occurs in terms of probability, and such a short circuit is unlikely to actually occur. For this reason, it is assumed that the multi-plane read from the cell units CUx with the word line WLx of one plane PB short-circuited resulted in the failure of the reads of the memory read data A0 and A1 of both planes PB0 and PB1. Based on such assumption, as illustrated in FIGS. 13(b) and (c), the memory controller 200 performs separately the read from the cell unit CUx of the plane PB0 and that from the cell unit CUx of the plane PB1.

FIG. 13(b) corresponds to steps S7 and S8, and the Yes branch of S9 of FIG. 10. As illustrated in FIG. 13(b), the media controller 240 performs a single plane read from the cell unit CUx of the plane PB0. The read data by this single plane read is determined to be error-uncorrectable by the data restore circuit 242.

FIG. 13(c) corresponds to steps S12 and S13, and the No branch of S14 of FIG. 10. As illustrated in FIG. 13(c), the media controller 240 performs a single plane read from the cell unit CUx of the plane PB1. With this single plane read, data is read correctly.

(Advantages)

According to the first embodiment, when the errors of both data from the plane PB0 and that from the plane PB1 read by a multi-plane read are uncorrectable, the memory controller 200 performs single plane reads to the planes PB0 and PB1 separately. As a result, when the data read from the two planes PB by the multi-plane read fails due to a short circuit of a word line WLx of one plane PB, data can be read from the cell unit CUx of the word line WLx of the other plane PB.

Second Embodiment

The second embodiment is similar to the first embodiment, and relates to operations during writes with status reads.

In the second embodiment, the memory system 1 has the same functional blocks as the memory system 1 of the first embodiment. In contrast, the memory controller 200 is configured to perform the operations described in the following in the second embodiment. The blocks BLK of the second embodiment are of the single string type.

FIG. 14A illustrates an example of generation of restore data in the second embodiment, and FIG. 14B illustrates restoration of data with the restore data in the second embodiment. The media controller 240 performs the operation illustrated in FIG. 14A to prepare a multi-plane write to the memory device 100. First, the media controller 240 generates memory write data Z0 and Z1, which will be written in the planes PB0 and PB1, respectively.

The media controller 240 further controls the data restore circuit 242 to use a total of two bits of the same position in the memory write data Z0 and Z1 to generate the information for restoring one of the two bits from the other. As an example, the media controller 240 generates data (bit) by applying the exclusive OR (XOR) to a total two of the first bits from the memory write data Z0 and Z1, and stores the generated data (bit) in the buffer 230. Similarly, the data restore circuit 242 generates the exclusive OR of each of all the remaining bits. The thus-generated set of bits of exclusive OR is restore data RZ01. The restore data RZ01 has the same size as the memory write data Z0 or Z1.

As illustrated in FIG. 14B, when one of the memory read data Z0 and Z1 is lost (for example, memory read data Z1) during a read, the other read data Z0 and the restore data RZ01 can be used to restore the read data Z1.

Specifically, the exclusive OR of two bits in the same position of the memory read data Z0 and the restore data RZ01 can restore the corresponding bit in the read data Z1. The restore data may be generated by any method as long as it allows one of associated two data items from the other.

Figures 15, 16:
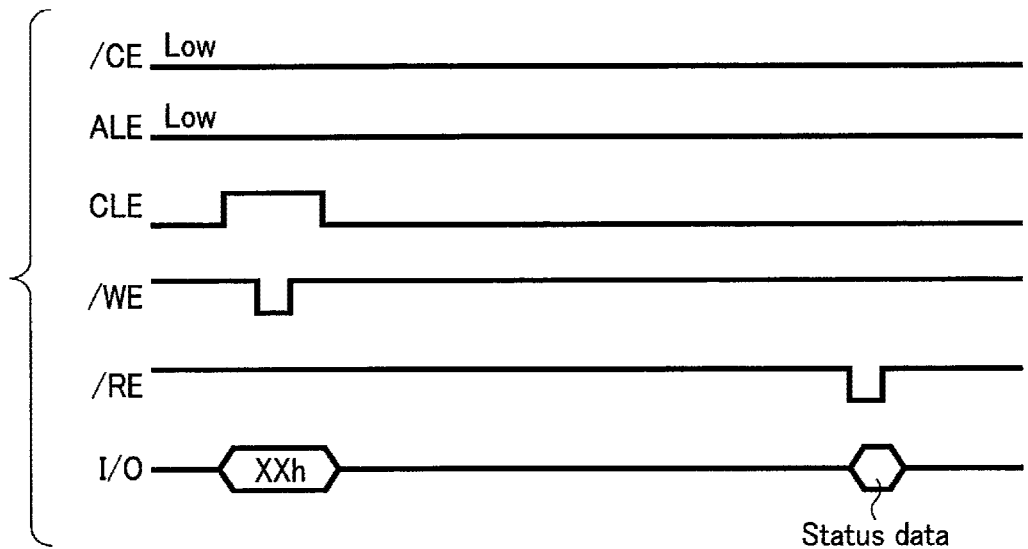
FIG. 15 illustrates signals communicated during a status read in the second embodiment over time.
FIG. 16 illustrates information read by a status read command of the second embodiment.

FIG. 15 illustrates signals communicated between the memory controller 200 and the memory device 100 during a status read used in the second embodiment over time. As illustrated in FIG. 15, the memory controller 200 transmits a status read command XXh to the memory device 100. When the memory device 100 receives the status read command, it stores in the register 13 various kinds of status data about the instructions just prior to the reception of the command. Then, when the memory controller 200 asserts the signal /RE, the memory device 100 responds to this and transmits the status data to the memory controller 200 from the register 13.

FIG. 16 illustrates an example of the information read by the status read command XXh. More specifically, FIG. 16 illustrates the information read by the status read command which follows a write instruction to cell units CU (including the case where the cell units belong to the different planes PB). As illustrated in FIG. 16, each bit of the signal I/O indicates a corresponding one of various statuses. I/O[0] indicates whether the last instruction (i.e., write instruction) is success or failure with a "0" bit and "1" bit, respectively. I/O[1] is used when the status is read before completion of transmission of all write data to the read-target cell units CU to the memory device 100, and indicates the success or failure of reception of the last write data for the cell unit CU by the memory device 100.

Figure 17:
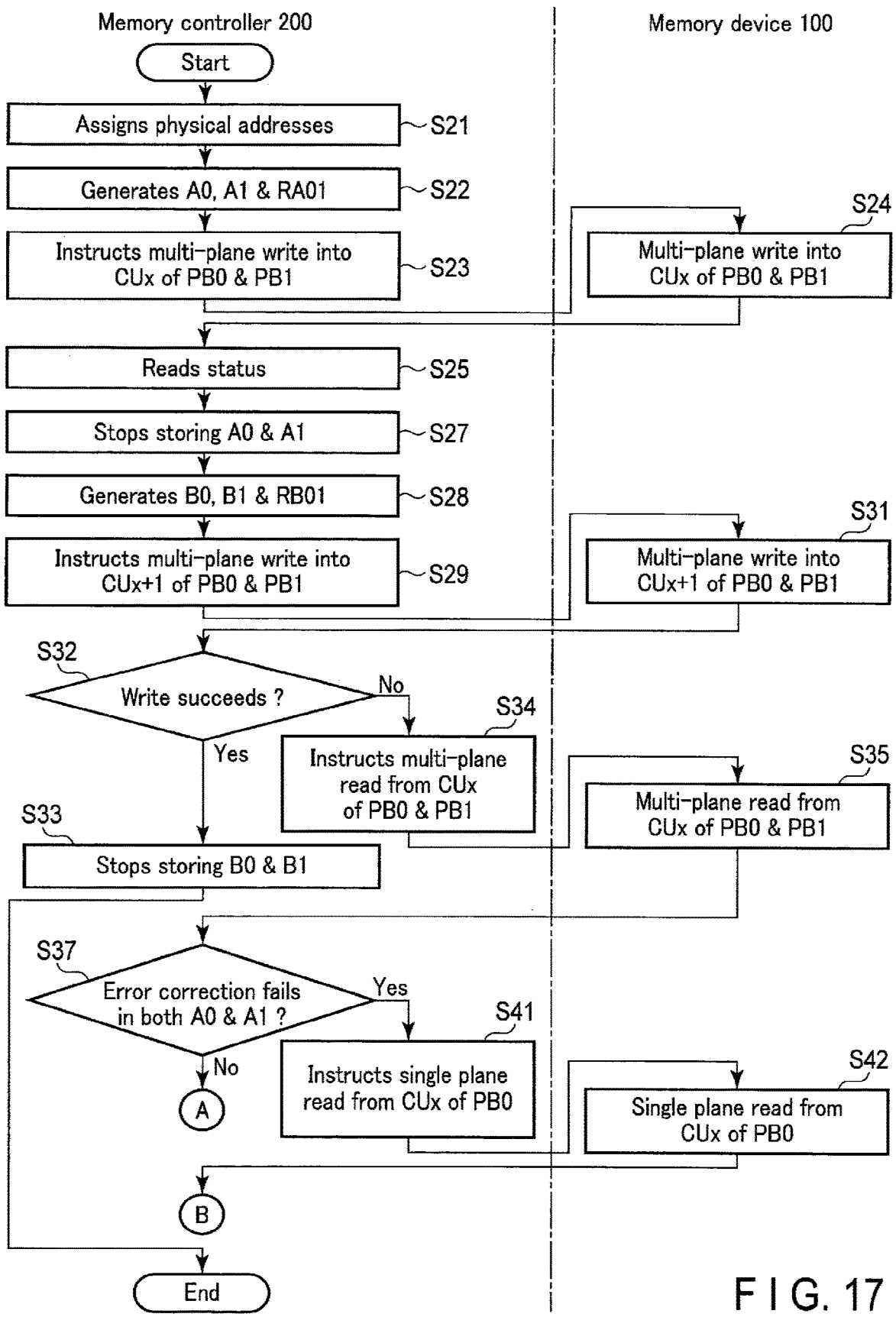
FIG. 17 illustrates a part of the flow of a read of the memory system of the second embodiment.
Figure 18:
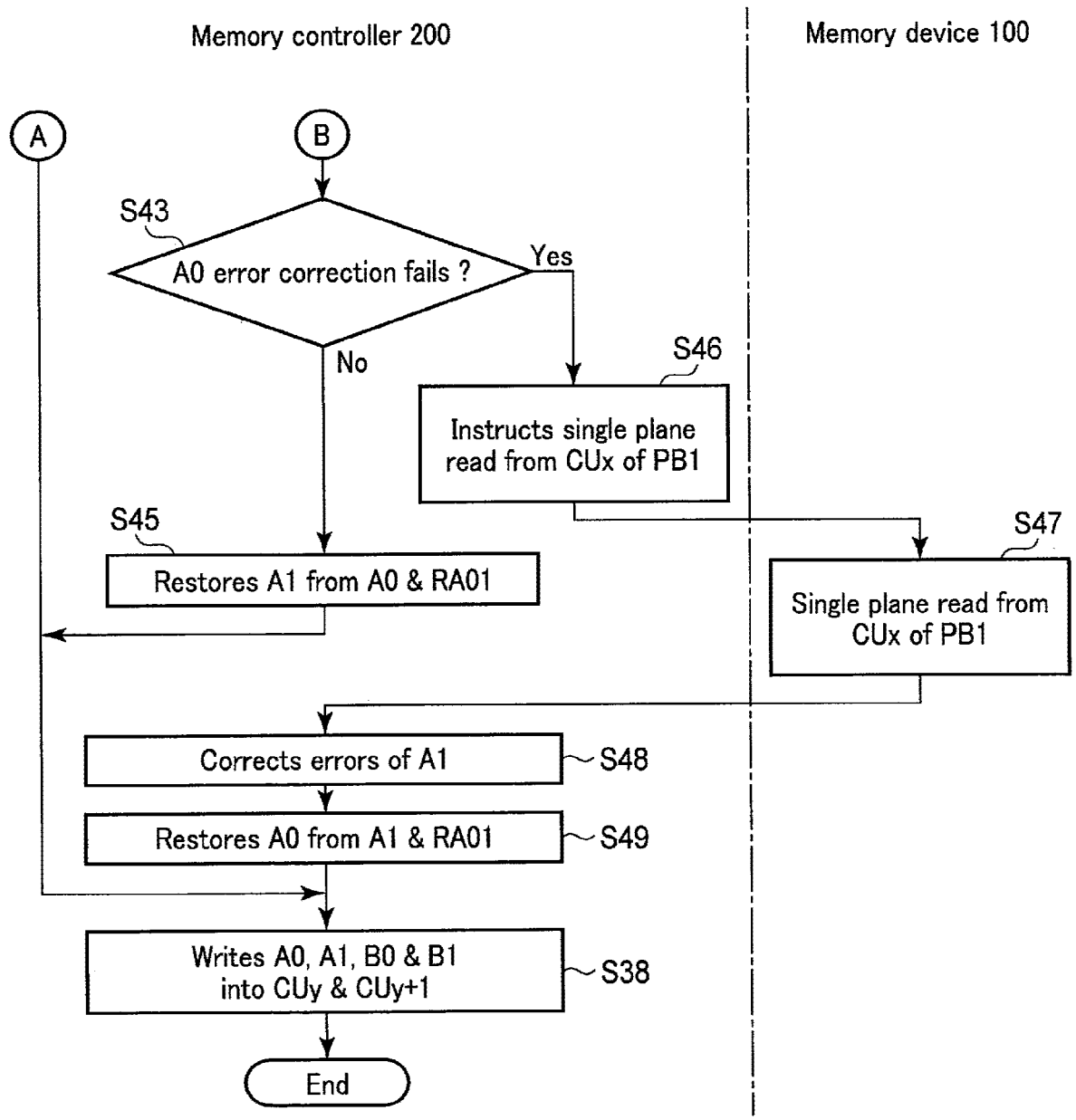
FIG. 18 illustrates another part of the flow of the read of the memory system of the second embodiment.

FIGS. 17 and 18 illustrate the flow of a write of the memory system of the second embodiment. When the host device 2 instructs a write to the memory system 1 and the instruction leads to data writes to two or more cell units CU of the plural planes PB0 and PB1, which will be referred to as a multi-plane write hereinafter, the flow of FIGS. 17 and 18 starts. As an example, the overall controller 220 interprets the write instruction from the host device 2, and determines that it will respectively write host write data HA0 and HA1 into the same-address cell units CUx of the planes PB0 and PB1 and respectively write host write data HB0 and HB1 into other cell units CU of the planes PB0 and PB1. The overall controller 220 instructs the determined write to the media controller 240. The reception of the instruction by the media controller 240 triggers the flow of FIGS. 17 and 18. The flow of FIGS. 17 and 18 occurs after the instruction to trigger the flow of FIGS. 17 and 18 and before the performance (or, completion) of another additional instruction (or, request) from the host device 2 by the memory system 1, for example. Specifically, the flow occurs as a response to reception of the write instruction of the host write data HA0, HA1, HB0, and HB1. In addition, the flow occurs as a response to reception of one write instruction of the host write data HA0, HA1, HB0, and HB1 from the host device 2. In other words, the flow is performed without reception of two or more identical instructions from the host device 2.

In step 21, the media controller 240 refers to the reference table 241 to determine cell units CU which will have the host write data HA0, HA1, HB0, and HB1 written, and reflects the result of the determination in the reference table 241. Specifically, the media controller 240 refers to the reference table 241 to find physical addresses which do not have data written, i.e., which do not have logical addresses assigned. The media controller 240 then updates the reference table 241 so that a found physical address and the host write data HA0 are associated, and another found physical address and the host write data HA1 are associated. Because of the multi-plane write, the host write data HA0 and HA1 are assigned the addresses of word lines WLx of same-address blocks BLK of the planes PB0 and PB1, respectively. Similarly, the media controller 240 assigns the host write data HB0 and HB1 to the addresses of word lines WLx+1 of same-address blocks BLK of the planes PB0 and PB1, respectively.

In step S22, the media controller 240 adds a parity to the host write data HA0 to generate memory write data A0, and adds a parity to the host write data HA1 to generate memory write data A1. The media controller 240 further generates restore data RA01 for the memory write data A0 and A1, and stores the same in the buffer 230.

In step S23, the media controller 240 instructs a write of the memory write data A0 and A1 to cell units CUx of same-address blocks BLK of the planes PB0 and PB1 (or, instructs a multi-plane write) to the memory device 100. Even after the transmission of the multi-plane write instruction, the buffer 230 follows the instruction of the overall controller 220 to maintain the memory write data A0 and A1 and the restore data RA01. The storing of the memory write data A0 and A1 continues, for example, until the media controller 240 confirms that the memory write data A0 and A1 are correctly written into the memory device 100 with a subsequent read. In contrast, restore data RA01 is stored until confirmation of a success of the write which triggers the flow of FIGS. 17 and 18, i.e., the write of the host write data HA0, HA1, HB0, and HB1 in the ongoing example.

When the multi-plane write instruction is received by the memory device 100, the sequencer 12 in step S24 controls the driver set 11, and the sense amplifiers 23, the data latches 24, and the column decoders 25 of the planes PB0 and PB1, to write the memory write data A0 and A1 into respective cell units CUx of the planes PB0 and PB1, respectively. Upon completion of the writes, the memory device 100 shifts to the ready state. The shift to the ready state is irrelevant to the result of whether the writes succeed and does not necessarily indicate a success of the writes.

After the transmission of the multi-plane write instruction in step S23, the media controller 240 further reads the status of the memory device 100 in step S25. To this end, the media controller 240 transmits the status read command to the memory device 100 after a lapse of a particular time after the transmission of the multi-plane write instruction. The status read is not accepted by the memory device 100 during the busy state of the memory device 100. The media controller 240 repeatedly issues the status read command with a particular interval until the memory device 100 shifts to the ready state to receive the status read command.

When the result of the status read indicates a success, the media controller 240 in step S27 stops storing the memory write data A0 and A1 in the buffer 230, and releases the memory space of the buffer 230. The memory write data A0 and A1 may be erased, or be in a state where it can be overwritten by other data. Assume that in the ongoing example the multi-plane write to the cell units CUx succeeds for simplification of the description.

In step S28, as in step S22, the media controller 240 adds a parity to the host write data HB0 to generate memory write data B0, and adds a parity to the host write data HB1 to generate memory write data B1. The media controller 240 further generates restore data RB01 for the memory write data B0 and B1, and stores the same in the buffer 230. The generation of the memory write data HB0 and HB1 and the restore data RB01 only need to complete from after step S21 before step S29, and may be performed in parallel to one or more of steps S22, S23, S24, S25, and S27.

In step S29, as in step S23, the media controller 240 instructs a write of the memory write data B0 and B1 into cell units CUx+1 of the planes PB0 and PB1 to the memory device 100. Even after the transmission of the multi-plane write instruction, the buffer 230 maintains the memory write data B0 and B1 and restore data RB01.

When the multi-plane write instruction is received by the memory device 100, the sequencer 12 in step S31 writes the memory write data B0 and B1 into respective cell units CUx+1 of the planes PB0 and PB1, respectively, as in step S24.

In step S32, the media controller 240 reads the status of the memory device 100. When the result of the status read indicates a success (Yes branch), the flow shifts to step S33. In step S33, the media controller 220 stops storing the memory write data B0 and B1 in the buffer 230. Moreover, the media controller 240 notifies the completion of the instruction to the host device 2. Then, the flow ends.

In contrast, the determination of write failure in step S32 (No branch) may occur when, for example, the word lines WLx+1 and WLx become short-circuited during the write into the cell unit CUx+1 of the planes PB0 and PB1 in step S31. The short circuit may have made the memory read data A0 or A1 of the cell units CUx unreadable. For this reason, steps S34, S35, and S37 are performed based on the write failure determination in step S32 in order to try to obtain the memory read data A0 and A1 of the cell units CUx. Steps S34, S35, and S37 are the same as step S2, S3, and S4 of FIG. 10, respectively. Specifically, in steps S34, S35, and S37, the media controller 240 and the sequencer 12 try to obtain the correct memory read data A0 and A1 from the cell units CUx of the planes PB0 and PB1.

When both correct memory read data A0 and A1 are obtained in step S37 (No branch), it results in the memory read data A0 and A1 stored in the buffer 230. The No branch of step S37 may occur when the failure of the multi-plane write in step S31 does not result from a short circuit of the word line WLx+1.

In contrast, when in step S37 obtaining of both correct memory read data A0 and A1 fails (Yes branch), steps S41, S42, and S43 are performed. The advance of the flow to the Yes branch of step S37 may occur when the failure of multi-plane write in step S31 results from a short circuit of word line WLx+1. Steps S41, S42, and S43 are the same as steps S7, S8, and S9 of FIG. 10, respectively. Specifically, the media controller 240 and the sequencer 12 try to obtain the correct memory read data A0 from the cell unit CUx of the plane PB0 in steps S41, S42, and S43. When in step S43 the correct memory read data A0 is obtained (No branch), the flow shifts to step S45. The shift of the flow to step S45 may occur when the failure of the multi-plane write in step S31 results from a short circuit of the word line WLx+1 in the plane PB1.

In step S45, the data restore circuit 242 uses the memory read data A0 obtained in step S43 and the restore data RA01 to restore the memory read data A1 in the buffer 230.

In contrast, when the error correction of the memory read data A0 fails in step S43 (Yes branch), steps S46 and S47 are performed. The advance of the flow to the Yes branch of step S43 may occur when the failure of the multi-plane write in step S31 results from a short circuit of the word line WLx+1 in plane PB0. Steps S46 and S48 are the same as steps S12 and S13 of FIG. 10, respectively. Specifically, in steps S46 and S48, the media controller 240 and the sequencer 12 perform a single plane read from the cell unit CUx of the plane PB1. The flow then shifts to step S48. Step S48 is the same as step S14, and specifically the media controller 240 in step S48 tries to obtain correct memory read data A1. The obtaining of correct memory read data should succeed. This is because the arrival at step S48 results from the failure of the write in step S31 due to the short circuit of the word line WLx+1 of the plane PB0, and, therefore, the memory read data A1 in the cell unit CUx of the plane PB1 can be correctly read by the single plane read.

In step S49, the data restore circuit 242 uses the memory read data A1 obtained in step S48 and the restore data RA01 to restore the memory read data A0 in the buffer 230.

The No branch of step S37 and steps S45 and S49 continues at step S38. In step S38, the media controller 240 and the sequencer 12 perform a multi-plane write to four cell units CU different from the cell units CUx and CUx+1 of the memory write data A0, A1, B0, and B1. Step S38 can include, for example, the flow of FIGS. 17 and 18. The media controller 240, however, assigns cell units CU different from those assigned to the memory write data A0, A1, B0, and B1 in step S21 in the first loop, and the flow of FIGS. 17 and 18 is performed for the newly assigned cell units CU. For example, the host write data HA0 and HA1 are respectively assigned to the addresses of cell units CUy (y being zero or a natural number smaller than or equal to n other than x) of the planes PB0 and PB1, and the host write data HB0 and HB1 are respectively assigned to the addresses of cell units CUy+1 of the planes PB0 and PB1.

FIG. 19 illustrates the outline of a write in the memory system 1 of the second embodiment. The operations illustrated in FIG. 19 may occur by the execution of the flow of FIGS. 17 and 18. FIG. 19(a) corresponds to step S23, S24, S25, S27, S28, S29, S31, and the No branch of S32 of FIG. 17. A multi-plane write to the cell unit CUx succeeds, and a multi-plane write of cell unit CUx+1 fails.

FIG. 19(b) corresponds to step S34, S35, and the Yes branch of S37 of FIG. 17. The media controller 240 performs a multi-plane read to the cell units CUx based on assumption of occurrence of a short circuit between the word lines WLx and WLx+1, but it fails.

FIG. 19(c) corresponds to the set of steps S41, S42 and the No branch of S43, or the set of steps S41, S42, the Yes branch of step S43, and steps S46, S47, and S48 of FIGS. 17 and 18. The media controller 240 performs a single plane read from each of the cell unit CUx of the plane PB0 and that of the plane PB1.

FIG. 19(d) corresponds to the set of steps S45 and S38 or the set of steps S49 and S38 of FIG. 18. The media controller 240 uses a successfully-read one of the memory write data A0 and A1 and the restore data RA01 to restore the other. The media controller 240 then writes the memory write data A0, A1, B0, and B1 into the cell units CUy and CUy+1 of the planes PB0 and PB1.

Figure 20:
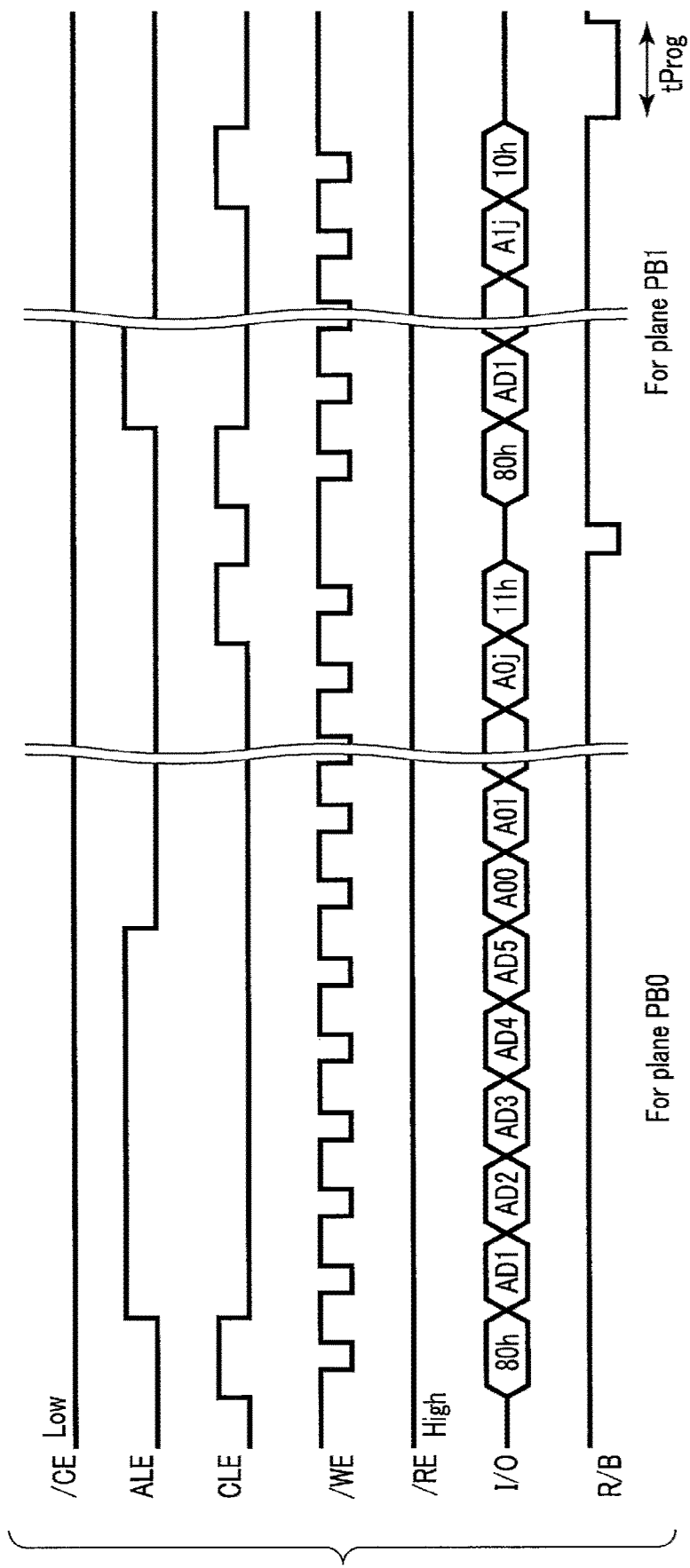
FIG. 20 illustrates signals communicated during a multi-plane write in the memory system of the second embodiment over time.

FIG. 20 illustrates signals communicated between the memory controller 200 and the memory device 100 during a multi-plane write in the memory system of the second embodiment over time. The communication in FIG. 20 may occur in steps S23 and S29 of FIG. 17.

As illustrated in FIG. 20, the media controller 240 transmits a write command 80h, an address signal for the plane PB0, and memory write data A0 (A00 to A0j) to the memory device 100, where j is a natural number. After the media controller 240 transmits the memory write data A0j, it transmits a command 11h to the memory device 100. The command 11h instructs not to start and to suspend the write specified by the command 80h and the following address signal, and indicates a subsequent instruction will follow. After the command 11h, the media controller 240 transmits a write command 80h, an address signal for the plane PB1, and memory write data A1 (A10 to A1j) to the memory device 100. After the media controller 240 transmits the data A1j, it transmits a command 10h to the memory device 100. When the memory device 100 receives the command 10h, it performs the instructions. The execution of the instructions corresponds to the execution of steps S24 and S31 of FIG. 17, for example.

(Advantages)

Failure of a multi-plane write into a particular cell unit CUx+1 may result from various causes, and the cause of a failure cannot be easily specified immediately. In contrast, a failure of multi-plane write into the cell units CUx+1 may disable a read of data from written cell units CUx of the plane PB0 and/or PB1 due to some causes. For example, when the word lines WLx+1 and WLx of the plane PB0 are short-circuited during a multi-plane write into the cell units CUx+1 of the plane PB0, data cannot be read from the cell unit CUx of the plane PB0. To address this, it is possible that, when it is determined that a multi-plane write into the cell units CUx+1 during successive multi-plane writes to plural cell units CU fails, data which have become unreadable is restored to be written into another cell unit CU again. To this end, the memory controller 200 can perform a multi-plane read to the cell units CUx when the multi-plane write to the cell units CUx+1 fails. Such a multi-plane read may fail. This failure is unlikely to result from a short circuit in both respective word lines WLx of the two planes PB0 and PB1, as described in the first embodiment.

The memory system 1 of the second embodiment performs a multi-plane read to the cell unit CUx when the write to the cell unit CUx+1 in successive multi-plane writes to two adjacent cell units CUx and CUx+1 fails. When both resultant read data are error-uncorrectable, the memory system 1 performs a single plane read from each of the planes PB0 and PB1 as in the first embodiment. This, even when data read from two planes PB with a multi-plane read fails due to a short circuit of the word line WLx of one of the plane PB, enables the data to be correctly read from the cell unit CU of the word line WLx of the other plane PB. Even when the cell unit CUx of one plane PB0 cannot be read, the associated restore data may remain in the buffer 230 in the case of successive multi-plane writes to plural cell units CU. In this case, the data in the cell unit CUx of the plane PB0 can be restored with the restore data and the data in the cell unit CUx of the other plane PB1.

Such restoration does not incur a large cost. Specifically, the use of the restore data obviates the need to store the associated entire two data items for planes PB0 and PB1 in the buffer 230. Therefore, the use of restore data eliminates the necessity of storing (backup) of the whole memory write data instructed to be written to cell units CU from the host device 1 until they are determined to be unnecessary by the status read. This is illustrated in FIGS. 21 and 22.

Figure 21:
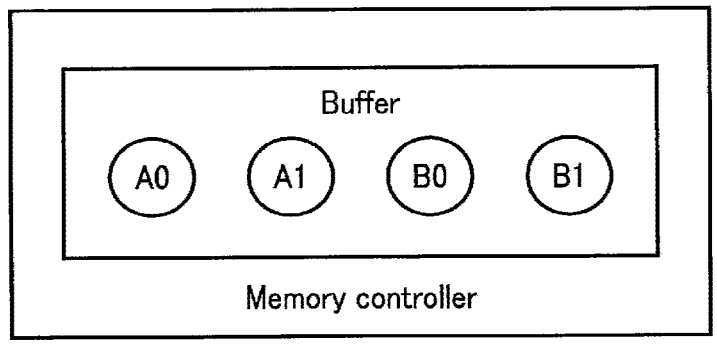
FIG. 21 illustrates a possible example of storing of data in a memory controller during a write.

FIG. 21 illustrates a possible example of storing write data in successive multi-plane writes to cell units CUx and CUx+1 similarly to the flow of FIGS. 17 and 18. As illustrated in FIG. 21, the memory controller maintains the memory write data A0, A1, B0, and B1 until the write into the cell unit CUx+1 is completed in case the word lines WLx+1 and WLx are short-circuited during a write to the cell units CUx+1, which disables the read of data in the cell units CUx in a buffer.

Figure 22:
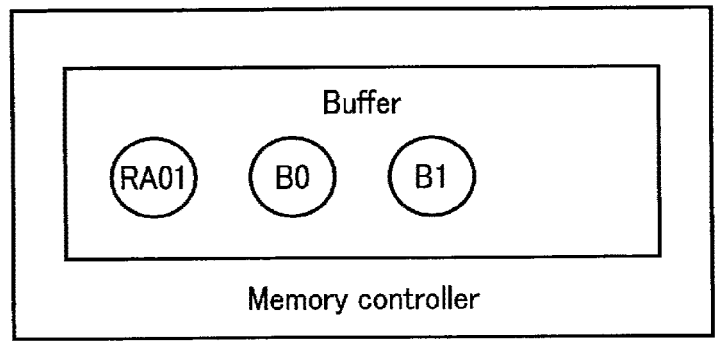
FIG. 22 illustrates storing of data during a write in the memory controller of the second embodiment.

FIG. 22 illustrates storing data with use of the second embodiment. According to the second embodiment, only the restore data RA01 and memory write data B0 and B1 need to be maintained until the successive multi-plane writes to the cell units CUx and CUx+1 succeed. This is because even with a short circuit in one plane PB, a single plane read allows data A0 or A1 written in the cell unit CUx of the other plane PB to be restored with the restore data RA01.

Third Embodiment

The third embodiment is similar to the second embodiment, and relates to the version of the second embodiment with the multi-string type blocks BLK.

In the multi-string type case, one block BLK includes a total of four cell units CUi each of which is from one of the four (with example of k=3) string units SU and which are coupled to a particular word line WLi, where i is zero or a natural number smaller than or equal to n. Such string units CUi from the string units SU0, SU1, SU2, and SU3 are referred to as cell units CUi(0), CUi(1), CUi(2), and CUi(3), respectively.

In the third embodiment, the memory system 1 has the same functional blocks as the memory system 1 of the first embodiment. The memory controller 200 in the third embodiment is, however, configured to perform the operations described in the following.

Figure 23:
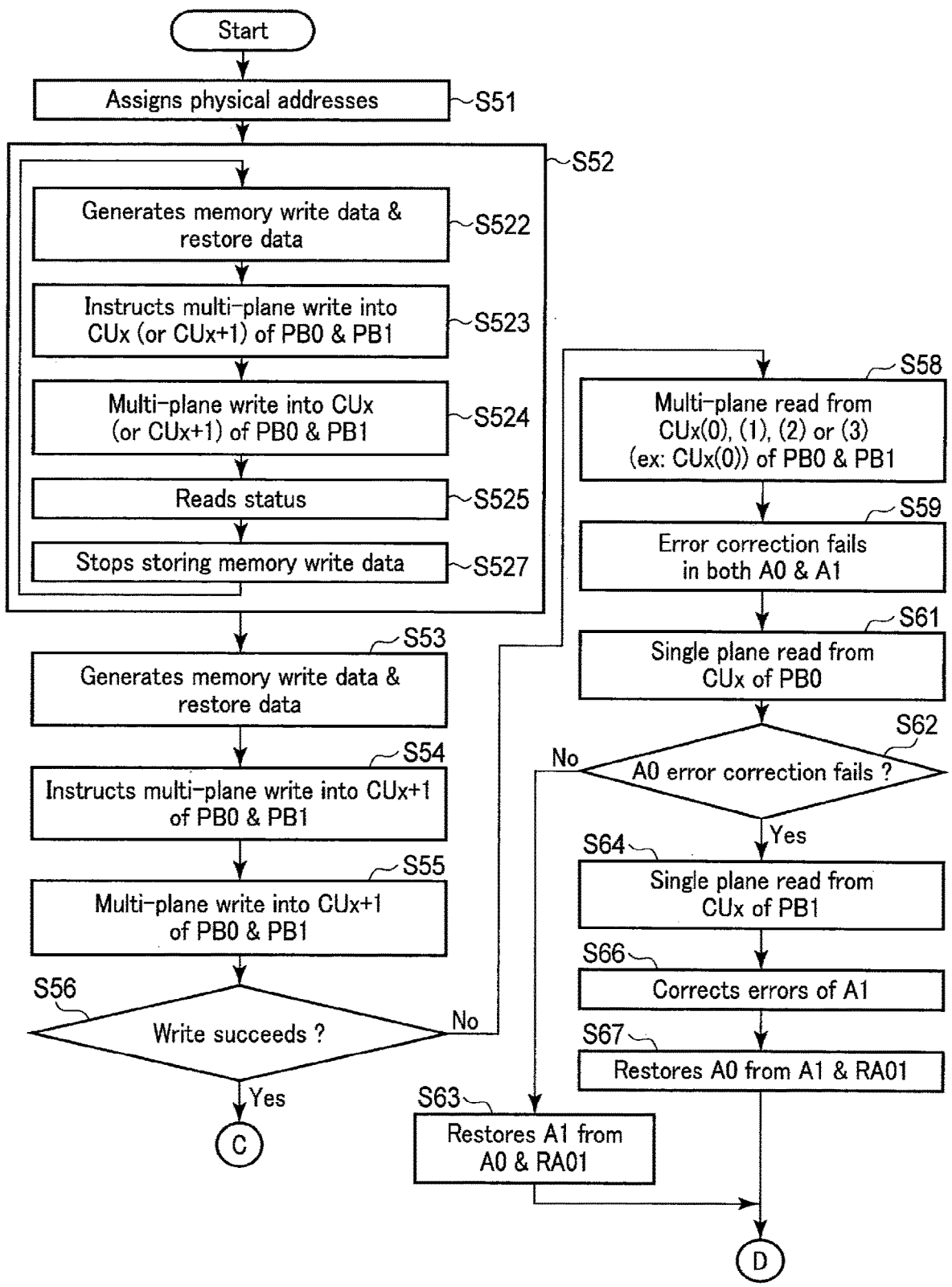
FIG. 23 illustrates a part of the flow of a write of a memory system of a third embodiment.
Figure 24:
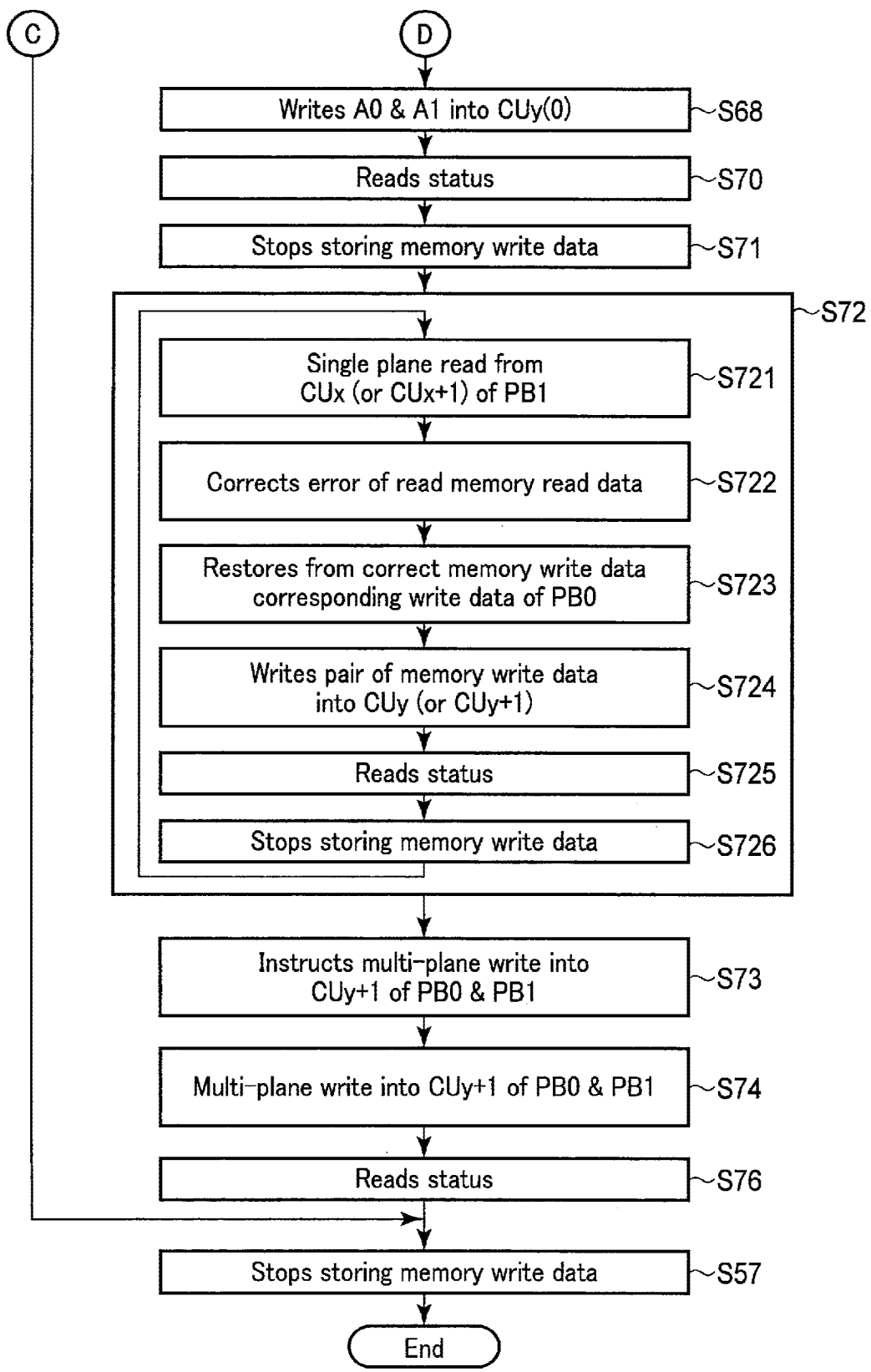
FIG. 24 illustrates another part of the flow of the write of the memory system of the third embodiment.

Referring to FIGS. 23 to 26, a write in the memory system of the third embodiment is described. FIGS. 23 and 24 illustrate a part of the flow of a write of the memory system of the third embodiment. When the host device 2 instructs a write to the memory system 1 and the instruction leads to a multi-plane write, the flow of FIGS. 23 and 24 starts. As an example, the overall controller 220 interprets the write instruction from the host device 2, and determines that it will write host write data HA0, HB0, HC0, HD0, HE0, HF0, HG0, and HH0 into the plane PB0, and host write data HA1, HB1, HCl, HD1, HE1, HF1, HG1, and HH1 to the plane PB1. When this determination fulfills the following conditions, the flow of FIGS. 23 and 24 starts.

The host write data HA0, HB0, HC0, and HD0 will be written into cell units CUi(0), CUi(1), CUi(2), and CUi(3) of the plane PB0, respectively. The host write data HE0, HF0, HG0, and HH0 will be written into cell units CUi+1(0), CUi+1(1), CUi+1(2), and CUi+1(3) of the plane PB0, respectively. The host write data HA1, HB1, HCl, and HD1 will be written into cell units CUi(0), CUi(1), CUi(2), and CUi(3) of the plane PB1, respectively. The host write data HE1, HF1, HG1, and HH1 will be written into cell units CUi+1(0), CUi+1(1), CUi+1(2), and CUi+1(3) of the plane PB1, respectively.

Reception of instruction of such conditions triggers the flow of FIGS. 23 and 24. The flow of FIGS. 23 and 24 occurs after the instruction to trigger the flow of FIGS. 23 and 24 and before the performance (or, completion) of another additional instruction (or, request) from the host device 2 by the memory system 1, for example. Specifically, the flow occurs as a response to reception of the write instruction of the host write data HA0, HB0, HC0, HD0, HE0, HF0, HG0, HH0, HA1, HB1, HCl, HD1, HE1, HF1, HG1, and HH1.

In addition, the flow occurs as a response to reception of one write instruction of the host write data HA0, HB0, HC0, HD0, HE0, HF0, HG0, HH0, HA1, HB1, HCl, HD1, HE1, HF1, HG1, and HH1 from the host device 2. In other words, the flow is performed without reception of two or more identical instructions from the host device 2.

The outline of the flow of FIGS. 23 and 24 is substantially the same as the flow of FIGS. 17 and 18, and differences are based on writes into cell units CU of the four string units SU in each plane PB in the third embodiment.

Steps S51, S54, S55, S56, S57, S58, S61, S62, S63, S64, S66, S67, S68, S70, S71, S73, and S74 are the same or similar to steps S21, S29, S31, S32, S33, S34 and S35, S41 and S42, S43, S45, S46 and S47, S48, S49, S38, S25, S27, S29, and S41 of FIGS. 17 and 18, respectively. Differences are mainly described in the following.

First, with steps S51 and S52, memory write data A0, B0, C0, D0, E0, F0, G0, H0, A1, B1, C1, D1, E1, F1, G1, and H1 are generated from the host write data HA0, HB0, HC0, HD0, HE0, HF0, HG0, HH0, HA1, HB1, HCl, HD1, HE1, HF1, HG1, and HH1, and the memory write data A0, B0, C0, D0, E0, F0, G0, A1, B1, C1, D1, E1, F1, and G1 are written into the memory device 100, which succeeds as an example. Details are as follows.

In step S51, cell units CU into which the host write data will be written are determined as follows as in step S21 of FIG. 17. Specifically, the host write data HA0, HB0, HC0, and HD0 will be written into cell units CUx(0), CUx(1), CUx(2), and CUx(3) of the plane PB0, respectively. The host write data HE0, HF0, HG0, and HH0 will be written into cell units CUx+1(0), CUx+1(1), CUx+1(2), and CUx+1(3) of the plane PB0, respectively. The host write data HA1, HB1, HCl, and HD1 will be written into cell units CUx(0), CUx(1), CUx(2), and CUx(3) of the plane PB1, respectively. The host write data HE1, HF1, HG1, and HH1 will be written into cell units CUx+1(0), CUx+1(1), CUx+1(2), and CUx+1(3) of the plane PB1, respectively.

In step S52, multi-plane writes to same-address cell units CU for same-address string units SU for same-address blocks BLK of the planes PB0 and PB1 are performed for all the host write data except the host write data HH0 and HH1. A multi-plane write into same-address cell units CU for same-address string units SU includes execution of substeps S522, S523, S524, S525, and S527. Step S52 includes a repetition of execution of the set of substeps S522, S523, S524, S525, and S527. Substeps S522, S523, S524, S525, and S527 are the same or similar to steps S22, S23, S24, S25, and S27 of FIG. 17, respectively.

In substep S522, the media controller 240 generates the memory write data A0 and A1 and restore data RA01 from the host write data HA0 and HA1.

In substep S523, the media controller 240 instructs a multi-plane write of the memory write data A0 and A1 into the cell units CUx(0) to the memory device 100.

In substep S524, the sequencer 12 writes the memory write data A0 and A1 into respective cell units CUx of the planes PB0 and PB1, respectively.

In substep S525, the media controller 240 reads the status of the memory device 100. Assume that the write succeeds in the ongoing example for simplification of the description. In substep S527, the media controller 240 stops storing of the memory write data A0 and A1, whereas it maintains the restore data RA01.

Figure 25:
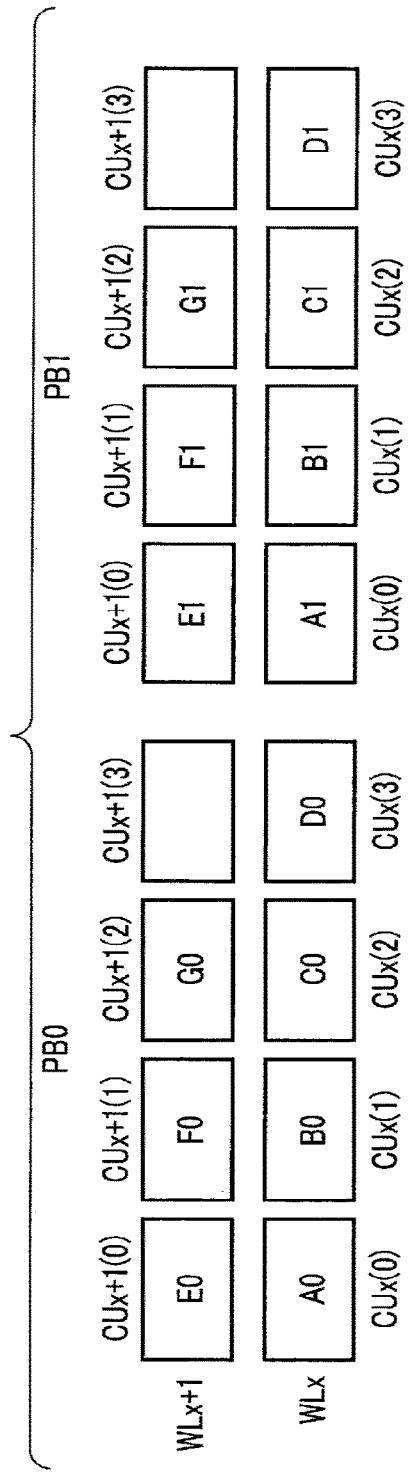
FIG. 25 illustrates one state during the write of the memory system of the third embodiment.

Similarly, substeps S522 to S527 are repeated. As a result, the state of FIG. 25 is reached. As illustrated in FIG. 25, the plane PB0 stores the memory write data A0, B0, C0, and D0 in the cell units CUx(0), CUx(1), CUx(2), and CUx(3), respectively. The plane PB0 stores the memory write data E0, F0, and G0 in the cell units CUx+1(0), CUx+1(1), and CUx+1(2), respectively. The plane PB1 stores the memory write data A1, B1, C1, and D1 in the cell units CUx(0), CUx(1), CUx(2), and CUx(3), respectively. The plane PB1 stores the memory write data E1, F1, and G1 in the cell units CUx+1(0), CUx+1(1), and CUx+1(2), respectively. The memory write data A0, B0, C0, D0, E0, F0, G0, A1, B1, C1, D1, E1, F1, and G1 are generated from the host write data HA0, HB0, HC0, HD0, HE0, HF0, HG0, HA1, HB1, HCl, HD1, HE1, HF1, and HG1, respectively. The media controller 240 further stores restore data RA01, RB01, RC01, RD01, RE01, RF01, and RG01 in the buffer 230. The restore data RX01 (X being B, C, D, E, F, or G) allows one of the memory read data X0 and X1 to be restored when used with the other.

Referring back to FIG. 23, step S52 shifts to step S53. In step S53, the media controller 240 generates memory write data H0 and H1 and restore data RH01 from the host write data HH0 and HH1. The restore data RH01 allows one of the memory read data H0 and H1 to be restored when used with the other.

In step S54, the media controller 240 instructs a multi-plane write of the memory write data H0 and H1 into the cell units CUx+1(3) to the memory device 100.

In step S55, the sequencer 12 writes the memory write data H0 and H1 in respective cell units CUx+1(3) of the planes PB0 and PB1, respectively.

In step S56, the media controller 240 reads the status of the memory device 100. When the result of status read indicates a success (Yes branch), the media controller 220 erases the memory write data H0 and H1 from the buffer 230 in step S57. Moreover, the overall controller 220 notifies the completion of the instruction to the host device 2, where the flow ends.

In contrast, the determination of the failure of the write in step S56 (No branch) may occur due to occurrence of a short circuit between the word lines WLx+1 and WLx during the writes to the cell units CUx+1(3) of the planes PB0 and PB1 in step S54. The following description is based on an example where the word lines WLx+1 and WLx of the plane PB0 are short-circuited. With the failure of the write, the flow shifts to step S58.

In step S58, the media controller 240 and the sequencer 12 perform multi-plane reads from one of the cell units CUx(0), CUx(1), CUx(2) and CUx(3). The following description is based on an example of a read from the cell unit CUx(0), i.e., the memory read data A0 and A1 are read. The multi-plane read instruction includes specification of a string unit SU.

Step S59 is similar to step S37. In step S59, the media controller 240 tries to obtain the correct memory read data A0 and A1. Assume that obtaining the memory read data A0 and A1 fails in the ongoing example for simplification of the description. Such failure may result from short-circuiting between the word lines WLx+1 and WLx and execution of a multi-plane read.

In step S61, the media controller 240 and the sequencer 12 perform a single plane read from the cell unit CUx(0) of the plane PB0. The single plane read instruction includes specification of a string unit SU.

In step S62, the media controller 240 tries to obtain the correct memory read data A0. When the obtaining succeeds (No branch), the flow shifts to step S63. In step S63, the media controller 240 restores the memory read data A1.

When the obtaining at step S62 fails (Yes branch), the flow shifts to step S64. In step S64, the media controller 240 and the sequencer 12 perform a single plane read from the cell unit CUx(0) of plane PB1. The single plane read instruction includes specification of a string unit SU.

In step S66, the media controller 240 tries to obtain correct memory read data A1. The obtaining should succeed because the word lines WLx+1 and WLx are short-circuited in the ongoing example as described above.

In step S67, the media controller 240 restores the memory read data A0.

In step S68, the media controller 240 and the sequencer 12 perform a multi-plane write of the data A0 and A1 into cell units CUy(0) of the planes PB0 and PB1. Assume that the write succeeds in the ongoing example for simplification of description (step S70). Subsequently, the storing of the memory write data A0 and A1 ends in step S71.

In step S72, reads of the remaining written memory read data in the cell units CUx and Cux+1, restoration, and writes into other cell units CUy or CUy+1 are performed. Specifically, step S72 includes repetition of the execution of the set of substeps S721, S722, S723, S724, and S726 for the memory read data B0, C0, D0, E0, F0, G0, B1, C1, D1, E1, F1, and G1. Substeps S721, S722, S723, S724, S725, and S726 are the same as or similar to steps S46 and S47, S48, S49, S38, S25, and S27, respectively. In the following, substeps S721, S722, S723, S724, S725, and S726 are described concerning an example for the memory read data B0 and B1.

In substep S721, the media controller 240 and the sequencer 12 read the memory read data B1 from the cell unit CUx(1) of the plane PB1. The reason for the read from plane PB1 is that the short-circuit between the word lines WLx and WLx+1 of the plane PB0 is determined by step S62.

In substep S76, the media controller 240 obtains the correct memory read data B1.

In substep S723, the media controller 240 restores the read data B0 from the read data B1.

In substep S724, the media controller 240 and the sequencer 12 perform a multi-plane write of the memory read data B0 and B1 to the cell units CUy(1) of the planes PB0 and PB1. Assume that the write succeeds in the ongoing example for simplification of the description (substep S725). Subsequently, storing of the memory write data B0 and B1 ends in substep S726.

Figure 26:
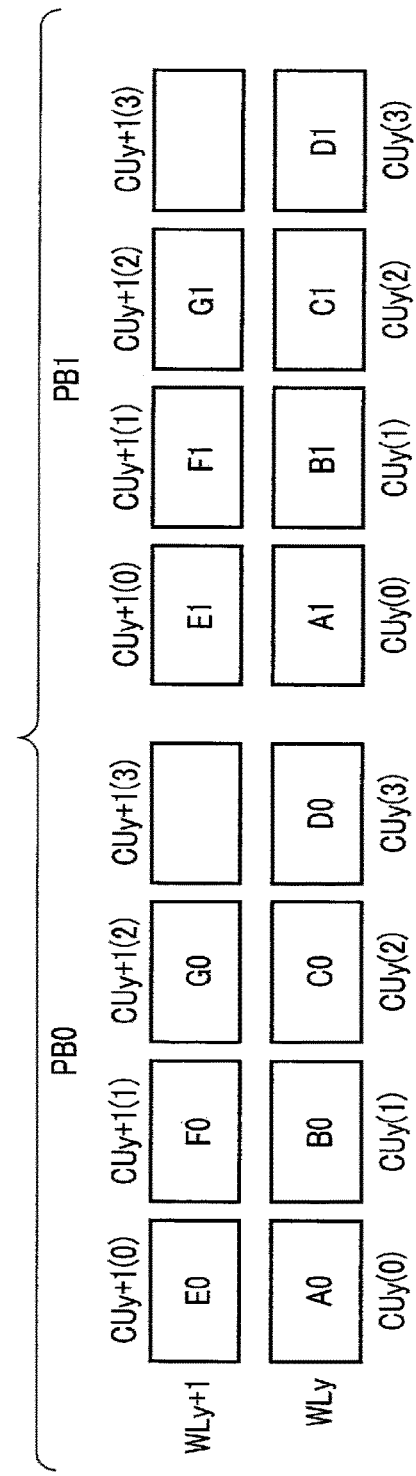
FIG. 26 illustrates another state during the write of the memory system of the third embodiment.

As a result of step S72, the state illustrated in FIG. 26 is reached. As illustrated in FIG. 26, the plane PB0 stores the memory write data A0, B0, C0, and D0 in the cell units CUy(0), CUy(1), CUy(2), and CUy(3), respectively. The plane PB0 stores the memory write data E0, F0, and G0 in the cell units CUy+1(0), CUy+1(1), and CUy+1(2), respectively. The plane PB1 stores the memory write data A1, B1, C1, and D1 in the cell units CUy(0), CUy(1), CUy(2), and CUy(3), respectively. The plane PB1 stores the memory write data E1, F1, and G1 in the cell units CUy+1(0), CUy+1(1), and CUy+1(2), respectively.

Referring back to FIG. 24, step S72 continues at step S73. In step S73, the media controller 240 instructs a multi-plane write of the memory write data H0 and H1 into the cell units CUy+1(3) to the memory device 100.

In step S74, the sequencer 12 writes the memory write data H0 and H1 into the select cell units CUy+1(3) of the planes PB0 and PB1, respectively.

In step S76, the status is read. Assume that the write succeeds for simplification of the description. Step S76 continues at step S57.

(Advantages)

When the memory system 1 of the third embodiment fails a write in cell units CUx+1 in successive multi-plane writes in the cell units CUx and CUx+1, it performs a multi-plane read to the written cell units CUx, as in the second embodiment. When both of resultant read data are error-uncorrectable, the memory system 1 performs a single plane read from each of the planes PB0 and PB1. Such a single plane read is performed to all the cell units CU written in writes by a series of write instructions. This produces the same advantages as the second embodiment also with the multi-string type. In addition, the memory system 1 performs single plane reads from all the cell units CUx+1 in a plane PB where the current does not leak from the word line WLx+1 (for example, plane PB1) written by a series of write instructions. For this reason, written data in a plane PB without a current leak in the word line WLx+1 can be read even when they cannot be read with a multi-plane read.

With such reads, the capacity of the buffer 230 for backup of memory write data can be reduced greatly in the multi-string type. This is illustrated in FIGS. 27 and 28. FIG. 27 illustrates a possible example of storing write data in the successive multi-plane writes to cell units CUx(0) to CUx(3) and CUx+1(0) to CUx+1(3) similarly to the flow of FIGS. 23 and 24. As illustrated in FIG. 27, the memory controller stores the memory write data A0, B0, C0, D0, E0, F0, G0, H0, A1, B1, C1, D1, E1, F1, G1, and H1 until the write to the cell units CUx+1(3) is completed in case the word lines WLx+1 and WLx are short-circuited during a write to the cell units CUx+1, which disables the read of data in the cell units CUx(0) to CUx(3) in a buffer. FIG. 28 illustrates storing data with use of the third embodiment. According to the third embodiment, in successive multi-plane writes to the cell units CUx and CUx+1, only the restore data RA01, RB01, RC01, RD01, RE01, RF01, and RG01, and the memory write data H0 and H1 need to be stored. The higher the number of string units SU per block BLK, the more the capacity required for the buffer 230 can be reduced.

Fourth Embodiment

In the fourth embodiment, a check on whether a current leaks due to a short circuit is used.

In the fourth embodiment, the memory system 1 has the same functional blocks as the memory system 1 of the first embodiment except for the media controller 240. Specifically, as illustrated in FIG. 29, the media controller 240 includes a leak word line table 243 in addition to the functional blocks in the first embodiment. Based on this, the memory controller 200 is configured to perform the operations described in the following in the fourth embodiment. Moreover, the blocks BLK of the fourth embodiment are of the single string type.

The leak word line table 243 indicates correspondences between a pair of short-circuited word lines WL and a plane to which the pair of word lines WL belong, as illustrated in FIG. 30. The pair of short-circuited word lines WL is specified by a status read after a multi-plane write, for example. The leak word line table 243 is appropriately updated during operations of the memory system 1 as will be described, stored in the memory device 100 when the power supply of the memory system 1 is stopped, and read from the memory device 100 into the RAM in the memory controller 200 upon the next power supply.

Figure 31:
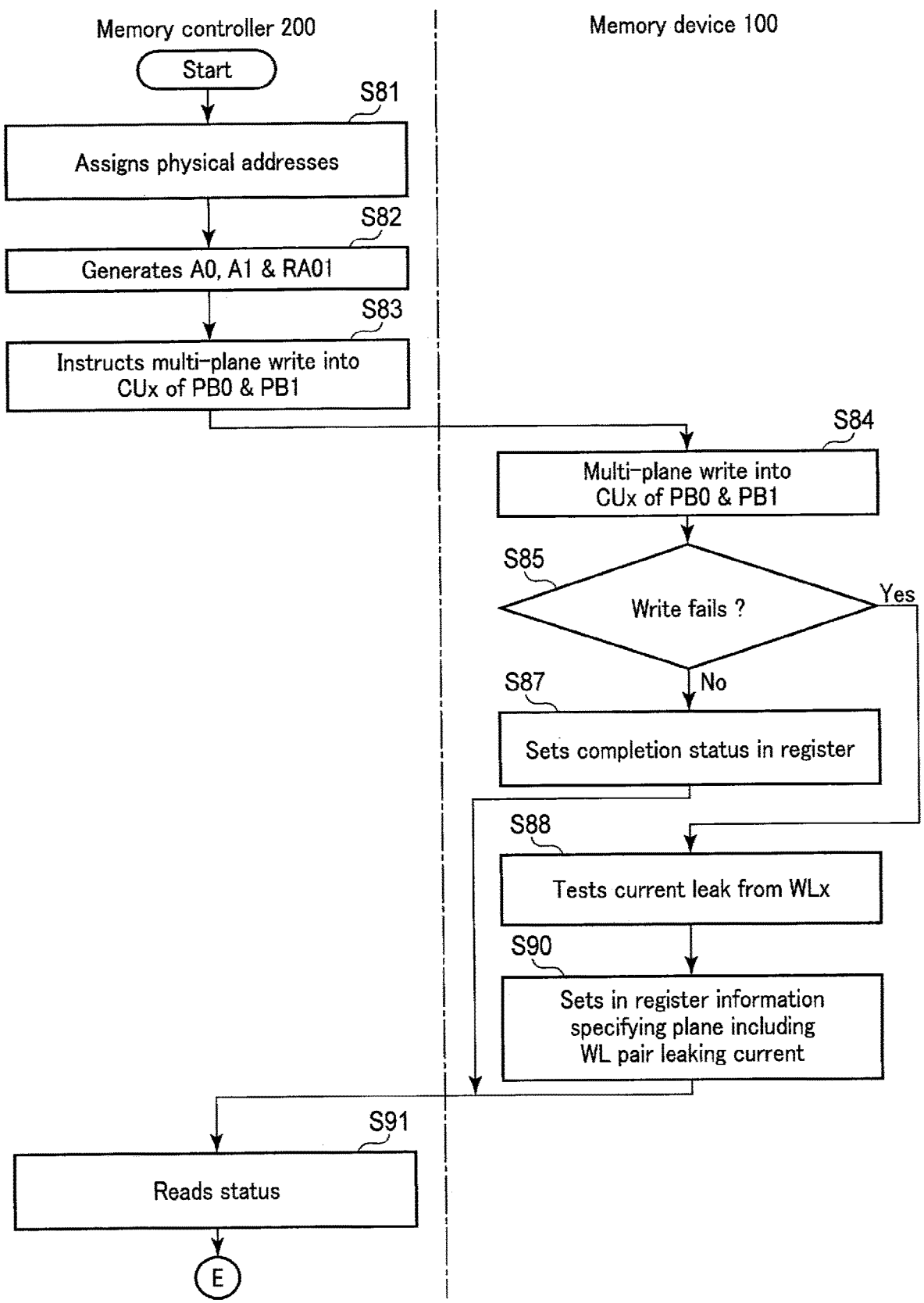
FIG. 31 illustrates a part of the flow of a write of the memory system of the fourth embodiment.
Figure 32:
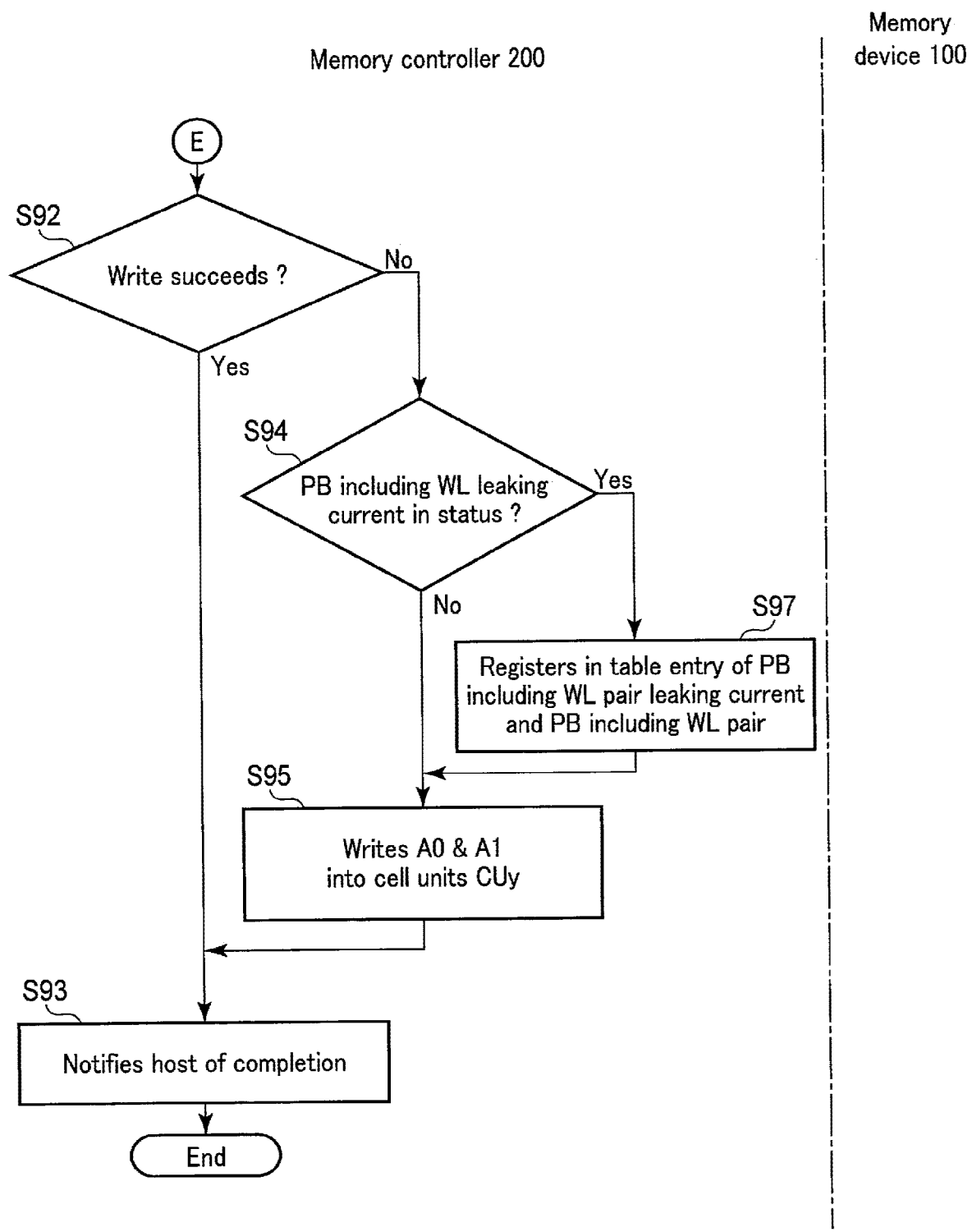
FIG. 32 illustrates another part of the flow of the write of the memory system of the fourth embodiment.

Referring to FIGS. 31 to 35, a write in the memory system of the fourth embodiment will now be described. FIGS. 31 and 32 illustrate the flow of a write in the memory system of the fourth embodiment. When the host device 2 instructs a write to the memory system 1 and the instruction leads to a multi-plane write, the flow of FIGS. 31 and 32 starts. As an example, the overall controller 220 determines that it will write host write data HA0 and HA1 into same-address cell units CU of the planes PB0 and PB1, respectively. When the determined instruction is received by the media controller 240, the flow of FIGS. 31 and 32 starts. The flow of FIGS. 31 and 32 occurs after the instruction to trigger the flow of FIGS. 31 and 32 and before the performance (or, completion) of another additional instruction (or, request) from the host device 2 by the memory system 1. Specifically, the flow occurs as a response to reception of the write instruction of the host write data HA0, HA1, HB0, and HB1. In addition, the flow occurs as a response to reception of one write instruction of the host write data HA0, HA1, HB0, and HB1 from the host device 2. In other words, the flow is performed without reception of two or more identical instructions from the host device 2.

When the flow starts, it shifts to step S81. Step S81 is similar to step S21 of FIG. 17. In step S81, the media controller 240 determines that it will write the host write data HA0 and HA1 into cell units CUx of the planes PB0 and PB1, respectively.

Steps S82, S83, and S84 are the same as steps S22, S23, and S24 respectively.

In step S85, the sequencer 12 checks whether the write in both planes PB0 and PB1 fails. The test is conducted by execution of a so-called verification. Specifically, it is determined how much data read from the cell unit CUx of the plane PB0 and the memory write data A0 match and how much the data read from the cell unit CUx of the plane PB1 and the memory write data A1 match. In each plane PB, it is determined that the write in this plane PB fails when the degree of matching is below a particular criteria. When the writes in both planes PB0 and PB1 succeed (No branch), the flow shifts to step S87.

In step S87, the sequencer 12 sets information indicative of completion of the instruction of step S83 in the register 13.

In contrast, when the writes in both planes PB0 and PB1 fail (Yes branch of step S85), the flow shifts to step S88. In step S88, the sequencer 12 performs a current leak test for each word line WLx of the planes PB0 and PB1. The sequencer 12 performs the current leak test to determine whether a current is leaking from the word lines WLx of planes PB0 and/or PB1. The current leak test will be described later. Assume that in order to simplify the description, current leaks in the ongoing example.

The sequencer 12 sets in the register 13 the address of the word line WLx, and information to specify the plane PB0 and/or PB1 including the word line WLx in step S90. The following description is based on an example where a current leaks in the plane PB0.

Step S90 continues at step S91. Step S87 also continues at step S91. In step S91, the media controller 240 uses a status read command XXh to read the status of the memory device 100. The example of the read status data is illustrated in FIG. 33. As illustrated in FIG. 33, the status data indicates, in addition to the same types of information as those in FIG. 16, whether the planes PB0 and PB1 which include the cell units CUx specified just before in I/O[2] and I/O[3] generate a leak current, respectively.

When step S91 follows step S87, the status data indicates a success of the multi-plane write. When step S91 follows step S90, the status data indicates a failure of the multi-plane write and occurrence of current leak in planes PB0 and/or PB1 (plane PB0 in the ongoing example).

Referring back to FIG. 32, when the result of the status read indicates a success of the write (Yes branch of step S92), the flow shifts to step S93. In step S93, the overall controller 220 notifies the host device 2 of the completion of the instruction, where the flow ends.

In contrast, when the result of the status read indicates a failure of the write (No branch of step S92), the flow shifts to step S94. In step S94, the media controller 240 determines whether a current leaks from the word line WLx with reference to the status data. When the occurrence of current leak is not indicated (No branch), this means that the failure of the multi-plane write does not result from the current leak in the word line WLx. Based on this, the media controller 240 and the sequencer 12 write the memory write data A0 and A1 in cell units CUy in step S95. Step S95 continues at step S93.

In contrast, when in step S94 the occurrence of current leak is indicated (Yes branch), the flow shifts to step S97. In step S97, the media controller 240 registers in the leak word line table 243 an entry including the set of the addresses of the pair of word lines WLx and WLx−1 between which a current leaks, and the address of the plane PB including those word lines WL. Step S97 continues at step S95.

Referring to FIG. 34, detection of a leak current will now be described. FIG. 34 illustrates voltages applied to some interconnects during detection of current leak of a selected word line WL (WLx) of a particular block BLK of a particular plane over time.

A signal Flag is an internal signal of the charge pump 14, and provided for a pump unit 141p of pump units 141 which outputs the potential VPGM. The signal Flag has a logic based on a target voltage, which the pump unit 141p should output. The pump unit 141p compares the output voltage thereof with the target voltage, and when the output voltage exceeds the target voltage, it makes the signal Flag low to stop the operation for raising output voltage. Therefore, the signal Flag can be used as an index to indicate whether the output voltage of the pump unit 141p exceeds the target voltage.

The occurrence of current leak can be detected by monitoring the signal Flag during application of the write voltage to the test target word line WLx. An example is as follows.

The driver set 11 uses a potential VSGD supplied from the charge pump 14 to keep applying a voltage VSGD to a select gate line SGDL during a write from time t0. The voltage VSGD has a magnitude to turn on the select transistor SDT.

From time t1, the driver set 11 uses a potential VPASS supplied from the charge pump 14 to apply a voltage VPASS to unselected word lines WL. The voltage VPASS has a magnitude which turns on the cell transistors MT and allows all the cell transistors MT between the cell transistor MT of the word line WLx and the select gate line SGDL to transfer the potential of the bit line BL. The application of the voltage VPASS to the unselected word lines WL continues until time t4. The voltage VPASS is applied also to the selected word line WL from time t1.

The driver set 11 uses the potential VPGM supplied from the charge pump 14 to apply a voltage VPGM to the selected word line WL from time t2 to time t3. The voltage VPGM is higher than the voltage VPASS. At time t3, the driver set 11 drops the voltage applied to the word line WLx to the voltage VPASS. At time t4, the driver set 11 decreases the voltage applied to all the word lines WL back to 0V.

The output of the pump unit 141p should exceed the voltage VPGM at least once between time t2 and t3. For this reason, the signal Flag should transition to low at least once between time t2 and time t3. In contrast, with the word line WLx leaking a current, the output of the pump unit 141p does not reach voltage VPGM between time t2 and time t3. For this reason, with the selected word line WL leaking a current, the signal Flag remains high from time t2 and time t3. This characteristic can be used to detect a current leak from the word line WLx through monitoring the signal Flag.

FIG. 35 illustrates the outline of a write in the memory system 1 of the fourth embodiment. The operation illustrated in FIG. 35 may occur by the execution of the flow of FIGS. 31 and 32. FIG. 35(a) corresponds to steps S83, S84, and the Yes branch of S85 of FIG. 31. A multi-plane write to the cell unit CUx fails.

FIG. 35(b) corresponds to steps S88, S90, S91, S92, S94, and S97 of FIG. 31. The memory device 100 performs a current leak test to determine whether a current leaks from the word lines WL of the planes PB0 and/or PB1. When leaking, the media controller 240 updates the leak word line table 243.

FIG. 35(c) corresponds to step S95 of FIG. 31. The media controller 240 and the sequencer 12 write the memory write data A0 and A1 in the cell units CUy of the planes PB0 and PB1.

Figure 36:
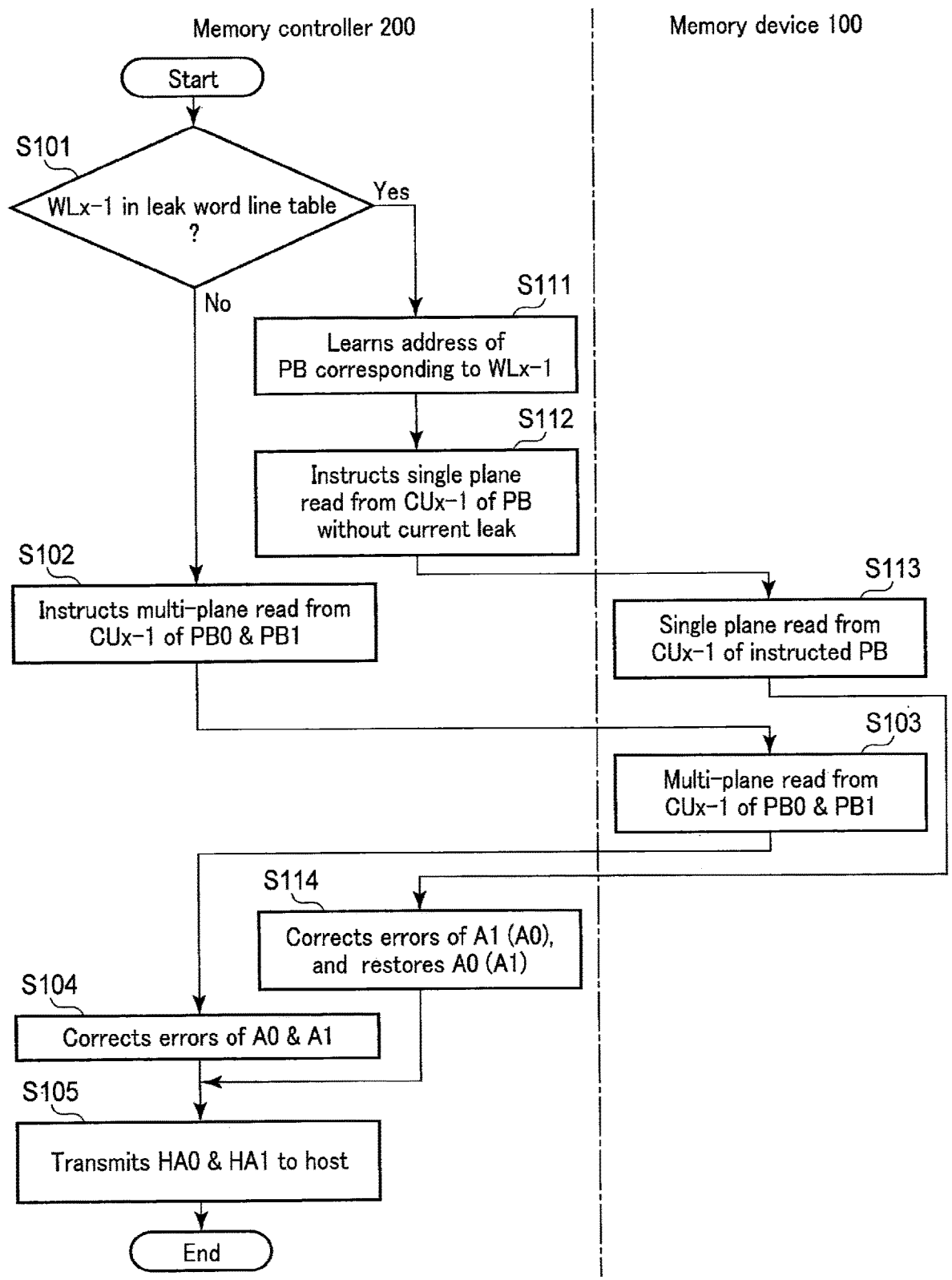
FIG. 36 illustrates the flow of a read of the memory system of the fourth embodiment.

Referring to FIG. 36, a read in the memory system of the fourth embodiment will now be described. FIG. 36 illustrates the flow of a read in the memory system of the fourth embodiment. When the host device 2 instructs a read to the memory system 1 and the instruction leads to a multi-plane read, the FIG. 36 flow starts. As an example, the instruction instructs a read of host read data HA0 and HA1, and this leads to a read of memory read data A0 and A1 from cell units CUx−1 of the planes PB and PB1. The FIG. 36 flow occurs after the instruction to trigger the FIG. 36 flow and before the performance (or, completion) of another additional instruction (or, request) from the host device 2 by the memory system 1, for example. Specifically, the flow occurs as a response to reception of the read instruction of the host read data HA0 and HA1 In addition, the flow occurs as a response to reception of one read instruction of the host read data HA0 and HA1 from the host device 2. In other words, the flow is performed without reception of two or more identical instructions from the host device 2.

When the flow starts, the media controller 240 in step S101 determines whether the address of a word line WLx−1 is included in the leak word line table 243. When not included (No branch), the flow shifts to step S102. Step S102 is similar to step S2. In step S102, the media controller 240 instructs a multi-plane read from cell units CUx−1 to the memory device 100.

Step S103 is similar to step S3. In step S3, the sequencer 12 reads the memory read data A0 and A1 from the cell units CUx−1.

Step S104 is similar to step S4. In step S104, the media controller 240 tries to obtain the correct memory read data A0 and A1. Assume that the obtaining succeeds in the ongoing example for simplification of the description.

Step S105 is similar to step S5. In step S105, the overall controller 220 transmits the host read data HA0 and HA1 to the host device 2, where the flow ends.

In contrast, when the result of determination in step S101 indicates that the address of the word line WLx−1 is included (Yes branch), the flow shifts to step S111. In step S111, the media controller 240 refers to the leak word line table 243 to learn the address of the plane PB included in the entry which includes the address of the word line WLx−1. Assume that in the following example the entry indicates the plane PB0, i.e., the current leak in the word line WLx−1 occurs in the plane PB0.

Step S112 is similar to steps S7 and S12. In step S112, the media controller 240 instructs, to the memory device 100, a single plane read from the cell unit CUx−1 of the plane PB1, in which a current does not leak in the word line WLx−1.

Step S113 is similar to steps S8 and S13. In step S113, the sequencer 12 reads the memory read data from the cell unit CUx−1 of the instructed plane PB (A1 in the ongoing example).

In step S114, the media controller 240 tries to obtain correct memory read data A1 as in, for example, step S4. Assume that the obtaining succeeds in the ongoing example for simplification of the description. Moreover, the media controller 240 restores the memory read data A0. The restoration can be performed by any method, and, for example, with a product code generated using the memory read data A0 and other memory read data used to generate the product code with the memory read A0. Step S114 continues at step S105.

(Advantages)

In the fourth embodiment, when a multi-plane write to a selected cell units CU fails, it is determined whether a current leaks from the selected word lines WL in planes PB0 and/or PB1. When leaking, the media controller 240 registers in the leak word line table 243 the set of the addresses of a pair of the word line WLx and the word line WLx−1 with one smaller address, and the address of the plane PB to which the pair belong. Then, when the media controller 240 receives an instruction which leads to a multi-plane read from the host device 2, it determines whether the selected word lines WL-1 is included in the leak word line table 243. When included, the media controller 240 performs a single plane read from the cell unit CUx−1 of the plane PB different from the plane PB to which the word line WLx−1 belongs.

As described in the first embodiment, a failure of reading data from both the planes PB in a multi-plane read may result from current leak of the selected word line WL in one plane PB. Based on this, the address of the plane PB which suffers from the current leak is registered in the leak word line table 243 when a multi-plane write fails, and, when the media controller 240 receives a following instruction which leads to a multi-plane read, it performs a single plane read to the plane PB which does not suffer from the current leak. As a result, execution of the single plane read after it is learned that a multi-plane read fails is avoided, and the efficiency of read is high.

Fifth Embodiment

The fifth embodiment is similar to the fourth embodiment, and relates to the version of the fourth embodiment with multi-string type blocks BLK.

In the fifth embodiment, the memory system 1 has the same functional blocks as the memory system 1 of the fifth embodiment. The memory controller 200 is, however, configured to perform the operations described in the following in the fifth embodiment.

Figure 37:
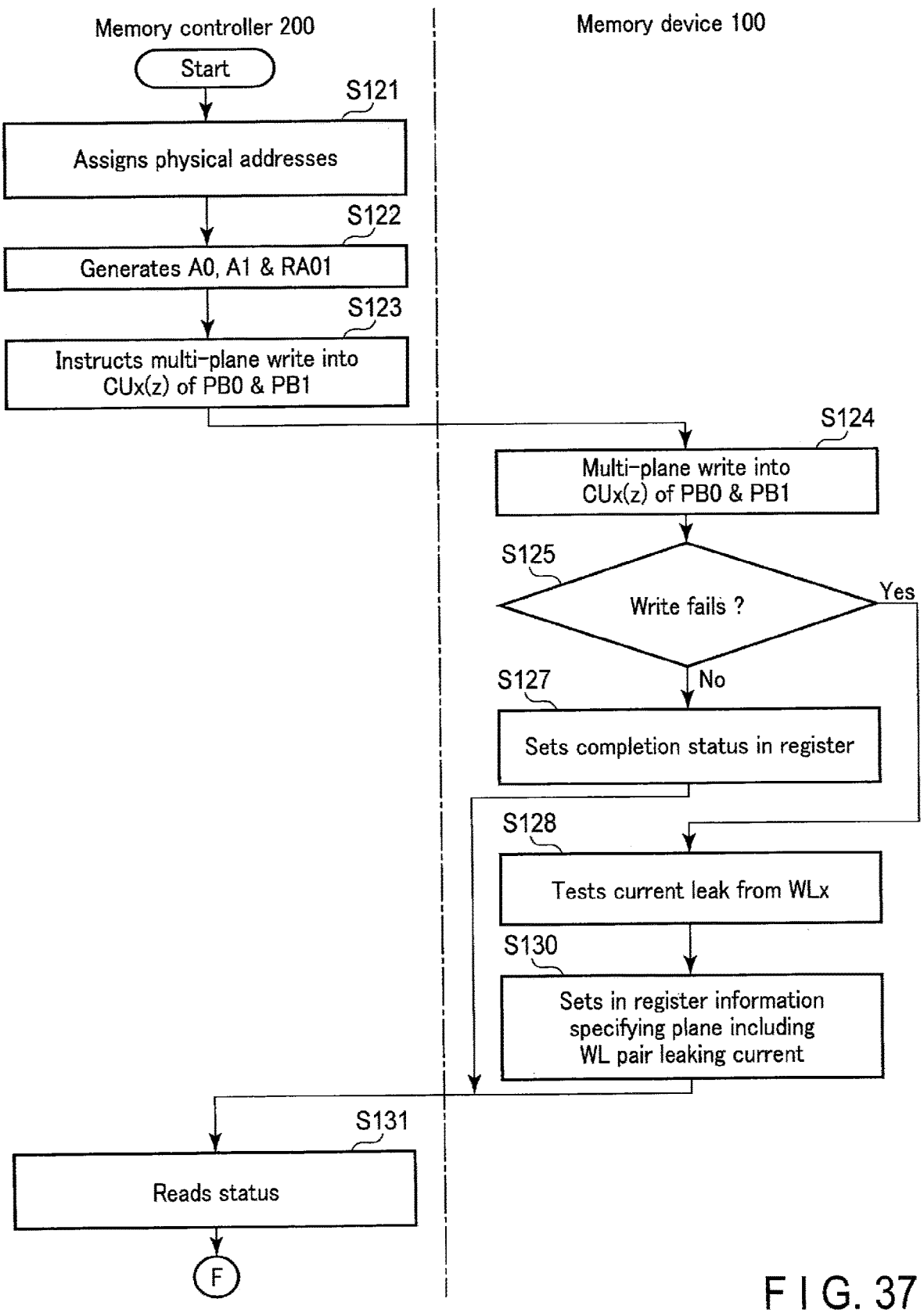
FIG. 37 illustrates a part of the flow of a write of a memory system of the fifth embodiment.
Figure 38:
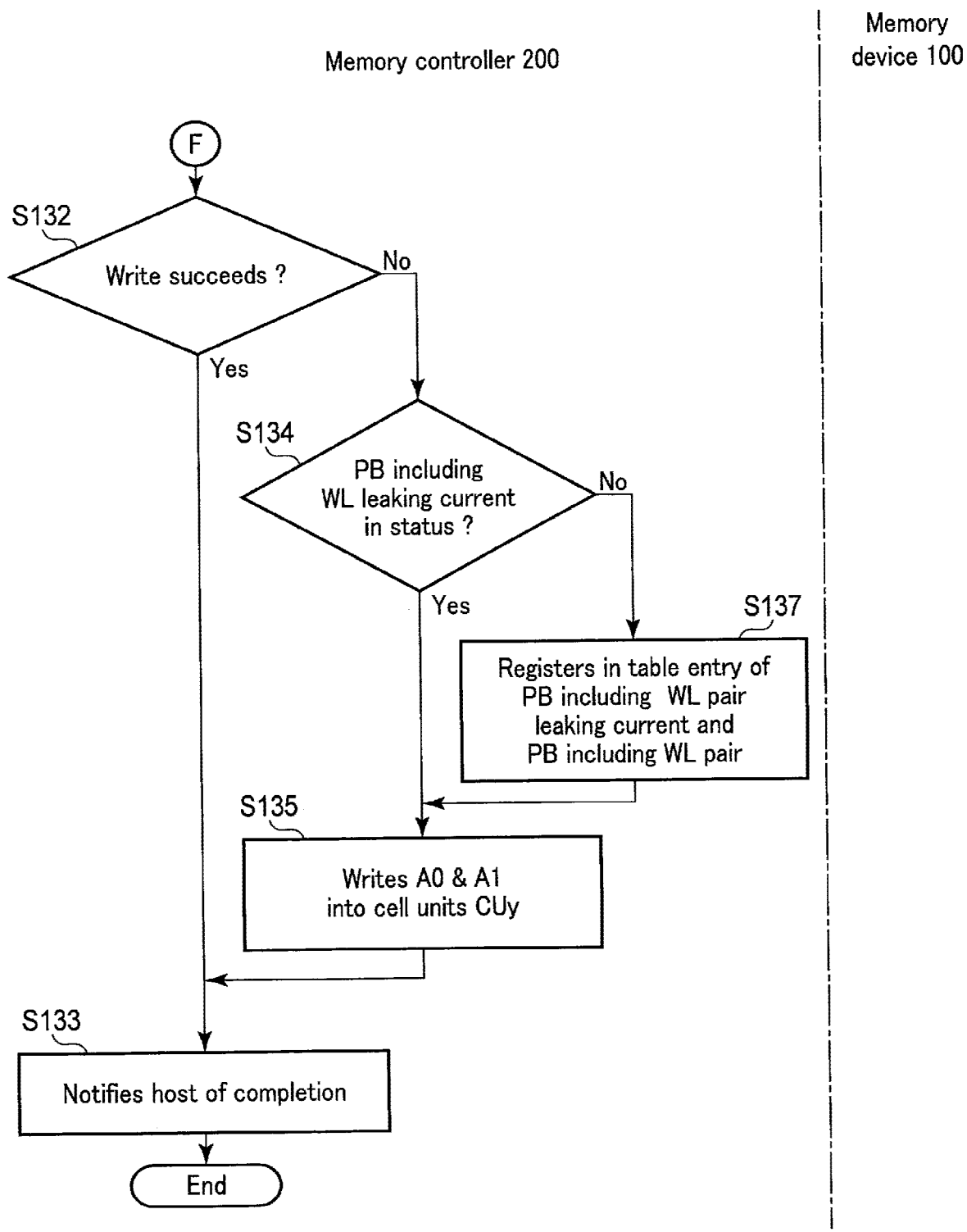
FIG. 38 illustrates another part of the flow of the write of the memory system of the fifth embodiment.
Figure 39:
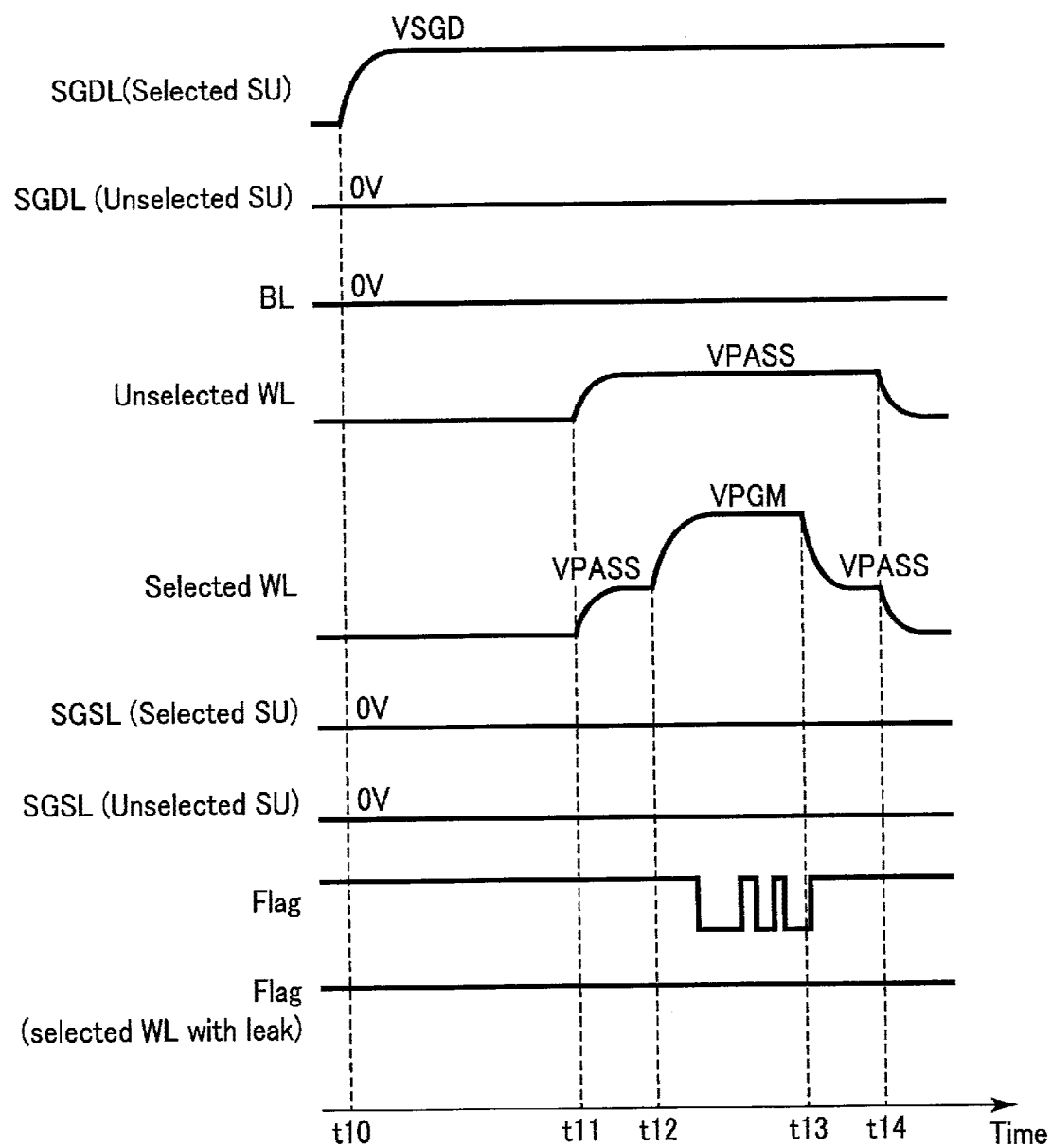
FIG. 39 illustrates voltages of some interconnects during a current leak test of the fifth embodiment over time.

Referring to FIGS. 37 to 39, a write in the memory system of the fourth embodiment will be described. FIGS. 37 and 38 illustrate the flow of a write in the memory system of the fifth embodiment. When the host device 2 instructs a write to the memory system 1 and the instruction leads to a multi-plane write, the flow of FIGS. 37 and 38 starts. As an example, the overall controller 220 determines that it will write host write data HA0 and HA1 into same-address cell units CUx(z) of the planes PB0 and PB1, where z is zero or a natural number smaller than or equal to k(=3). When the determined write instruction is received by the media controller 240, the flow of FIGS. 37 and 38 starts.

With the reception the instruction, the flow of FIGS. 37 and 38 starts. The flow of FIGS. 37 and 38 occurs after the instruction to trigger the flow of FIGS. 37 and 38 and before the performance (or, completion) of another additional instruction (or, request) from the host device 2 by the memory system 1, for example. Specifically, the flow occurs as a response to reception of the write instruction of the host write data HA0 and HA1 In addition, the flow occurs as a response to reception of one write instruction of the host write data HA0 and HA1 from the host device 2. In other words, the flow is performed without reception of two or more identical instructions from the host device 2. The outline of the flow of FIGS. 37 and 38 is substantially the same as the flow of FIGS. 31 and 32, and differences are that an instruction of multi-plane write includes specification of a string unit SU to which the selected cell units CU belong to and details of a current leak test.

Steps S121, S122, S123, S124, S125, S128, S130, S131, S132, S133, S134, S135, and S137 are the same as or similar to steps S81, S82, S83, S84, S85, S88, S90, S91, S92, S93, S94, S95, and S97 of FIGS. 31 and 32, respectively. Differences are mainly described in the following.

In steps S123 and S124, the media controller 240 and the sequencer 12 instruct and perform a multi-plane write of memory write data A0 and A1 into the cell units CUx(z) of the planes PB0 and PB1.

Voltages illustrated in FIG. 39 are applied during a current leak test in step S128. FIG. 39 is similar to FIG. 34, and time t10 to t14 corresponds to time t0 to t4. Differences are that the driver set 11 applies the voltage VSGD to the select gate line SGDL of the string unit SU(k) and keeps applying the voltage VSGS to the select gate line SGSL of the string unit SU(k) and the select gate lines SGDL and SGSL of the unselected string units SU during the test.

Figure 40:
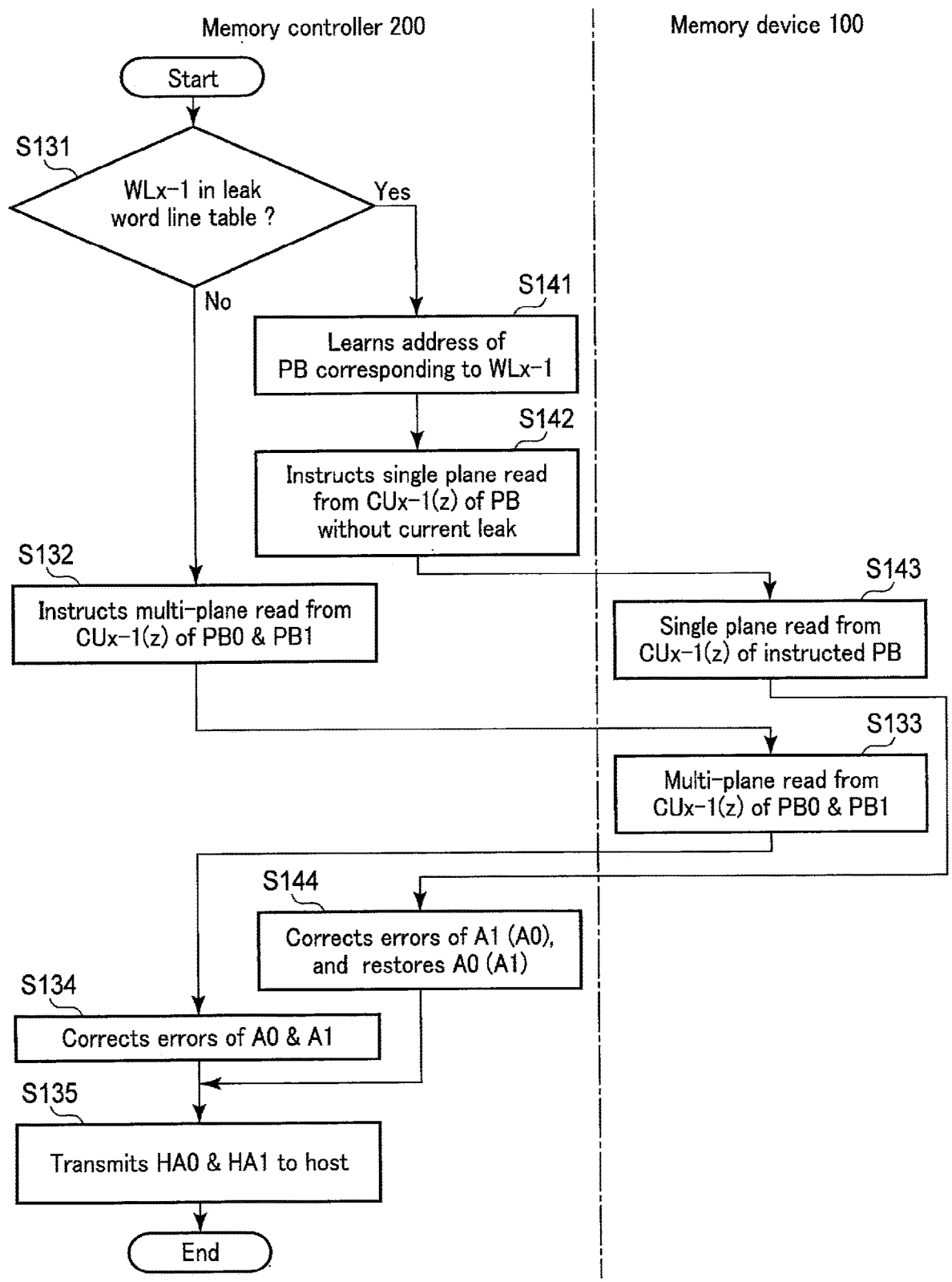
FIG. 40 illustrates the flow of a read of the memory system of the fifth embodiment.

Referring to FIG. 40, a read in the memory system of the fifth embodiment will be described. FIG. 40 illustrates the flow of a read in the memory system of the fifth embodiment. When the host device 2 instructs a read to the memory system 1 and the instruction leads to a multi-plane read, the FIG. 40 flow starts. As an example, the instruction instructs a read of host read data HA0 and HA1, which leads to a read of memory read data A0 and A1 from cell units CUx−1(z) of the planes PB0 and PB1. The FIG. 40 flow occurs after the instruction to trigger the FIG. 40 flow and before the performance (or, completion) of another additional instruction (or, request) from the host device 2 by the memory system 1, for example. Specifically, the flow occurs as a response to the reception of the read instruction of the host read data HA0 and HA1 In addition, the flow occurs as a response to reception of one read instruction of the host read data HA0 and HA1 from the host device 2. In other words, the flow is performed without reception of two or more identical instructions from the host device 2.

Steps S141, S142, S143, S144, S145, S151, S152, S153, and S154 are the same or similar to steps S101, S102, S103, S104, S105, S111, S112, S113, and S114, respectively. Differences are described in the following.

In steps S142 and S143, the media controller 240 and the sequencer 12 instruct and perform a multi-plane read of the memory read data A0 and A1 from the cell units CUx−1(z) of the planes PB0 and PB1.

In steps S152 and S153, the media controller 240 and the sequencer 12 instruct and perform a single plane read from the cell unit CUx−1(z) of the plane PB in which a current does not leak from the word line WLx−1 (for example, the plane PB1).

(Advantages)

When a multi-plane write to cell units CU fails, the memory system 1 of the fifth embodiment tests a current leak and registers the set of addresses of the pair of word lines WL and the plane PB into the leak word line table 243 when leaking, as in the fourth embodiment. Then, when the address of the word line WLx−1 is included during a multi-plane read from cell units CUx−1, the media controller 240 performs a single plane read from the cell unit CUx−1 of the plane PB different from the plane PB to which the word line WLx−1 belongs. This produces the same advantages as the fourth embodiment also with the multi-string type.

Sixth Embodiment

The sixth embodiment relates to detection of current leak.

In the sixth embodiment, the memory system 1 has the same functional blocks as the memory system 1 of the first embodiment. In contrast, the memory device 100 is configured to perform operations described in the following in the sixth embodiment.

The sequencer 12 performs the detection of current leak of the sixth embodiment due to various causes. The current leak detection of the sixth embodiment is performed, for example, as the current leak detection in the fourth or fifth embodiment, or is triggered by an instruction of the memory controller 200.

Figure 41:
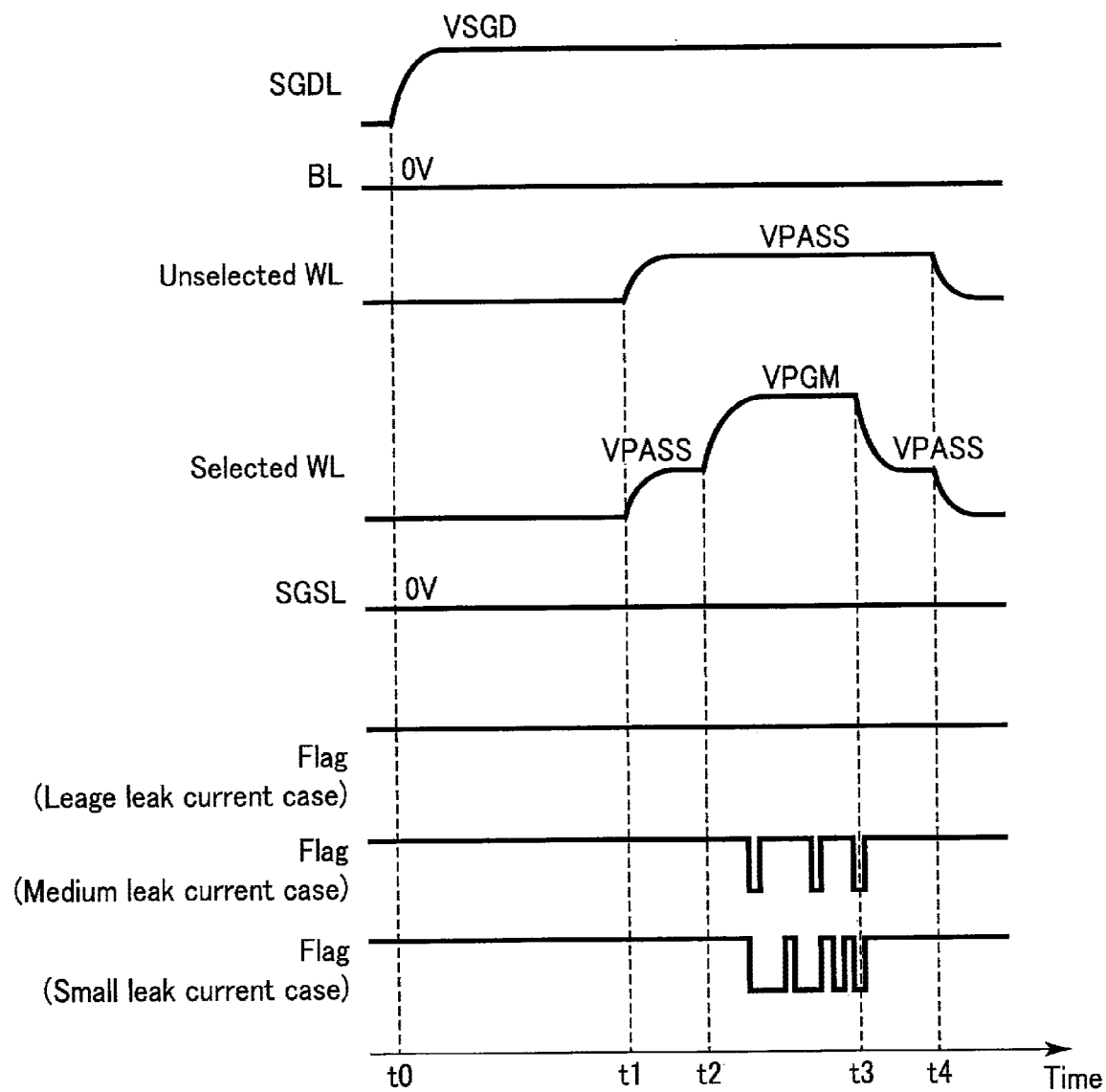
FIG. 41 illustrates voltages of some interconnects during a current leak tests of a sixth embodiment over time.

The basis of the current leak detection is the same as that described with reference to FIGS. 34 and 39. Differences are in the detection of not only the occurrence of the current leak but also the magnitude thereof. FIG. 41 illustrates voltages applied to some interconnects during detection of current leak of a selected word line WL (WLx) of a particular block BLK of a particular plane over time, and is similar to FIG. 34.

A leak current from the target word line WLx may have various magnitudes. For example, the magnitude of a leak current is based on the magnitude of the resistance of a current path between the word line WLx and an adjacent WLx−1 (or WLx+1) formed by short circuit between the word lines WLx and WLx−1. The larger the current path due to the short circuit, the larger the leak current. The larger the leak current, the longer the signal Flag is low or the higher the number of low signal Flag. FIG. 41 illustrates signals Flag for cases of leak currents of three different magnitudes.

The sequencer 12 measures a period for which the signal Flag of the pump unit 141p outputting voltage VPGM is high between time t2 and t3, and calculates a ratio between the measured period and the period between time t2 and t3. When the signal Flag is high between time t2 and t3 for a first period, the sequencer 12 determines that a large current leaks. The first period is, for example, larger than 90% and smaller than or equal to 100% of the period between time t2 and t3. When the signal Flag is high between time t2 and t3 for a second period, the sequencer 12 determines that a medium current leaks. The second period is shorter than the first period, and, for example, larger than 80% and smaller than or equal to 90% of the period between time t2 and t3. When the signal Flag is high between time t2 and t3 for a third period, the sequencer 12 determines that a small current leaks. The third period is shorter than the second period, and, for example, larger than 70% and smaller than or equal to 80% of the period between time t2 and t3. When the signal Flag is high between time t2 and t3 for a fourth period, the sequencer 12 determines that no current leaks. The fourth period is shorter than the third period, and, for example, smaller than or equal to 70% of the period between time t2 and t3. Two or four or more classifications can be used instead of three.

The information on the magnitude (or classification) of the current leak is reflected in the status data transmitted by a status read command XXh. FIG. 42 illustrates an example of information read by the status read command XXh. The status data indicates, in addition to the same types of information as those in FIG. 16, whether the planes PB0 and PB1 which include the cell units CUx specified just before generate current leak, and class to which the magnitude of the leak current belongs in I/O[2] to I/O[7]. Specifically, I/O[2] and I/O[3] indicate that a large current leaks in planes PB0 and PB1, respectively. I/O[4] and I/O[5] indicate that a medium current leaks in the planes PB0 and PB1, respectively. The medium current leak is smaller than a current leak in cases indicated by I/O[2] and I/O[3]. I/O[6] and I/O[7] indicate that a smaller current leaks in the planes PB0 and PB1, respectively. The small current leak is smaller than a current leak in cases indicated by I/O[4] and I/O[5].

The memory controller 200 uses the status read to learn the magnitude of the current leak of particular word lines WL of plane PB0 and/or PB1. The memory controller 200 can control the memory device 100 based on the learned magnitude of current leak. For example, a cell unit CU of a word line WL from which a small current leaks due to a short circuit with an adjacent word line WL can output data. When such a cell unit CU is a repeatedly targeted for a read and/or write, this may worsen the short circuit and disable a read from that cell unit CU. Based on this, the memory controller 200 can use a word line WL with a small current leak less or, for example, assign such a word line WL to particular host write data less than other word lines WL.

Other Embodiments and Additional Features

The description so far is based on examples of storing of one bit data in one cell transistor MT, i.e., storing of data of one-page size in one cell unit CU. The first to fifth embodiments are also applicable to a case of storing of data of two or more bits in one cell transistor MT, i.e., storing of data of a size of two or more pages in one cell unit CU. In this case, specification of where a write and a read will be performed includes, in addition to specification of a cell unit CU, specification of a page in the specified cell unit CU. For example, for a case of storing of two pages in one cell unit CU, an upper page or a lower page is specified.

During a flow of an embodiment, a process by another instruction from the host device 2 may be inserted. For such operations, the memory controller 200, in particular the overall controller 220, manages the order or progress of such operations. For example, when the correct memory read data cannot be obtained with a multi-plane read in step S4 of FIG. 10, another process can be performed before step S7 and subsequent steps are performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing system comprising:
a host device; and
a memory system connected to the host, the memory system including a memory device and a controller, wherein
the memory device includes a first plurality of memory cells, a first word line electrically connected to gates of the first plurality of memory cells, a second plurality of memory cells and a second word line electrically connected to gates of the second plurality of memory cells, data in the first plurality of memory cells and data in the second plurality of memory cells are capable of being read in parallel, the controller is configured to, when receiving a first request sent from the host device, transmit to the memory device a first instruction instructing parallel reads from the first plurality of memory cells and the second plurality of memory cells, the first instruction corresponding to the first request, transmit to the memory device a second instruction for reading data from the first plurality of memory cells when an error of first read data transmitted from the memory device in response to the first instruction is uncorrectable, and perform error correction on second read data transmitted by the memory device in response to the second instruction, the controller is configured to transmit the second instruction after transmission of the first instruction, and the controller is configured to transmit to the memory device a third instruction for reading data from the second plurality of memory cells after transmission of the second instruction before receiving from the host device a second request following the first request.

2. The information processing system according to claim 1, wherein:

the memory device further includes a first switch between a first driver and the first word line, and a second switch between the first driver and the second word line, the memory device is configured to read data from the first and second plurality of memory cells with the first and second switches on in response to the first instruction, and the memory device is configured to read data from the first plurality of memory cells with the second switch off in response to the second instruction.

3. The information processing system according to claim 1, wherein:

the memory device further includes a third plurality of memory cells, a third word line electrically connected to gates of the first plurality of memory cells, a fourth plurality of memory cells and a fourth word line electrically connected to gates of the first plurality of memory cells, one of the first plurality of memory cells and one of the third plurality of memory cells are electrically connected in series, one of the second plurality of memory cells and one of the fourth plurality of memory cells are electrically connected in series, and the controller is configured to transmit to the memory device a third instruction which instructs parallel writes into the third plurality of memory cells and the fourth plurality of memory cells .

4. The information processing system according to claim 3, wherein the controller is configured to transmit to the memory device a fourth instruction for reading data from the second plurality of memory cells after transmission of the second instruction.

5. The information processing system according to claim 3, wherein the controller is configured to transmit to the memory device a fourth instruction for writing after transmission of the second instruction.

6. The information processing system according to claim 5, wherein:

the memory device further includes a fifth plurality of memory cells and a sixth plurality of memory cells, and the fourth instruction includes one or both of an instruction of a write into the fifth plurality of memory cells, and an instruction of a write into the sixth plurality of memory cells.

7. The information processing system according to claim 6, wherein the fourth instruction includes an instruction of a write of first data read from the first plurality of memory cells by the second instruction into the fifth plurality of memory cells.

8. The information processing system according to claim 7, wherein the controller is configured to generate second data stored in the second plurality of memory cells using the first data, and instruct a write of second data into the sixth plurality of memory cells.

9. The information processing system according to claim 8, wherein:

the memory device further includes a seventh plurality of memory cells, and an eighth plurality of memory cells, and the controller is configured to transmit to the memory device a fifth instruction including an instruction of a write into the seventh plurality of memory cells and an instruction of a write into the eighth plurality of memory cells after reception of the first request.

10. The information processing system according to claim 1, wherein:

the first request is a read request including a logical address, the controller is configured to specify a first address corresponding to the first plurality of memory cells and specifying a second address corresponding to the second plurality of memory cells based on the logical address, and the first instruction designates the first address and the second address.

11. The information processing system according to claim 1, wherein the controller is configured to transmit to the host device the first read data or the first read data with an error corrected when an error correction on the first read data succeeds.

12. The information processing system according to claim 1, wherein the controller is configured to restore, when the error correction on the second read data succeeds, data which should be read from the second plurality of memory cells based on the second read data.

13. The information processing system according to claim 12, wherein the controller is configured to transmit to the host device the restored data when an error correction on the second read data succeeds.

14. The information processing system according to claim 12, wherein the controller is configured to transmit to the memory device a fourth instruction instructing a read from the second plurality of memory cells when an error correction on the second read data fails.

15. The information processing system according to claim 14, wherein:

the memory device is configured to, in response to the fourth instruction, read data from the second plurality of memory cells and transmit the read data as third data to the controller, and the controller is configured to restore, when an error correction on the third data succeeds, data which should be read from the first plurality of memory cells based the third data.

* * * * *